United States Patent
Wang et al.

(10) Patent No.: US 12,471,424 B2
(45) Date of Patent: Nov. 11, 2025

(54) ARRAY SUBSTRATE AND MANUFACTURING METHOD THEREFOR, DISPLAY PANEL, AND BACKLIGHT MODULE

(71) Applicant: BOE TECHNOLOGY GROUP CO., LTD., Beijing (CN)

(72) Inventors: Ke Wang, Beijing (CN); Zhanfeng Cao, Beijing (CN); Xinhong Lu, Beijing (CN); Qi Qi, Beijing (CN); Yan Qu, Beijing (CN); Zhiwei Liang, Beijing (CN); Yingwei Liu, Beijing (CN); Dapeng Xue, Beijing (CN); Guoqiang Wang, Beijing (CN); Jianguo Wang, Beijing (CN); Song Liu, Beijing (CN); Yongfei Li, Beijing (CN); Ting Zeng, Beijing (CN); Huan Liu, Beijing (CN); Wanru Dong, Beijing (CN); Heren Gui, Beijing (CN); Jian Yang, Beijing (CN); Haifeng Hu, Beijing (CN); Yu Jiang, Beijing (CN); Peng Xu, Beijing (CN); Weiwei Chu, Beijing (CN); Qi Gao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 707 days.

(21) Appl. No.: 17/790,308

(22) PCT Filed: Aug. 31, 2021

(86) PCT No.: PCT/CN2021/115688
§ 371 (c)(1),
(2) Date: Jun. 30, 2022

(87) PCT Pub. No.: WO2022/048538
PCT Pub. Date: Mar. 10, 2022

(65) Prior Publication Data
US 2023/0043951 A1    Feb. 9, 2023

(30) Foreign Application Priority Data

Sep. 7, 2020 (CN) .......................... 202010927576.8
Sep. 7, 2020 (CN) .......................... 202010927603.1
Sep. 10, 2020 (CN) .......................... 202010947439.0

(51) Int. Cl.
*H10H 20/857* (2025.01)
*H01L 21/48* (2006.01)
(Continued)

(52) U.S. Cl.
CPC ....... *H10H 20/857* (2025.01); *H01L 21/4846* (2013.01); *H01L 23/49838* (2013.01);
(Continued)

(58) Field of Classification Search
CPC .............. H10H 20/857; H10H 20/0364; H01L 21/4846; H01L 23/49838; H01L 23/49866;
(Continued)

(56) References Cited

U.S. PATENT DOCUMENTS

2002/0121709 A1* 9/2002 Matsuki ............ H01L 23/49811
257/784
2015/0053888 A1 2/2015 Yuta et al.
(Continued)

FOREIGN PATENT DOCUMENTS

CN       103384448 A    11/2013
CN       103531594 A    1/2014
(Continued)

OTHER PUBLICATIONS

Office action from Chinese Application No. 202010947439.0 dated Jun. 26, 2024.
(Continued)

*Primary Examiner* — Victor A Mandala
(74) *Attorney, Agent, or Firm* — Calfee, Halter & Griswold LLP

(57) ABSTRACT

An array substrate and a manufacturing method therefor, a display panel, and a backlight module, are provided. The array substrate may comprise a base substrate, a metal wiring layer, a first planarization layer, an electrode layer, a
(Continued)

second planarization layer, and a functional device layer stacked in sequence. The electrode layer comprises a metal sub-layer and a conductive sub-layer stacked on one side of the base substrate in sequence; the material of the metal sub-layer comprises a metal or a metal alloy; the conductive sub-layer has an oxidation resistance and covers the metal sub-layer. The functional device layer is disposed on the side of the second planarization layer distant from the base substrate, and comprises a plurality of functional devices electrically connected to the electrode layer.

26 Claims, 21 Drawing Sheets

(51) Int. Cl.
*H01L 23/00* (2006.01)
*H01L 23/498* (2006.01)
*H01L 25/075* (2006.01)
*H10H 20/01* (2025.01)

(52) U.S. Cl.
CPC .... *H01L 23/49866* (2013.01); *H01L 25/0753* (2013.01); *H01L 24/16* (2013.01); *H01L 2224/16237* (2013.01); *H01L 2924/12041* (2013.01); *H10H 20/0364* (2025.01)

(58) Field of Classification Search
CPC ................. H01L 25/0753; H01L 24/16; H01L 2224/16237; H01L 2924/12041; H01L 23/498
See application file for complete search history.

(56) References Cited

U.S. PATENT DOCUMENTS

| | | | |
|---|---|---|---|
| 2018/0144950 A1* | 5/2018 | Jeong | H10K 50/844 |
| 2018/0190742 A1* | 7/2018 | He | H10K 59/123 |
| 2019/0189573 A1 | 6/2019 | Huang | |
| 2020/0028044 A1* | 1/2020 | Lee | H10D 86/441 |
| 2020/0066813 A1 | 2/2020 | Zhao | |
| 2022/0223773 A1 | 7/2022 | Liu | |

FOREIGN PATENT DOCUMENTS

| | | |
|---|---|---|
| CN | 103915451 A | 7/2014 |
| CN | 104160486 A | 11/2014 |
| CN | 104393001 A | 3/2015 |
| CN | 103531594 B | 8/2016 |
| CN | 106876281 A | 6/2017 |
| CN | 109375405 A | 2/2019 |
| CN | 110112141 A | 8/2019 |
| CN | 110459505 A | 11/2019 |
| CN | 10993775 A | 4/2020 |
| CN | 110993775 A | 4/2020 |
| CN | 111312742 A | 6/2020 |
| CN | 111430406 A | 7/2020 |
| CN | 110112141 B | 2/2021 |
| EP | 2827363 A1 | 1/2015 |
| JP | H0766423 A | 3/1995 |
| WO | 2015062258 A1 | 5/2015 |
| WO | 20190214253 A1 | 11/2019 |
| WO | 2020215502 A1 | 10/2020 |

OTHER PUBLICATIONS

Written Opinion from PCT/CN2021/115688 dated Dec. 6, 2021.
International Search Report from PCT/CN2021/115688 dated Dec. 6, 2021.

* cited by examiner

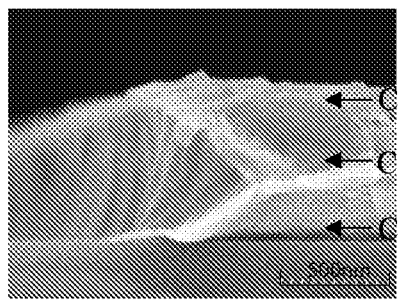 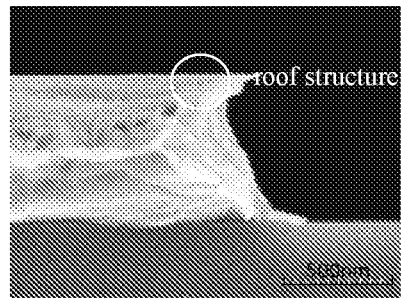
Fig. 18-1　　　　　　　　　　　Fig. 18-2
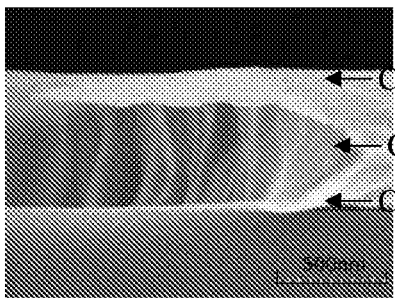 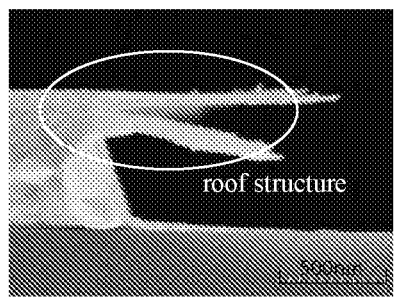
Fig. 19-1　　　　　　　　　　　Fig. 19-2
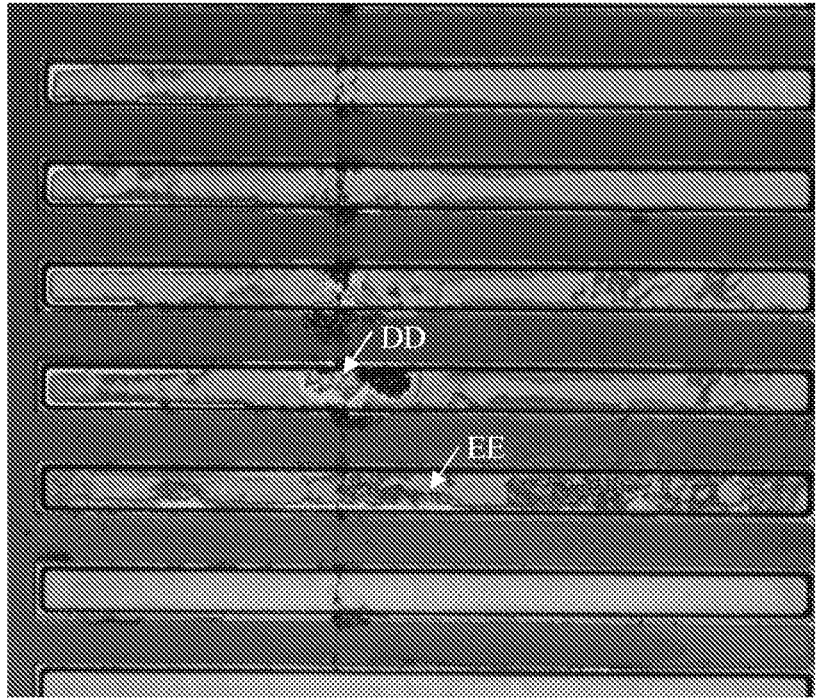
Fig. 20

ARRAY SUBSTRATE AND MANUFACTURING METHOD THEREFOR, DISPLAY PANEL, AND BACKLIGHT MODULE

CROSS-REFERENCE TO RELATED APPLICATIONS

The present application is a U.S. National Stage of International Application No. PCT/CN2021/115688, filed on Aug. 31, 2021, and claims priorities of Chinese patent application No. 202010927576.8, entitled "ARRAY SUBSTRATE AND MANUFACTURING METHOD THEREFOR, DISPLAY PANEL, AND BACKLIGHT MODULE", filed on Sep. 7, 2020; Chinese patent application No. 202010927603.1, entitled "ARRAY SUBSTRATE AND MANUFACTURING METHOD THEREFOR, DISPLAY PANEL, AND BACKLIGHT MODULE", filed on Sep. 7, 2020, and Chinese patent application No. 202010947439.0, entitled "LIGHT-EMITTING SUBSTRATE, DISPLAY APPARATUS AND MANUFACTURING METHOD", filed on Sep. 10, 2020, respectively, the entire contents of which are incorporated herein by reference.

TECHNICAL FIELD

The present disclosure relates to a field of display technology, and more particularly to an array substrate, a manufacturing method therefor, a display panel, and a backlight module.

BACKGROUND

A backplane of micro light-emitting diode (Micro-LED) may include a metal wiring layer, a first planarization layer, an electrode layer, a second planarization layer and the micro light-emitting diode sequentially stacked at the base substrate. However, during the manufacturing, the electrode layer is prone to oxidation, resulting in yield decrease and quality reduction of the backplane of the micro light-emitting diode.

It should be noted that the information disclosed in this section is only for enhancing understanding of the background of the disclosure and therefore, may contain information that does not constitute the prior art that is already known to those skilled in the art.

SUMMARY

The present disclosure is directed to overcome shortcomings in the above prior art, provide an array substrate, a manufacturing method therefor, a display panel and a backlight module, thereby improving the yield of the array substrate.

According to a first aspect of the present disclosure, an array substrate is provided and includes:
a base substrate;
a metal wiring layer provided at a side of the base substrate;
a first planarization layer provided at a side of the metal wiring layer away from the base substrate;
an electrode layer provided at a side of the first planarization layer away from the base substrate; the electrode layer including a metal sub-layer and a conductive sub-layer sequentially stacked at the side of the base substrate; material of the metal sub-layer including metal or metal alloy; the conductive sub-layer having oxidation resistance and covering the metal sub-layer;
a second planarization layer provided at a side of the electrode layer away from the base substrate;
a functional device layer provided at a side of the second planarization layer away from the base substrate, and including a plurality of functional devices electrically connected to the electrode layer.

According to some embodiments, the material of the metal sub-layer includes copper, and material of the conductive sub-layer includes copper-nickel alloy.

According to some embodiments, the material of the metal sub-layer is copper, and material of the conductive sub-layer is copper-nickel alloy.

According to some embodiments, the electrode layer further includes a first buffer metal layer sandwiched between the metal sub-layer and the conductive sub-layer; material of the first buffer metal layer is any one of or a mixture of more than one of molybdenum, molybdenum-niobium alloy, molybdenum-tungsten alloy, molybdenum-nickel-titanium alloy and molybdenum-magnesium-aluminum alloy.

According to some embodiments, the first buffer metal layer and the conductive sub-layer cover a side face of the metal sub-layer and a surface of the metal sub-layer away from the base substrate.

According to some embodiments, an orthographic projection of the conductive sub-layer on the metal sub-layer is located within the metal sub-layer.

According to some embodiments, the first buffer metal layer has a thickness of 100~500 angstroms.

According to some embodiments, the conductive sub-layer has a thickness of 200~1000 angstroms.

According to some embodiments, the electrode layer further includes a palladium metal layer sandwiched between the metal sub-layer and the conductive sub-layer, the palladium metal layer is located on and covers a surface of the metal sub-layer away from the base substrate as well as a side face of the metal sub-layer; the conductive sub-layer is located on and covers a surface of the palladium metal layer away from the base substrate.

According to some embodiments, a mass fraction of nickel in the conductive sub-layer is not less than 30%.

According to some embodiments, a mass fraction of nickel in the conductive sub-layer is not more than 80%.

According to some embodiments, the conductive sub-layer has a thickness of 500~2000 angstroms.

According to some embodiments, material of the conductive sub-layer includes metal oxide.

According to some embodiments, the material of the conductive sub-layer includes indium zinc oxide or indium tin oxide.

According to some embodiments, the array substrate includes a circuit board bonding region and a light-emitting region, wherein the circuit board bonding region includes a plurality of pin pads configured to be bonded and connected to a circuit board;
the light-emitting region includes a plurality of device pads configured to be bonded and connected to the functional devices;
the pin pads and the device pads are provided on the electrode layer.

According to some embodiments, the circuit board bonding region further includes a first connection portion, located at a side of the conductive sub-layer away from the base substrate and configured to bond and connect a conductive sub-layer of the pin pad with the circuit board.

According to some embodiments, material of the conductive sub-layer includes metal oxide; the device pads are provided on the metal sub-layer and exposed by the conductive sub-layer;

the light-emitting region further includes a second connection portion, the second connection portion is located at a side of a metal sub-layer of the device pad away from the base substrate and configured to bond and connect the metal sub-layer of the device pad with the functional device.

According to some embodiments, material of the conductive sub-layer includes copper-nickel alloy;

the light-emitting region further includes a second connection portion, the second connection portion is located at a side of a conductive sub-layer of the device pad away from the base substrate and configured to bond and connect the conductive sub-layer of the device pad with the functional device.

According to some embodiments, the array substrate includes a plurality of pin pads;

the base substrate exposes a surface of the pin pad close to the base substrate; and the surface of the pin pad exposed by the base substrate is configured to be bonded and connected to a circuit board.

According to some embodiments, the pin pad is provided at the metal wiring layer.

According to some embodiments, the electrode layer is provided with a plurality of device pads; the plurality of device pads are grouped into a plurality of groups of device pads, and each group of device pads includes a cathode pad and an anode pad arranged in pair;

the metal wiring layer is provided with a metal lead, and the electrode layer is further provided with a connection trace;

the metal lead is electrically connected to at least one of a plurality of pin pads for transmitting an electrical signal provided by a circuit board;

the connection trace is configured to achieve series connection or parallel connection of the plurality of groups of the device pads, and is further configured to be electrically connected to the metal lead by passing through a via hole of the first planarization layer.

According to some embodiments, the electrode layer further includes a second buffer metal layer located on a surface of the metal sub-layer close to the base substrate.

According to some embodiments, the metal wiring layer includes a seed metal layer, a copper growth layer and a second copper-nickel alloy layer sequentially stacked at the side of the base substrate.

According to some embodiments, the metal wiring layer includes a seed metal layer and a copper growth layer sequentially stacked at the side of the base substrate;

the array substrate further includes a passivation layer provided between the metal wiring layer and the first planarization layer.

According to some embodiments, the array substrate further includes an inorganic protective layer sandwiched between the electrode layer and the second planarization layer.

According to a second aspect of the present disclosure, a display panel is provided and includes the above array substrate, and the functional device of the array substrate is a micro light-emitting diode or a mini light-emitting diode.

According to a third aspect of the present disclosure, a backlight module is provided and includes the above array substrate, and the functional device of the array substrate is a micro light-emitting diode or a mini light-emitting diode.

According to a fourth aspect of the present disclosure, a method for manufacturing the array substrate is provided and includes:

providing a base substrate;

forming a metal wiring layer at a side of the base substrate;

forming a first planarization layer at a side of the metal wiring layer away from the base substrate;

forming an electrode layer at a side of the first planarization layer away from the base substrate, and the electrode layer including a metal sub-layer, a first buffer metal layer and a conductive sub-layer sequentially stacked at the side of the base substrate; material of the first buffer metal layer being any one of or a mixture of more than one of molybdenum, molybdenum-niobium alloy, molybdenum-tungsten alloy, molybdenum-nickel-titanium alloy, molybdenum-magnesium-aluminum alloy;

forming a second planarization layer at a side of the electrode layer away from the base substrate;

providing a functional device layer arranged at a side of the second planarization layer away from the base substrate and including a plurality of functional devices electrically connected to the electrode layer.

According to an embodiment, providing the electrode layer at the side of the first planarization layer away from the base substrate includes:

forming a metal-sub-material layer at the side of the first planarization layer away from the base substrate;

patterning the metal-sub-material layer to form the metal sub-layer;

forming a first buffer metal material layer and a conductive sub-material layer sequentially at a side of the metal sub-layer away from the base substrate;

patterning the first buffer metal material layer and the conductive sub-material layer to form the first buffer metal layer and the conductive sub-material layer, wherein an orthographic projection of the metal sub-layer on the base substrate is located within an orthographic projection of the first buffer metal layer on the base substrate.

According to a fourth aspect of the present disclosure, a method for manufacturing the array substrate is provided and includes providing a base substrate;

forming a metal wiring layer at a side of the base substrate;

forming a first planarization layer at a side of the metal wiring layer away from the base substrate;

forming a metal sub-layer at a side of the first planarization layer away from the base substrate, wherein the metal sub-layer is electrically connected to the metal wiring layer;

forming a palladium metal layer, wherein the palladium metal layer is located on and covers a surface of the metal sub-layer away from the base substrate as well as a side face of the metal sub-layer;

forming a conductive sub-layer by electroless plating, wherein the conductive sub-layer is located on and covers a surface of the palladium metal layer away from the base substrate;

providing a functional device layer arranged at a side of the conductive sub-layer away from the base substrate and including a plurality of functional devices electrically connected to the conductive sub-layer.

According to an embodiment, forming the palladium metal layer includes:

processing the metal sub-layer with a solution of palladium salt, and forming the palladium metal layer on the surface of the metal sub-layer away from the base substrate and on the side face of the metal sub-layer.

It is to be understood that the preceding general description and the following detailed description are exemplary and explanatory only and are not restrictive of the disclosure.

BRIEF DESCRIPTION OF THE DRAWINGS

The accompanying drawings here are incorporated in the specification and constitute a part of this specification, show embodiments in accordance with the present disclosure and serve to explain the principles of the present disclosure together with the specification. Obviously, the drawings in the following description are only some embodiments of the present disclosure, and for those ordinary skills in the art, other drawings can also be obtained from these drawings without creative efforts.

FIG. 18-1 is an electron micrograph of a copper-nickel alloy layer, a copper layer and a copper-nickel alloy layer sequentially deposited on a glass substrate in the related art, in which a mass fraction of nickel in the copper-nickel alloy layer is 20% and FIG. 18-2 shows the electron micrograph of the metal layer of FIG. 18-1 after etching.

FIG. 19-1 is an electron micrograph of a copper-nickel alloy layer, a copper layer and a copper-nickel alloy layer sequentially deposited on a glass substrate in the related art, in which a mass fraction of nickel in the copper-nickel alloy layer is 20% and FIG. 19-2 shows the electron micrograph of the metal layer of FIG. 19-1 after etching.

FIG. 20 is a picture of a plurality of pin pads, after high-temperature baking, and the pin pads are made of a copper metal strip protected by a copper-nickel alloy layer in the related art, in which a mass fraction of nickel in the copper-nickel alloy layer is 10%.

DETAILED DESCRIPTION

Figure 1:
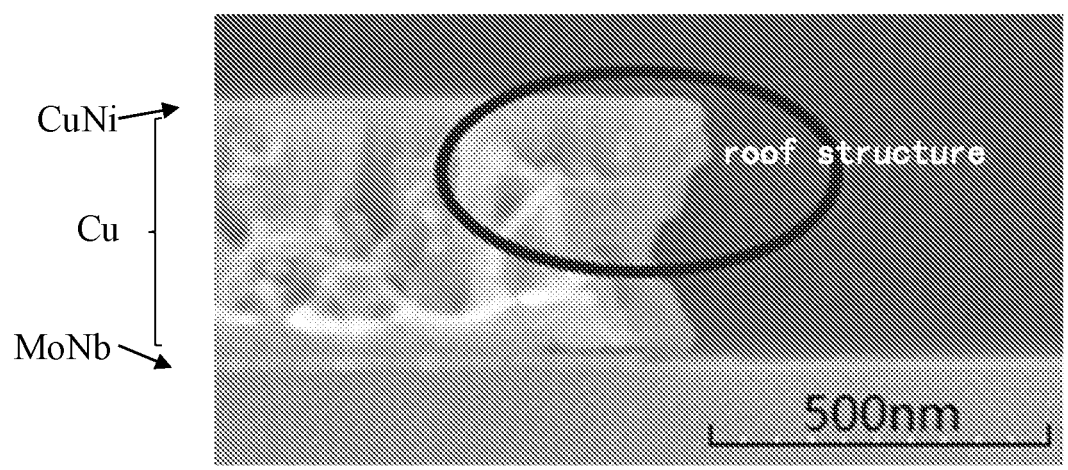
FIG. 1 is an electron micrograph of a metal layer in the related art after etching, in which the metal layer includes a molybdenum-niobium alloy layer, a copper metal layer and a copper-nickel alloy layer that are stacked, and a mass fraction of nickel in the copper-nickel alloy layer is 5%.

Example embodiments will now be described more fully with reference to the accompanying drawings. However, the example embodiments may be implemented in a variety of forms and should not be understood as being limited to the examples set forth herein. On the contrary, providing these embodiments makes the present disclosure more comprehensive and complete and comprehensively communicates the concept of the example embodiments to those skilled in the art. The same reference numerals in the drawings denote the same or similar components, and therefore repeated descriptions thereof will be omitted. In addition, the accompanying drawings are only schematic illustrations of the present disclosure and are not necessarily drawn to scale.

Although relative terms such as "up" and "down" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described "above" would become the component "below". When a structure is "on" other structure(s), it may mean that the structure is integrally formed on the other structure(s), or that the structure is "directly" arranged on the other structure(s), or that the structure is "indirectly" arranged on other structure(s) through another structure.

Terms "one", "a/an", "the", "said" and "at least one" are used to denote the presence of one or a plurality of elements/components/etc. Terms "including" and "having" are used to denote the meaning of non-exclusive inclusion and refer to that there may be other elements/components/etc. in addition to the listed elements/components/etc., and the terms "first" "second", "third", and the like are used only as markers, and not as restrictions on the number of objects.

A backplane of micro light-emitting diode (Micro-LED) may include a metal wiring layer, a first planarization layer, an electrode layer, a second planarization layer and the micro light-emitting diode sequentially stacked at the base substrate. However, during manufacturing, the electrode layer is prone to oxidation, resulting in yield decrease and quality reduction of the backplane of the micro light-emitting diode. Thus, the present disclosure provides an array substrate to overcome the yield decrease caused by oxidation.

The array substrate provided by the present disclosure may include a base substrate, a metal wiring layer, a first planarization layer, an electrode layer, a second planarization layer and a functional device layer sequentially stacked. The electrode layer includes a metal sub-layer and a conductive sub-layer sequentially stacked at a side of the base substrate; material of the metal sub-layer includes metal or metal alloy. The conductive sub-layer has oxidation resistance and covers the metal sub-layer. The functional device layer is provided at a side of the second planarization layer away from the base substrate, and includes a plurality of functional devices electrically connected to the electrode layer. In the present disclosure, the electrode layer is provided with the conductive sub-layer to improve the oxidation resistance thereof, thereby improving the yield of the array substrate.

Embodiment 1

The inventors found that oxidation of a copper metal layer may be prevented by manufacturing a copper-nickel alloy on the copper metal layer. However, an etching rate of the copper-nickel alloy is lower than that of copper, and the higher the nickel fraction, the slower the etching rate. When the copper metal layer and the copper-nickel alloy layer that are stacked are etched, the copper-nickel alloy layer usually has a roof structure (Tip structure) left. The higher the nickel fraction, the larger the roof structure, and the thicker the copper-nickel alloy layer, the slower the etching rate and the larger the roof structure. During the use of the array substrate, the roof structure may collapse, thereby leading to a defective array substrate, and further seriously affecting the productization of the array substrate and reducing quality of the array substrate. For example, referring to FIG. 1 to FIG. 4, these metal layers containing the copper-nickel alloy layer all form the roof structure after etching.

Figure 2:
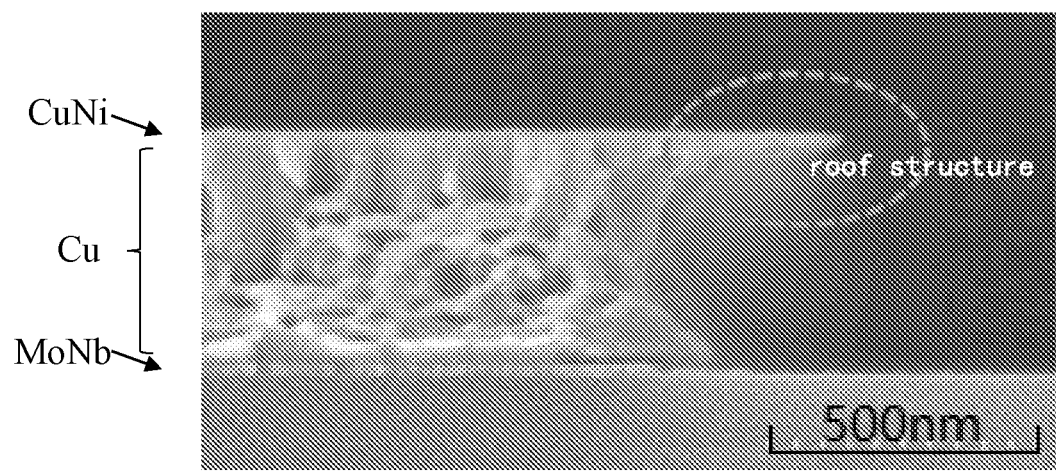
FIG. 2 is an electron micrograph of a metal layer in the related art after etching, in which the metal layer includes a molybdenum-niobium alloy layer, a copper metal layer and a copper-nickel alloy layer that are stacked, and a mass fraction of nickel in the copper-nickel alloy layer is 20%.
Figure 3:
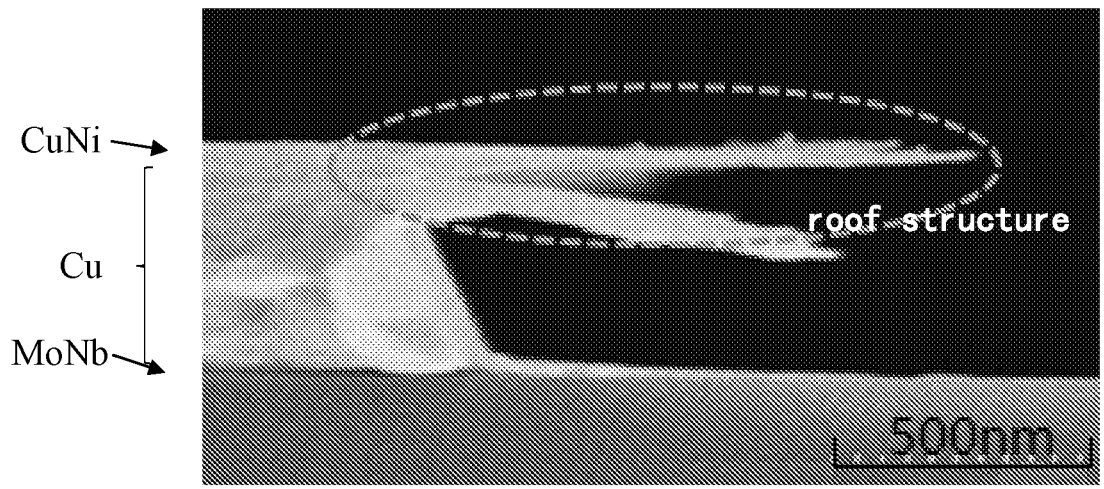
FIG. 3 is an electron micrograph of a metal layer in the related art after etching, in which the metal layer includes a molybdenum-niobium alloy layer, a copper metal layer and a copper-nickel alloy layer that are stacked, and a mass fraction of nickel in the copper-nickel alloy layer is 30%.
Figure 4:
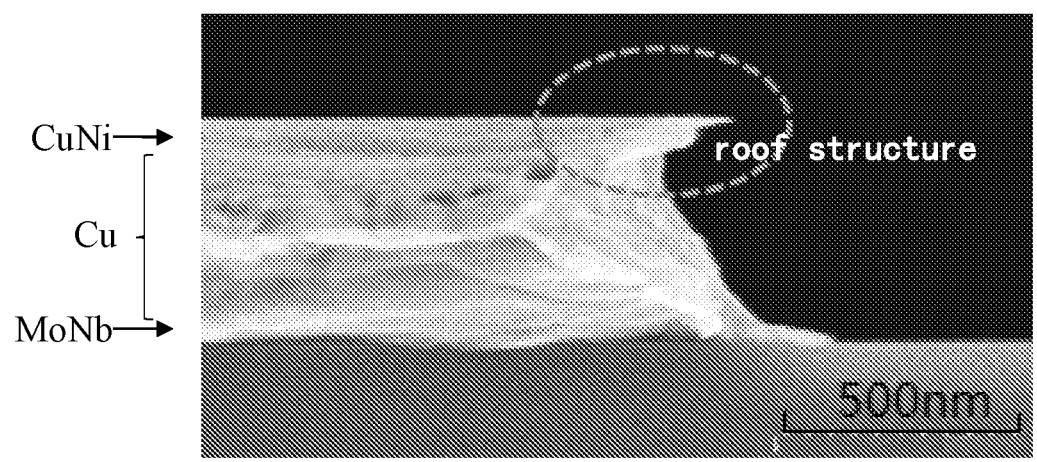
FIG. 4 is an electron micrograph of a metal layer in the related art after etching, in which the metal layer includes a copper-nickel alloy layer, a copper metal layer and a copper-nickel alloy layer that are stacked, and a mass fraction of nickel in the copper-nickel alloy layer is 20%.

FIG. 1 is an electron micrograph of a metal layer including a molybdenum-niobium (MoNb) alloy layer, a copper (Cu) metal layer and a copper-nickel (CuNi) alloy layer that are stacked after etching, in which a mass fraction of nickel in the copper-nickel alloy layer (also often named as a weight fraction) is 5%. In FIG. 1, it may be seen that a copper-nickel alloy layer forms the roof structure. FIG. 2 is an electron micrograph of a metal layer including a molybdenum-niobium alloy layer (MoNb), a copper metal layer (Cu) and a copper-nickel alloy layer (CuNi) that are stacked after etching, in which a mass fraction of nickel in the copper-nickel alloy layer is 20%. In FIG. 2, it may be seen that the copper-nickel alloy layer forms a large roof structure. FIG. 3 is an electron micrograph of a metal layer including a molybdenum-niobium alloy layer (MoNb), a copper metal layer (Cu) and a copper-nickel alloy layer (CuNi) that are stacked after etching, in which a mass fraction of nickel in the copper-nickel alloy layer is 30%. In FIG. 3, it may be seen that the copper-nickel alloy layer forms a much larger roof structure that has collapsed. FIG. 4 is an electron micrograph of a metal layer including a copper-nickel alloy layer (CuNi), a copper metal layer (Cu) and a copper-nickel alloy layer (CuNi) that are stacked after etching, in which a mass fraction of nickel in the copper-nickel alloy layer is 20%. In FIG. 4, it may be seen that the copper-nickel alloy layer forms a large roof structure.

Figure 5:
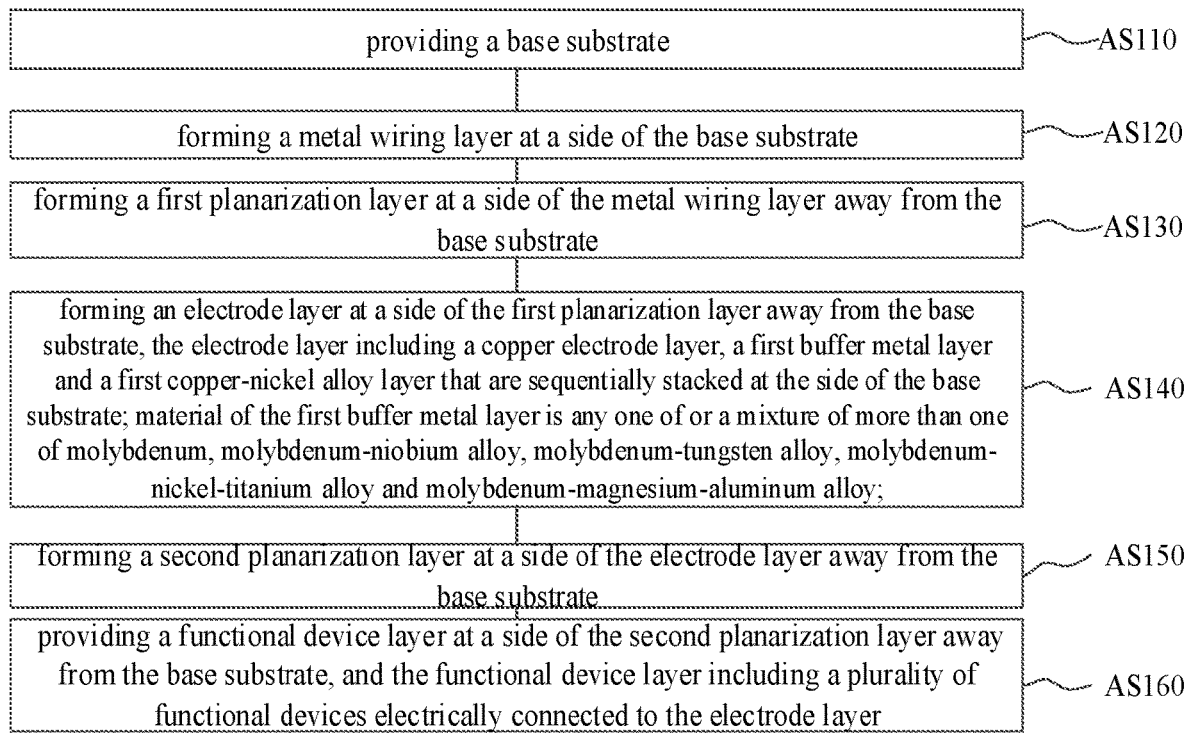
FIG. 5 is a flowchart of a method for manufacturing an array substrate according to an implementation of Embodiment 1.
Figure 6:
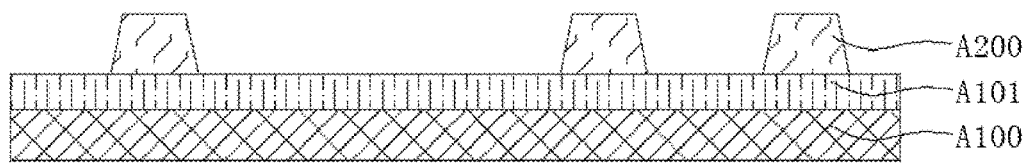
FIG. 6 is a structural view of forming a metal wiring layer according to an implementation of Embodiment 1.
Figure 7:
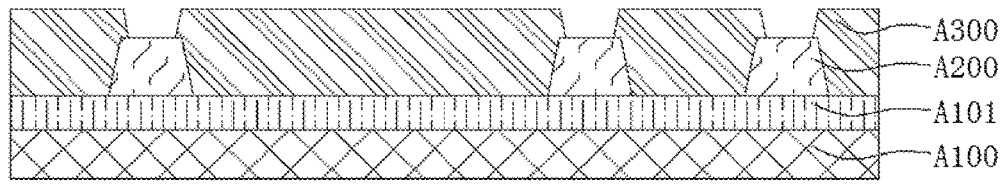
FIG. 7 is a structural view of forming a first planarization layer according to an implementation of Embodiment 1.
Figure 11:
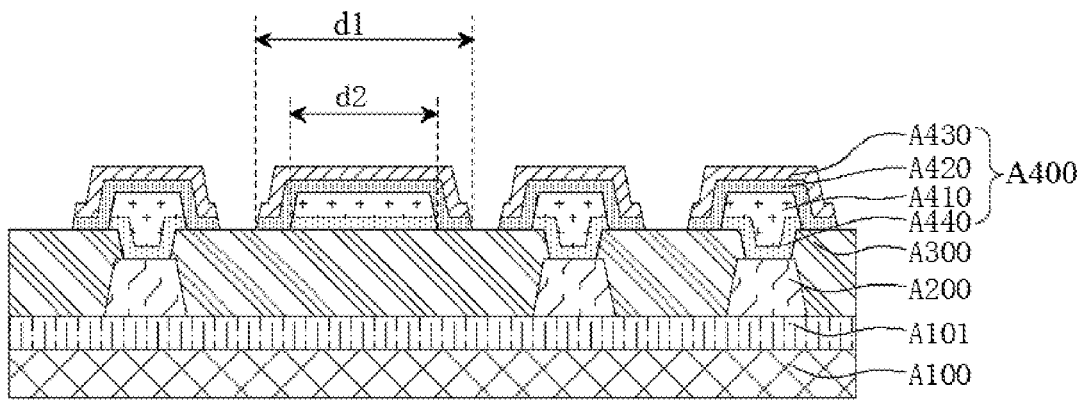
FIG. 11 is a structural view of forming a first buffer metal layer and a first copper-nickel alloy layer according to an implementation of Embodiment 1.
Figure 12:
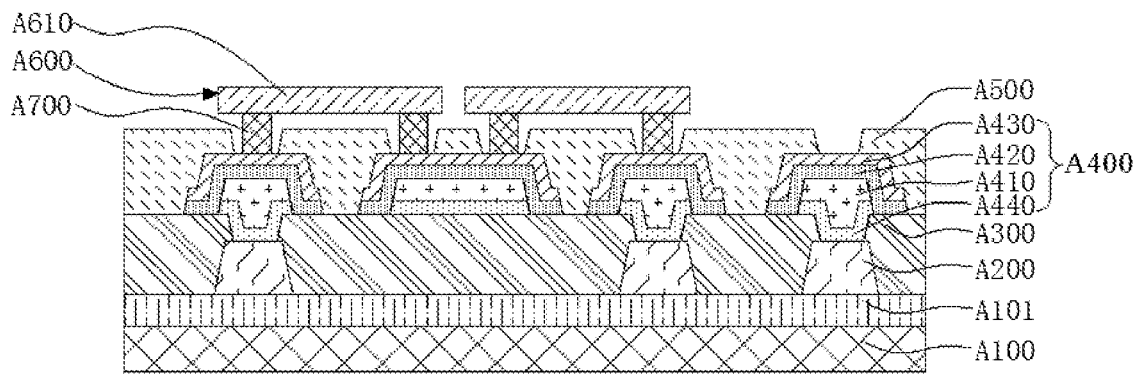
FIG. 12 is a structural view of an array substrate according to an implementation of Embodiment 1.
Figure 14:
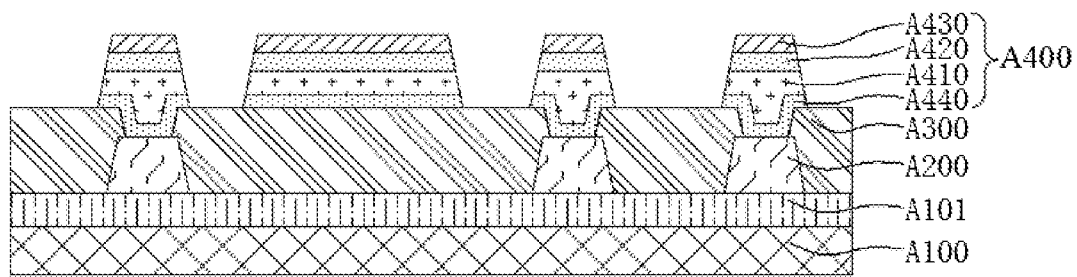
FIG. 14 is a structural view of forming a second buffer metal layer, a copper electrode layer, a first buffer metal layer and a first copper-nickel alloy layer according to an implementation of Embodiment 1.
Figure 15:
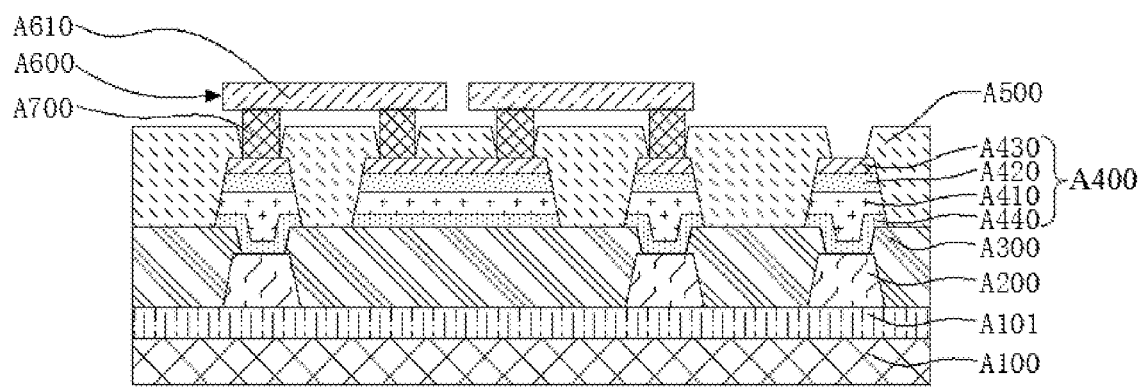
FIG. 15 is a structural view of an array substrate according to an implementation of Embodiment 1.

The present embodiment provides an array substrate and a manufacturing method thereof. Referring to FIG. 5, the method for manufacturing the array substrate includes:

step AS110, referring to FIG. 6, providing a base substrate A100;

step AS120, referring to FIG. 6, forming a metal wiring layer A200 at a side of the base substrate A100;

step AS130, referring to FIG. 7, forming a first planarization layer A300 at a side of the metal wiring layer A200 away from the base substrate A100;

step AS140, referring to FIG. 11 and FIG. 14, forming an electrode layer A400 at a side of the first planarization layer A300 away from the base substrate A100, the electrode layer A400 including a copper electrode layer A410 (which may be used as a metal sub-layer), a first buffer metal layer A420 and a first copper-nickel alloy layer A430 (which may be used as a conductive sub-layer) that are sequentially stacked at the side of the base substrate A100; material of the first buffer metal layer A420 is any one of or a mixture of more than one of molybdenum, molybdenum-niobium alloy, molybdenum-tungsten alloy, molybdenum-nickel-titanium alloy and molybdenum-magnesium-aluminum alloy;

step AS150, referring to FIG. 12 and FIG. 15, forming a second planarization layer A500 at a side of the electrode layer A400 away from the base substrate A100;

step AS160, referring to FIG. 12 and FIG. 15, providing a functional device layer A600 at a side of the second planarization layer A500 away from the base substrate A100, and the functional device layer A600 including a plurality of functional devices A610 electrically connected to the electrode layer A400.

According to the method for manufacturing the array substrate of the present embodiment, referring to FIG. 12 and FIG. 15, the manufactured array substrate includes a base substrate A100, a metal wiring layer A200, a first planarization layer A300, an electrode layer A400, a second planarization layer A500 and a functional device layer A600 which are sequentially stacked. The electrode layer A400 includes a copper electrode layer A410, a first buffer metal layer A420 and a first copper-nickel alloy layer A430 which are sequentially stacked at the side of the base substrate A100, material of the first buffer metal layer A420 is any one of or a mixture of molybdenum, molybdenum-niobium alloy, molybdenum-tungsten alloy, molybdenum-nickel-titanium alloy and molybdenum-magnesium-aluminum alloy, and the functional device layer A600 includes a plurality of functional devices A610 electrically connected to the electrode layer A400.

In the array substrate and the manufacturing method thereof, since the first buffer metal layer A420 is provided between the copper electrode layer A410 and the first copper-nickel alloy layer A430, the first copper-nickel alloy layer A430 may have a good morphology, avoid the roof structure of the first copper-nickel alloy layer A430 from generating during the etching, and improve the morphology of the electrode layer A400 and enhance the quality of the array substrate. The first copper-nickel alloy layer A430 is arranged not only to protect the copper electrode layer A410, but also improve an adhesive force of the functional device A610.

Principles, details and effects of each step of the method for manufacturing the array substrate provided by the present embodiment will be further explained and illustrated in combination with the accompanying drawings below.

In the present embodiment, any one of the film layers may include a side face, a surface close to the base substrate, and a surface away from the base substrate, and the surface close to the base substrate and the surface away from the base substrate are connected through the side face of the film layer. In the present embodiment, a thickness of any film layer is a size of the film layer in a direction perpendicular to the base substrate.

In step AS110, referring to FIG. 6, a base substrate A100 may be provided. The base substrate A100 may be the base substrate A100 in inorganic material or in organic material. For example, in an embodiment of the present embodiment, the material of the base substrate A100 may be glass material such as soda-lime glass, quartz glass, sapphire glass, or metal material such as stainless steel, aluminum, nickel, and the like. In another embodiment of the present embodiment, the material of the base substrate A100 may be Polymethyl methacrylate (PMMA), Polyvinyl alcohol (PVA), Polyvinyl phenol (PVP), Polyether sulfone (PES), Polyimide, Polyamide, Polyacetal, Polycarbonate (PC), Polyethylene terephthalate (PET), Polyethylene naphthalate (PEN) or a combination thereof. In another embodiment of the present embodiment, the base substrate A100 may also be a flexible base substrate A100. For example, the material of the base substrate A100 may be Polyimide (PI). The base substrate A100 may also be a composite of multi-layer materials. For example, in an embodiment of the present embodiment, the base substrate A100 may include a bottom film layer, a pressure-sensitive adhesive layer, a first polyimide layer and a second polyimide layer which are sequentially stacked.

Optionally, referring to FIG. 6, before forming the metal wiring layer A200, an insulating buffer layer A101 may also be formed at the side of the base substrate A100, such as forming a silicon nitride layer, a silicon oxide layer or a silicon oxynitride layer, and then, a metal wiring layer A200 is formed at a side of the insulating buffer layer A101 away from the base substrate A100. The insulating buffer layer A101 may improve stress applied to the base substrate when forming the metal wiring layer A200, and may isolate water vapor.

In an embodiment of the present embodiment, the material of the base substrate A100 is glass, such that the base substrate has a large size and low cost, which is convenient to reduce the cost of backlight module as a backlight source of a direct-down type backlight module.

In another embodiment of the present embodiment, the material of the base substrate A100 is polyimide, such that the array substrate may be a flexible array substrate, which is convenient for manufacturing a flexible or foldable display panel.

In step AS120, referring to FIG. 6, a metal wiring layer A200 may be formed at a side of the base substrate A100. The metal wiring layer A200 may include a metal lead which may drive each functional device A610 through the electrode layer A400. The metal wiring layer A200 may be formed by deposition and patterning. The deposition methods include but are not limited to sputtering, electroplating and electroless plating. The patterning methods include but are not limited to photolithography, growing a patterned growth layer on the patterned seed layer, growing a patterned metal pattern within the limitation of the pattern limitation layer, and the like.

For example, in some embodiments, the metal wiring layer A200 may be manufactured by the following method: sputtering on a side of the base substrate A100 to form the metal wiring material layer, then patterning the metal wiring material layer through a photolithography process to form a metal wiring layer A200. In the present embodiment, the metal wiring material layer may include one layer of metal material or a plurality of layers of stacked metal material.

Preferably, the metal wiring material layer includes at least a first copper metal material layer such that the metal lead has a low resistance. A thickness of the first copper metal material layer is not greater than 1 micron to avoid excessive stress on the base substrate A100 during sputtering to form the first copper metal material layer. The first copper metal material layer is patterned to form a first copper metal layer. Thus, in the manufactured array substrate, the metal wiring layer A200 includes at least a first copper metal layer.

Further preferably, the metal wiring material layer may further include a first adhesive material layer located on a surface of the first copper metal material layer close to the base substrate A100, and material of the first adhesive material layer may be molybdenum, molybdenum-copper alloy, molybdenum-niobium alloy, molybdenum-copper-niobium alloy, or other metals or metal alloys. The first adhesive material layer is patterned to form a first adhesive layer, which may improve an adhesive force between the first copper metal layer and the base substrate A100 or the insulating buffer layer A101, and protect the metal copper from corrosion. Thus, in the manufactured array substrate, the metal wiring layer A200 may include the first adhesive layer and the first copper metal layer sequentially stacked at the side of the base substrate A100.

Further preferably, the metal wiring material layer may further include a second adhesive material layer located on a surface of the first copper metal material layer away from the base substrate A100, and material of the second adhesive material layer may be molybdenum, molybdenum-copper alloy, molybdenum-niobium alloy, molybdenum-copper-niobium alloy, or other metals or metal alloys. The second adhesive material layer is patterned to form a second adhesive layer, which may improve an adhesive force between the first copper metal layer and the electrode layer A400 and protect the metal copper from corrosion. Thus, in the manufactured array substrate, the metal wiring layer A200 may include the first copper metal layer and the second adhesive layer sequentially stacked at the side of the base substrate A100.

For example, the metal wiring layer A200 includes a molybdenum-niobium alloy layer, a copper metal layer, and a molybdenum-niobium alloy layer sequentially stacked at the side of the base substrate A100.

As another example, in other embodiments, the metal wiring layer A200 may be manufactured by the following method:
forming a first metal wiring material layer at a side of the base substrate A100, and the first metal wiring material layer including a molybdenum-niobium alloy material layer, a copper metal material layer and a molybdenum-niobium alloy material layer which are sequentially stacked, then using a mask to pattern the first metal wiring material layer, so as to pattern the first metal wiring material layer into a first metal wiring layer. The first metal wiring layer includes a molybdenum-niobium alloy layer, a copper metal layer and a molybdenum-niobium alloy layer that are stacked;
forming a second metal wiring material layer at a side of the first metal wiring layer away from the base substrate A100, and the second metal wiring material layer including a molybdenum-niobium alloy material layer, a copper metal material layer, and a molybdenum-niobium alloy material layer which are sequentially stacked, then, using the same mask to pattern the second metal wiring material layer, so as to pattern the second metal wiring material layer into a second metal wiring layer. The second metal wiring layer includes a molybdenum-niobium alloy layer, a copper metal layer and a molybdenum-niobium alloy layer that are stacked.

Thus, the metal wiring layer A200 includes the first metal wiring layer and the second metal wiring layer that are stacked, and the patterns of the first metal wiring layer and the second metal wiring layer are the same. As a whole, the metal wiring layer A200 includes a molybdenum-niobium alloy layer, a copper metal layer, a molybdenum-niobium alloy layer, a molybdenum-niobium alloy layer, a copper metal layer, and a molybdenum-niobium alloy layer which are sequentially stacked, which may increase a thickness of the metal wiring layer A200, reduce an impedance of the metal wiring layer A200, and meet electrical requirements of the array substrate.

As another example, in other embodiments, the metal wiring layer A200 may be manufactured by the following method:
step AS210: sputtering a seed metal material layer on a side of the base substrate A100;
step AS220, forming a pattern limitation layer on a surface of the seed metal material layer away from the base substrate A100, material of the pattern limitation layer being a removable insulating material and formed with a plurality of patterned openings exposing the seed metal material layer;
step AS230, forming a copper growth material layer in the opening of the pattern limitation layer by means of copper electroplating;
step AS240, removing the pattern limitation layer;
step AS250, removing a part of the seed metal material layer not covered by the copper growth material layer by etching, such that the seed metal material layer is patterned into a seed metal layer; in the process of etching, there being no need to protect the copper growth material layer, and thus a surface of the copper growth material layer being partially etched to form the copper growth layer.

In step AS210, the seed metal material layer may include a second copper metal material layer with a thickness of not more than 1 micron. Preferably, the thickness of the second copper metal material layer is 2500~3500 angstroms. For example, the thickness of the second copper metal material layer is 3000 angstroms. The second copper metal material layer is patterned to form a second copper metal layer. Thus, in the manufactured array substrate, the seed metal layer may include the second copper metal layer.

Optionally, the seed metal material layer may further include a third adhesive material layer located at a surface of the second copper metal material layer close to the base substrate A100, and material of the third adhesive material layer may be molybdenum, molybdenum-copper alloy, molybdenum-niobium alloy, molybdenum-copper-niobium alloy, or other metals or metal alloys. The second adhesive material layer is patterned to form a third adhesive layer. Thus, in the manufactured array substrate, the seed metal layer may include the third adhesive layer and the second copper metal layer sequentially stacked at the side of the base substrate A100. Preferably, material of the third adhesive layer is a molybdenum-niobium alloy with a thickness of 250~350 angstroms. For example, the thickness of the third adhesive layer is 300 angstroms.

In step AS220, the material of the pattern limitation layer may be an organic insulating material such as a photosensitive resin, or an inorganic material such as silicon oxide. Preferably, the material of the pattern limitation layer is a photoresist.

In step AS220 and step AS230, a thickness of the pattern limitation layer may be determined according to a thickness of the copper growth material layer such that the thickness of the pattern limitation layer is greater than the thickness of the copper growth material layer. The thickness of the copper growth material layer may be determined according to resistance requirements of the array substrate on the metal wiring layer A200. The lower the resistance required for the metal wiring layer A200, the greater the thickness of the copper growth material layer. Optionally, in step AS250, the thickness of the formed copper growth layer is 1.5~10 microns. In this way, the metal wiring layer A200 may only be provided with one layer of the metal lead, and there is no need to arrange multi-layer stacked metal leads to reduce the impedance, which may reduce the manufacturing process of the array substrate and number of masks, thereby reducing the cost of the array substrate. The copper growth layer may be formed by electroplating or electroless plating. For example, in an embodiment of the present embodiment, the thickness of the pattern limitation layer is 7.5 microns, and the thickness of the copper growth material layer is 6.3 microns. For example, in another embodiment of the present embodiment, the thickness of the pattern limitation layer is 3~4 microns, and the thickness of the copper growth material layer is 2.1 microns.

Optionally, in the present embodiment, the method for manufacturing the array substrate may further include: before forming the first planarization layer A300, forming a passivation layer on a surface of the metal wiring layer A200 away from the base substrate A100 to protect the metal wiring layer A200. The passivation layer may be made of inorganic insulating materials such as silicon oxide, silicon nitride, silicon oxynitride and the like. Thus, in the manufactured array substrate, the passivation layer is provided between the metal wiring layer A200 and the first planarization layer A300.

For example, material of the passivation layer is silicon nitride, and a thickness of the passivation layer is 900∥1100 angstroms.

As another example, in other embodiments, the metal wiring layer A200 may be manufactured by the following method:

The seed metal layer and the copper growth layer are manufactured according to the methods shown in steps AS210 to AS250, and then the second copper-nickel alloy layer is formed by electroplating or electroless plating. The second copper-nickel alloy layer covers a surface and a side face of the copper growth layer away from the base substrate A100, and may also cover a part or all of a side face of the seed metal layer. In this way, the second copper-nickel alloy layer may protect the seed metal layer and the copper growth layer from oxidation in a baking process. In this way, the manufactured metal wiring layer A200 includes the seed metal layer, the copper growth layer and the second copper-nickel alloy layer sequentially stacked at the side of the base substrate A100, the second copper-nickel alloy layer covers the surface and the side face of the copper growth layer away from the base substrate A100, and a part or all of the side face of the seed metal layer.

Preferably, a mass fraction of nickel in the second copper-nickel alloy layer is not less than 30%, so as to ensure that the second copper-nickel alloy layer has an excellent anti-oxidation effect, and avoid various problems caused by the etching of copper-nickel alloy with a high mass fraction of nickel. Further, the mass fraction of nickel is greater than 80%.

Preferably, a thickness of the second copper-nickel alloy layer is 500~2000 angstroms, so as to ensure that the second copper-nickel alloy layer has excellent oxidation resistance and avoid various problems caused by the etching of copper-nickel alloy with a high thickness.

Preferably, the seed metal layer and the copper growth layer may be treated with a palladium salt solution to form a palladium activation layer that covers the surface and the side face of the copper growth layer away from the base substrate A100 and at least a part of the side face of the seed metal layer, then, the palladium activation layer is treated with an electroless plating solution containing copper salt, nickel salt, reducing agent, complexing agent and pH regulator, and a second copper-nickel alloy layer is formed at a surface of the palladium activation layer away from the base substrate A100.

In the present embodiment, after forming the metal wiring layer A200, the first planarization layer A300 may be formed in step AS130 without the additional passivation layer. In this way, it may not only improve anti-oxidation protection of copper in the metal wiring layer A200, but also reduce deposition, etching and other steps of the passivation layer, improve the quality of the array substrate and reduce the cost of the array substrate.

In step AS130, referring to FIG. 7, the first planarization layer A300 may be formed at the side of the metal wiring layer A200 away from the base substrate A100. Material of the first planarization layer A300 may be an organic material, such as a photosensitive resin.

Optionally, a thickness of the first planarization layer A300 is 3~7 microns. Preferably, the thickness of the first planarization layer A300 is 4.5~5.5 microns.

The first planarization layer A300 may be defined with a via hole such that the electrode layer A400 is electrically connected to the metal wiring layer A200. For example, the first planarization layer A300 may be defined with a first via hole and a second via hole, both of which expose at least a part of the metal wiring layer A200. The electrode layer A400 includes a connection electrode and a bonding pad, at least a part of the connection electrode is electrically connected to the metal wiring layer A200 through the first via hole, and the bonding pad is electrically connected to the metal wiring layer A200 through the second via hole. The bonding pad is configured for electrical connection with a circuit board (such as a flexible circuit board) or a driving chip, and at least a part of the connection electrode is configured for electrical connection with a functional device.

In step AS140, the electrode layer A400 may be formed at the side of the first planarization layer A300 away from the base substrate A100. The electrode layer A400 includes a copper electrode layer A410, a first buffer metal layer A420, and a first copper-nickel alloy layer A430 sequentially stacked at the side of the base substrate A100. The first buffer metal layer A420 and the first copper-nickel alloy layer A430 are functioned together as an electrode protective layer to protect the copper electrode layer A410, avoid he surface oxidation of the copper electrode layer A410, and improve an adhesive force between the electrode layer A400 and the functional device layer A600, especially improve the adhesive force between the electrode layer A400 and a solder layer, and avoid the functional device A610 from peeling. The first buffer metal layer A420 may also increase an adhesive force between the copper electrode layer A410 and the first copper-nickel alloy layer A430.

Optionally, when the electrode layer A400 is formed, the copper electrode layer A410 may be formed first, and then the first buffer metal layer A420 and the first copper-nickel alloy layer A430 covering the copper electrode layer A410 may be formed, or the copper electrode layer A410, the first buffer metal layer A420, and the first copper-nickel alloy layer A430 that are sequentially stacked may be formed during the same etching.

Figure 8:
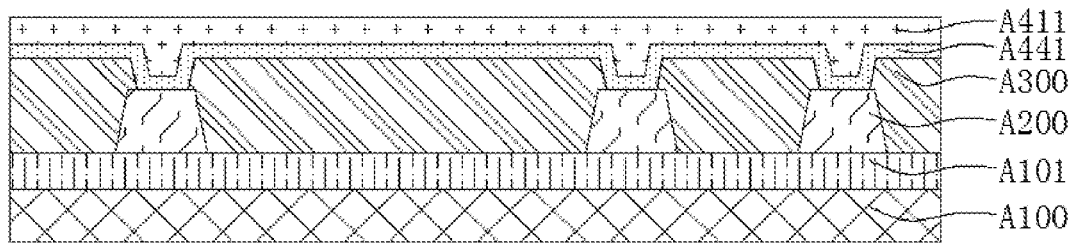
FIG. 8 is a structural view of forming a copper electrode material layer and a second buffer metal material layer according to an implementation of Embodiment 1.
Figure 9:
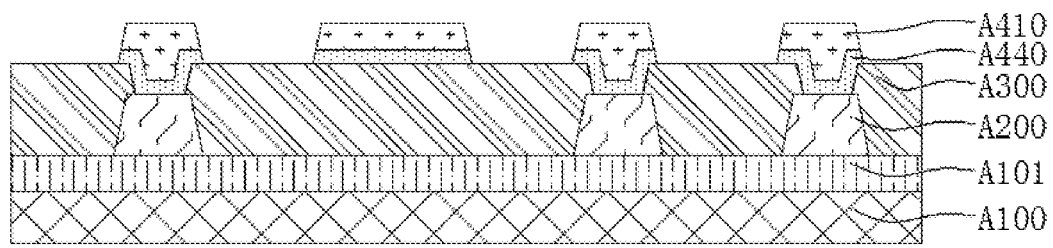
FIG. 9 is a structural view of forming a copper electrode layer and a second buffer metal layer according to an implementation of Embodiment 1.
Figure 10:
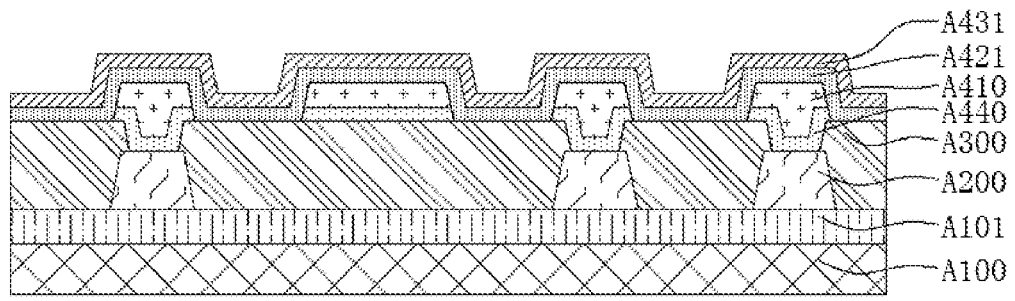
FIG. 10 is a structural view of forming a first buffer metal material layer and a first copper-nickel alloy material layer according to an implementation of Embodiment 1.

In some embodiments, forming the electrode layer A400 at the side of the first planarization layer A300 away from the base substrate A100 includes the following steps:

step AS310, referring to FIG. 8, forming a copper electrode material layer A411 (as a metal-sub-material layer) at the side of the first planarization layer A300 away from the base substrate A100;

step AS320, referring to FIG. 9, patterning the copper electrode material layer A411 to form the copper electrode layer A410 (as a metal sub-layer);

step AS330, referring to FIG. 10, a first buffer metal material layer a421 and a first copper-nickel alloy material layer A431 (as a conductive sub-material layer) are sequentially formed at the side of the copper electrode layer A410 away from the base substrate A100;

step AS340, referring to FIG. 11, patterning the first buffer metal material layer A421 and the first copper-nickel alloy material layer A431 to form the first buffer metal layer A420 and the first copper-nickel alloy layer A430 (as conductive sub-layers); an orthographic projection of the copper electrode layer A410 on the base substrate A100 being located within an orthographic projection of the first buffer metal layer A420 on the base substrate A100.

In the step AS310, the copper electrode material layer A411 may be formed by sputtering, and a thickness of the copper electrode material layer A411 may be determined according to requirements. For example, the thickness of the copper electrode material layer A411 may be 2500~5000 angstroms. Preferably, the thickness of the copper electrode material layer A411 may be 3000 angstroms.

In step AS320, the copper electrode material layer A411 may be patterned by a photolithography process, and the patterned copper electrode material layer A411 is the copper electrode layer A410.

For example, in an embodiment of the present embodiment, the copper electrode material layer A411 may be patterned by the following steps: forming a first positive photoresist layer on a surface of the copper electrode material layer A411 away from the base substrate A100; exposing the first positive photoresist layer at a first exposure intensity by adopting a mask; developing the first positive photoresist layer; etching the copper electrode material layer A411 to form the copper electrode layer A410; removing the first positive photoresist layer.

Optionally, in an embodiment of the present embodiment, referring to FIG. 8, in step AS310, before forming the copper electrode material layer A411, a second buffer metal material layer A441 may be formed at the side of the first planarization layer A300 away from the base substrate A100, and then the copper electrode material layer A411 may be formed at a surface of the second buffer metal material layer A441 away from the base substrate A100. Material of the second buffer metal material layer A441 is any one of or a mixture of more than one of molybdenum, molybdenum-niobium alloy, molybdenum-tungsten alloy, molybdenum-nickel-titanium alloy and molybdenum-magnesium-aluminum alloy. In step AS320, when the copper electrode material layer A411 is patterned, the second buffer metal material layer A441 may also be patterned synchronously to form a second buffer metal layer A440. During etching, although the material of the second buffer metal material layer A441 is difficult to etch, since the second buffer metal material layer A441 contacts and is synchronously etched with the copper electrode material layer A411, there may be an electronic chemical effect between the two. Electrons on the second buffer metal material layer A441 transfer to the copper electrode material layer A411 to increase etching speed of the second buffer metal material layer A441. Thus, the second buffer metal material layer A441 and the copper electrode material layer A411 may be synchronously etched, and a surface of the second buffer metal layer A440 away from the base substrate A100 substantially overlaps with a surface of the copper electrode layer A410 close to the base substrate A100. Thus, in the array substrate manufactured in the present embodiment, the electrode layer A400 may include the second buffer metal layer A440, the copper electrode layer A410, the first buffer metal layer A420, and the first copper-nickel alloy layer A430, which are sequentially stacked at the side of the first planarization layer A300 away from the base substrate A100.

In step AS330, referring to FIG. 10, the first buffer metal material layer A421 and the first copper-nickel alloy material layer A431 may be sequentially formed at a surface of the copper electrode layer A410 away from the base substrate A100 by sputtering. Optionally, thickness of the first buffer metal material layer A421 is 100~500 angstroms. Preferably, the thickness of the first buffer metal material layer A421 is 200~500 angstroms. Optionally, thickness of the first copper-nickel alloy material layer A431 is 200||1000 angstroms. Preferably, the thickness of the first copper-nickel alloy material layer A431 is 500~1000 angstroms. Preferably, material of the first buffer metal material layer A421 is a molybdenum-niobium alloy. Thus, material of the formed first buffer metal layer A420 is a molybdenum-niobium alloy.

Figure 17:
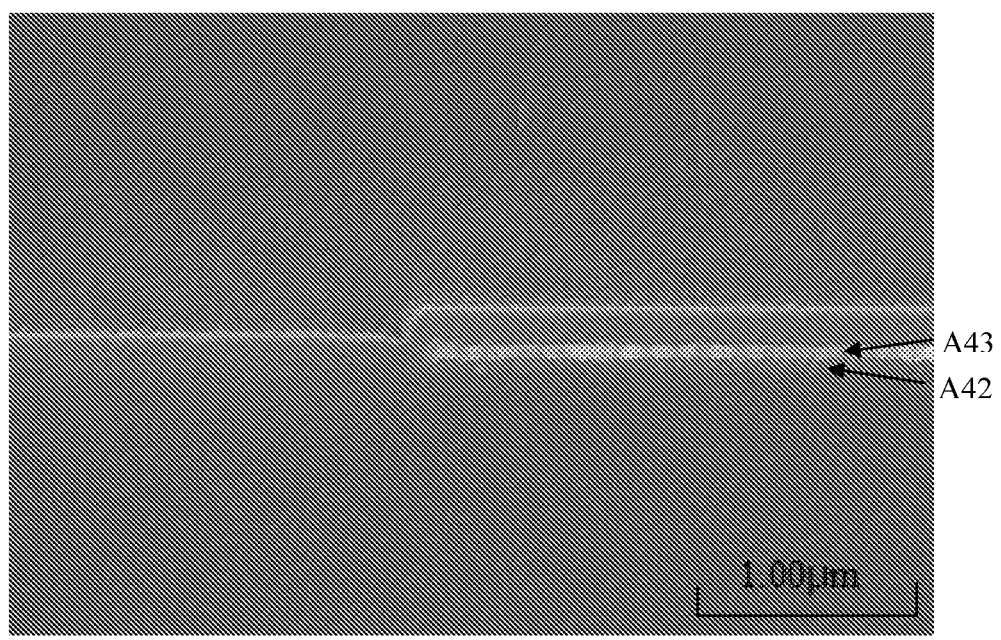
FIG. 17 is an electron micrograph of a first buffer metal layer and a first copper-nickel alloy layer according to an implementation of Embodiment 1.

In step AS340, the first buffer metal material layer A421 and the first copper-nickel alloy material layer A431 may be patterned by a photolithography process to form the first buffer metal layer A420 and the first copper-nickel alloy layer A430. During the etching, etching rates of the first buffer metal material layer A421 and the first copper-nickel alloy material layer A431 are similar, and thus the first copper-nickel alloy material layer A431 cannot form the roof structure. FIG. 17 is an electron micrograph of a first buffer metal layer A420 and a first copper-nickel alloy layer A430 formed after etching. As may be seen from FIG. 17, a surface of the first buffer metal layer A420 away from the base substrate A100 substantially overlaps with a surface of the first copper-nickel alloy layer A430 close to the base substrate A100. The orthographic projection of the copper electrode layer A410 on the base substrate A100 may be located within the orthographic projection of the first buffer metal layer A420 on the base substrate A100. Thus, the first buffer metal layer A420 covers the surface of the copper electrode layer A410 away from the base substrate A100 and a side face of the copper electrode layer A410, and accordingly, the first copper-nickel alloy layer A430 covers the surface of the copper electrode layer A410 away from the base substrate A100 and the side face of the copper electrode layer A410, which is, the orthographic projection of the copper electrode layer A410 on the base substrate A100 is also located within an orthographic projection of the first copper-nickel alloy layer A430 on the base substrate A100.

Thus, in the present embodiment, in the electrode layer A400 of the array substrate, the first buffer metal layer A420 and the first copper-nickel alloy layer A430 cover the side face of the copper electrode layer A410 and the surface of the copper electrode layer A410 away from the base substrate A100, such that the first copper-nickel alloy layer A430 may effectively protect the copper electrode layer A410 from oxidation. Moreover, since the etching rates of the first buffer metal material layer A421 and the first copper-nickel alloy material layer A431 are similar, the roof structure of the first copper-nickel alloy layer A430 that leads to reduction of the quality of the array substrate may be avoided.

For example, in step AS340, the first buffer metal material layer A421 and the first copper-nickel alloy material layer A431 may be patterned by the following method: forming a second positive photoresist layer at a surface of the first copper-nickel alloy material layer A431 away from the base substrate A100; exposing the second positive photoresist layer at a second exposure intensity by adopting a mask, in which the second exposure intensity is less than the first exposure intensity; developing the second positive photoresist layer; etching the first buffer metal material layer A421 and the first copper-nickel alloy material layer A431 to form the first buffer metal layer A420 and the first copper-nickel alloy layer A430; removing the second positive photoresist layer. The same mask may be used in step AS340 and step AS320 to reduce number of masks and manufacturing cost of the array substrate.

Since the same mask is adopted, and the exposure intensity in step AS340 is relatively weak, the pattern of the second positive photoresist layer after development in step AS340 is larger than that of the first positive photoresist layer after development in step AS320, and the pattern of the first positive photoresist layer after development is completely located within the pattern of the second positive photoresist layer after development, which may ensure that the first buffer metal layer A420 enables to cover the copper electrode layer A410.

Preferably, in order to ensure that step AS320 and step AS340 may share the same mask, a minimum distance between an edge of an orthographic projection of the copper metal layer on the base substrate A100 and an edge of an orthographic projection of the first metal buffer layer on the base substrate A100 may be equal to or greater than 1.5 microns. In other words, referring to FIG. 11, for any one of substructures of the electrode layer A400, such as any one of a pad, a connection electrode or another substructure located in the electrode layer A400, FICD (final insight critical dimensions) d1 of the first buffer metal layer A420 in the substructure is at least 3 microns larger than the FICD d2 of the copper electrode layer A410 of the substructure.

Figure 13:
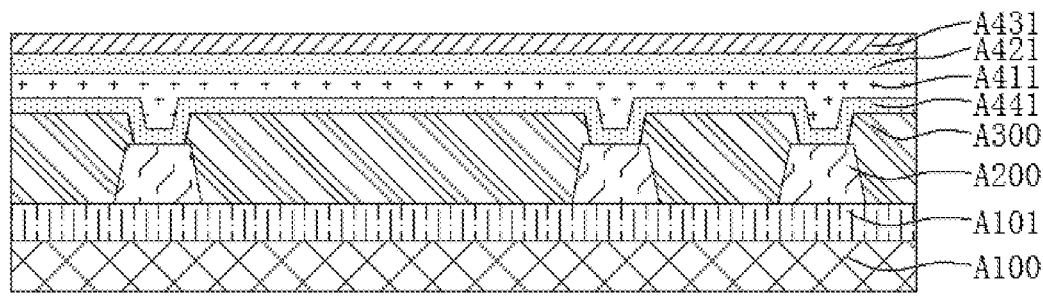
FIG. 13 is a structural view of forming a second buffer metal material layer, a copper electrode material layer, a first buffer metal material layer and a first copper-nickel alloy material layer according to an implementation of Embodiment 1.

In other embodiments, forming the electrode layer A400 at the side of the first planarization layer A300 away from the base substrate A100 includes the following steps:

step AS410, referring to FIG. 13, forming a copper electrode material layer A411, a first buffer metal material layer A421, and a first copper-nickel alloy material layer A431 sequentially at a side of the first planarization layer A300 away from the base substrate A100;

step AS420, forming a photoresist layer at a side of the first copper-nickel alloy material layer A431 away from the base substrate A100;

step AS430, exposing and developing the photoresist layer;

step AS440, referring to FIG. 14, etching the copper electrode material layer A411, the first buffer metal material layer A421 and the first copper-nickel alloy material layer A431 to form a copper electrode layer A410, a first buffer metal layer A420 and a first copper-nickel alloy layer A430;

step AS450, removing the photoresist layer.

In step AS410, the copper electrode material layer A411, the first buffer metal material layer A421, and the first copper-nickel alloy material layer A431 may be sequentially formed by sputtering. Optionally, a thickness of the first buffer metal material layer A421 is 200~500 angstroms. Optionally, a thickness of the first copper-nickel alloy material layer A431 is 500~1000 angstroms. Preferably, material of the first buffer metal material layer A421 is a molybdenum-niobium alloy. Thus, material of the formed first buffer metal layer A420 is a molybdenum-niobium alloy.

Optionally, in an embodiment of the present embodiment, before forming the copper electrode material layer A411, a second buffer metal material layer A441 may also be formed at the side of the first planarization layer A300 away from the base substrate A100; and then, the copper electrode material layer A411 is formed at a side of the second buffer metal material layer A441 away from the base substrate A100. Thus, the second buffer metal material layer A441 may be etched synchronously with the copper electrode material layer A411 in step AS440 and patterned into a second buffer metal layer A440. Thus, in the manufactured array substrate, the electrode layer A400 may include the second buffer metal layer A440, the copper electrode layer A410, the first buffer metal layer A420, and the first copper-nickel alloy layer A430 that are sequentially stacked. Material of the second buffer metal layer A440 is any one of or a mixture of more than one of molybdenum, molybdenum-niobium alloy, molybdenum-tungsten alloy, molybdenum-nickel-titanium alloy and molybdenum-magnesium-aluminum alloy.

In step AS440, the copper electrode material layer A411, the first buffer metal material layer A421 and the first copper-nickel alloy material layer A431 may be etched simultaneously to form the electrode layer A400 without the roof structure. In this step, although etching rates of the first buffer metal material layer A421 and the first copper-nickel alloy material layer A431 without the copper metal material layer is less than that of the copper metal material layer, when the first buffer metal material layer A421 is sandwiched between the copper metal material layer and the first copper-nickel alloy material layer A431, there may be an electronic chemical effect between the copper metal material layer and the first buffer metal material layer A421 as well as the first copper-nickel alloy material layer A431. During the etching, electrons on the first buffer metal material layer A421 may be transferred to the copper metal material layer, thereby increasing the etching rate of the first buffer metal material layer A421, and electrons on the first copper-nickel alloy material layer A431 may be transferred to the copper metal material layer, thereby increasing the etching rate of the first copper-nickel alloy material layer A431. Eventually, the copper electrode material layer A411, the first buffer metal material layer A421, and the first copper-nickel alloy material layer A431 may be etched substantially synchronously. This not only overcomes defect that the copper-nickel alloy layer and the copper metal layer are prone to have the roof structure during the simultaneous etching, but also overcomes defect that the etching rate of the copper-nickel alloy layer is too slow, so as to further improve the morphology of the electrode layer A400 and improve an manufacturing rate of the electrode layer A400, improve the quality of the array substrate and reduce the cost of the array substrate.

Figure 16:
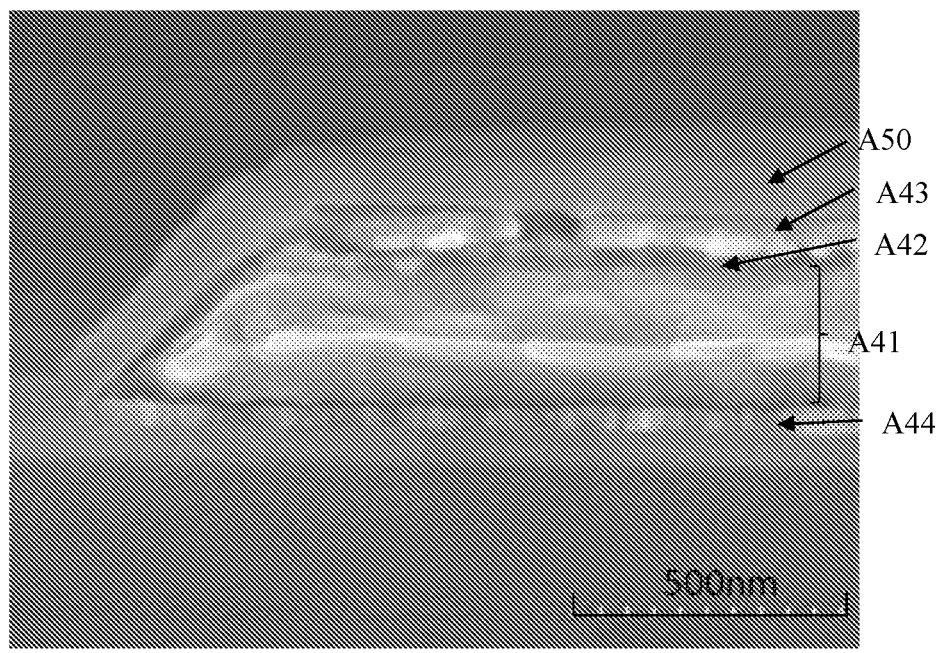
FIG. 16 is an electron micrograph of a second buffer metal layer, a copper electrode layer, a first buffer metal layer and a first copper-nickel alloy layer according to an implementation of Embodiment 1.

FIG. 16 is an electron micrograph of a manufactured electrode layer A400 according to the method of step AS440. Referring to FIG. 16, a surface of the copper electrode layer A410 away from the base substrate A100 may substantially overlap with a surface of the first buffer metal layer A420 close to the base substrate A100, and a surface of the first buffer metal layer A420 away from the base substrate A100 may substantially overlap with a surface of the first copper-nickel alloy layer A430 close to the base substrate A100. When the electrode layer A400 further includes the second buffer metal layer A440, the surface of the second buffer metal layer A440 away from the base substrate A100 may substantially overlap with the surface of the copper electrode layer A410 close to the base substrate A100. As may be seen in FIG. 16, although the copper electrode material layer A411, the first buffer metal material layer A421 and the first copper-nickel alloy material layer A431 are simultaneously etched, no roof structure is generated.

Thus, in the method for manufacturing the array substrate provided in the present embodiment, the first copper-nickel alloy material layer A431 and the copper electrode material layer A411 may be simultaneously etched with a copper-etching solution, and the structure is formed without the roof structure. Therefore, there is no need to develop a new etching solution, which not only reduces a manufacturing cost of the array substrate, but also saves time for developing the new etching solution, and finally reduce the cost of array substrate. In addition, the array substrate does not need to provide an ITO (indium zinc oxide) layer in a bonding region of the flexible circuit board to improve an adhesive force with the flexible circuit board and improve the anti-oxidation effect, which may reduce the manufacturing process and the cost of the array substrate.

In step AS150, referring to FIG. 12 and FIG. 15, the second planarization layer A500 may be formed at the side of the electrode layer A400 away from the base substrate A100. The second planarization layer A500 may be defined with a plurality of via holes to expose a part of the electrode layer A400 such that the exposed electrode layer A400 is electrically connected to the functional device A610. In some embodiments, the exposed electrode layer A400 is electrically connected to the circuit board or a driving chip. For example, the electrode layer includes a connection electrode and a bonding pad, and the connection electrode includes a bonding region and a connection region. The second planarization layer A500 may be defined with a third via hole and a fourth via hole. The third via hole may expose the bonding region of the connection electrode such that the functional device may be electrically connected to the connection electrode through the third via hole. The fourth via hole may expose the bonding pad such that the circuit board or the driving chip is electrically connected to the bonding pad through the fourth via hole.

It may be understood that the part of the bonding region of the electrode layer A400 exposed by the third via hole may be used as a device pad, and the part of the connection electrode that is not exposed by the third via hole and the fourth via hole, such as a part covered by the second planarization layer, may be used as a connection trace. In this way, the connection electrode may be grouped as the device pad and the connection trace according to position and function. For any connection electrode, it may only include the device pad or the connection trace, or it may further include the device pad and the connection trace that are electrically connected, in which at least a part of the connection trace may be connected to the metal wiring layer, and at least a part of the connection trace may be connected to the device pad. Of course, in some embodiments, a part of the connection trace may connect different device pads such that a plurality of device pads are electrically connected to each other, and at least a part of the connection trace may simultaneously connect the device pad and the metal wiring layer such that the functional device is electrically connected to the metal wiring layer.

Since the electrode layer A400 is provided with the first copper-nickel alloy layer A430, there is no need to worry oxidation of the copper electrode layer A410, so arrangement for a passivation layer (an inorganic protective layer such as a silicon nitride layer used to protect the electrode layer) at the side of the electrode layer A400 away from the base substrate is unnecessary, and thus problem that the passivation layer covers the first planarization layer A300 and causes the first planarization layer A300 to bulge is avoided. In this way, not only may processes such as depositing the passivation layer and etching the passivation layer be saved, but also production cycle of the array substrate may be refined to improve production capacity and reduce cost, and the quality of array substrate may be improved.

Optionally, in some embodiments, the second planarization layer A500 may be formed by a screen printing method. In this way, number of masks may be reduced and the manufacturing cost of the array substrate may be reduced. Specifically, white oil may be coated by screen printing to form the second planarization layer A500. The white oil includes a light curable resin or a light curable monomer, and titanium dioxide particles dispersed in the resin. Optionally, the light curable monomer may include, but are not limited to, acrylate monomer.

In step AS160, referring to FIG. 12 and FIG. 15, a functional device layer A600 may be provided at a side of the protective layer away from the base substrate A100. The functional device layer A600 may include functional devices A610 that are distributed in array, such as a light-emitting device for emitting light, an ultrasonic transmitting device for emitting ultrasound, a heating device for generating heat, or other functional device A610 driven by current, and may further include a microchip for driving or controlling, a sensor for sensing brightness or temperature, and the like.

In an embodiment of the present disclosure, the functional device A610 may be a micro light-emitting diode (Micro-LED) or a mini light-emitting diode (Mini-LED), and the functional device A610 may be connected to the electrode layer A400 through a massive amount of transfer technology and bonding process. Further, the functional device A610 may be electrically connected to the electrode layer A400 through the solder layer A700 including tin and indium. For example, the functional device A610 may be connected to the electrode layer A400 through printing tin soldering, die bond, reflow soldering and other processes.

In another embodiment of the present disclosure, some functional devices may be the micro light-emitting diode (Micro-LED) or the mini light-emitting diode (Mini-LED), and some of the functional devices may be a microchip for controlling one or a plurality of light-emitting diodes. Under control of the microchip, the one or a plurality of light-emitting diodes controlled by the microchip is controlled to emit or not to emit light.

It should be noted that although the respective steps of the method in the present disclosure are described in a specific order in the drawings, this does not require or imply that the steps must be performed in the specific order, or all steps shown must be performed to achieve desired results. Additionally or alternatively, certain steps may be omitted, multiple steps may be combined into one step for execution, and/or one step may be split into multiple steps for execution, and the like, which shall be considered as a part of the present embodiment.

The present embodiment further provides an array substrate, referring to FIG. 12 and FIG. 15. The array substrate includes:
a base substrate A100;
a metal wiring layer A200 provided at a side of the base substrate A100;
a first planarization layer A300 provided at a side of the metal wiring layer A200 away from the base substrate A100;
an electrode layer A400 provided at a side of the first planarization layer A300 away from the base substrate A100; the electrode layer A400 including a copper electrode layer A410, a first buffer metal layer A420 and a first copper-nickel alloy layer A430 sequentially stacked at the side of the base substrate A100; material of the first buffer metal layer A420 being any one of or a mixture of more than one of molybdenum, molybdenum-niobium alloy, molybdenum-tungsten alloy, molybdenum-nickel-titanium alloy and molybdenum-magnesium-aluminum alloy;
a second planarization layer A500 provided at a side of the electrode layer A400 away from the base substrate A100;
a functional device layer A600 provided at a side of the second planarization layer A500 away from the base substrate A100, and including a plurality of functional devices A610 electrically connected to the electrode layer A400.

The array substrate provided by the present embodiment may be manufactured by the method for manufacturing the array substrate described in the above method for manufacturing the array substrate of the present embodiment, with the same or similar beneficial effects, which is not repeated in the present embodiment herein.

In an embodiment of the present embodiment, the electrode layer A400 further includes a second buffer metal layer A440 located on a surface of the copper electrode layer A410 close to the base substrate A100.

In an embodiment of the present embodiment, the first buffer metal layer A420 and the first copper-nickel alloy layer A430 cover a side face of the copper electrode layer A410 and a surface of the copper electrode layer A410 away from the base substrate A100.

In an embodiment of the present embodiment, an orthographic projection of the first copper-nickel alloy layer A430 on the copper electrode layer A410 is located within the copper electrode layer A410.

In an embodiment of the present embodiment, a thickness of the first buffer metal layer A420 is 100~500 angstroms. Preferably, the thickness of the first buffer metal layer A420 is 200~500 angstroms.

In an embodiment of the present embodiment, a thickness of the first copper-nickel alloy layer A430 is 200~1000 angstroms. Preferably, the thickness of the first copper-nickel alloy layer A430 is 500~1000 angstroms.

In an embodiment of the present embodiment, a mass fraction of nickel in the first copper-nickel alloy layer A430 is greater than 20%. Preferably, the mass fraction of nickel in the first copper-nickel alloy layer A430 is 30%~80%.

Other details and effects of the array substrate provided by the present embodiment have been recorded in the above method for manufacturing the array substrate, or may be clearly derived from the above method for manufacturing the array substrate, which is not repeated in the present embodiment.

The embodiments of the present embodiment further provide a display panel, which includes any one of the array substrates described in the above array substrate embodiments, the functional device A610 of the array substrate is a micro light-emitting diode or a mini light-emitting diode. The display panel may be a mobile phone screen, a television screen, a smartwatch screen, an electronic picture screen, an electronic billboard or other types of display panels. Since the display panel has any one of the array substrates described in the above embodiments, the display panel has the same beneficial effects, which are not repeated in the present embodiment. Preferably, the functional device A610 on the array substrate includes micro light-emitting diodes or mini light-emitting diodes in various colors, such as red micro light-emitting diodes or mini light-emitting diodes, blue micro light-emitting diodes or mini light-emitting diodes, and blue micro light-emitting diodes or mini light-emitting diodes.

The embodiments further provide a backlight module including any one of the array substrates described in the above embodiments, the functional device A610 of the array substrate is a micro light-emitting diode or a mini light-emitting diode. The backlight module may be a backlight module of a mobile phone screen, a backlight module of a television screen, a backlight module of a computer screen or a backlight module of other types of liquid crystal display panels. Since the backlight module has any one of the array substrates described in the above embodiments, it has the same beneficial effect, which is not repeated herein.

Embodiment 2

The inventor found that oxidation resistance of a second copper metal layer may be improved by covering a copper-nickel alloy layer on a surface of the second copper metal layer. A thickness of copper-nickel alloy does not exceed 500 angstroms, and a mass fraction of nickel does not exceed 20%. This is because an etching rate of copper-nickel alloy is lower than that of copper, and the higher the nickel faction, the slower the etching rate. Due to the different etching rates of the copper-nickel alloy and the copper, when the copper metal layer and the copper-nickel alloy layer that are stacked are etched, the copper-nickel alloy layer usually has a roof structure (Tip structure) left, the higher the nickel fraction, the larger the roof structure, and the thicker the copper-nickel alloy layer, the slower the etching rate and the larger the roof structure. During use of the array substrate, the roof structure may collapse, thereby leading to defective array substrate, and further seriously affecting productization of the array substrate and reducing quality of the array substrate.

For example, FIG. 18-1 is an electron micrograph of a copper-nickel alloy layer (500 angstroms), a copper layer (6000 angstroms) and a copper-nickel alloy layer (500 angstroms) sequentially deposited on a glass substrate, a mass fraction of nickel in the copper-nickel alloy layer is 20%; FIG. 18-2 is the electron micrograph of the above metal layer after etching. In the electron micrograph, it may be clearly seen that a copper-nickel alloy layer forms the roof structure with a size of 0.1 micron. FIG. 19-1 is an electron micrograph of a copper-nickel alloy layer (500 angstroms), a copper layer (6000 angstroms) and a copper-nickel alloy layer (500 angstroms) sequentially deposited on a glass substrate, in which a mass fraction of nickel in the copper-nickel alloy layer is 30%; FIG. 19-2 shows the electron micrograph of the above metal layer after etching. In the electron micrograph, it may be clearly seen that the copper-nickel alloy layer forms the roof structure with a size of 0.15 micron. Comparing FIG. 18-2 with FIG. 19-2, it may be clearly known that the larger the mass fraction of nickel in the copper-nickel alloy layer, the larger the size of the roof structure formed during the etching, and the greater the impact on the quality of the array substrate.

In the related art, a nickel fraction in the copper-nickel alloy layer is usually 10%, so as to improve an etched morphology as much as possible. However, this kind of copper-nickel alloy layer has poor protection effect on copper metal layer. FIG. 20 is a photo of a plurality of pin pads, after high temperature baking, and the pin pads are made of a cooper metal strip which is protected by the copper-nickel alloy layer with a mass fraction of 10% nickel. In this photo, the brighter the color of the copper metal strip (such as EE position shown in FIG. 20), the lower the oxidation degree of its surface, and the darker the color of the copper metal strip (such as DD position shown in FIG. 20), the higher the oxidation degree of its surface. It may be seen from FIG. 20 that when the copper-nickel alloy layer with the mass fraction of 10% nickel is used to protect the copper metal, the copper metal undergoes obvious oxidation and blackening (as shown at DD position in FIG. 20) at the high temperature.

Figure 21:
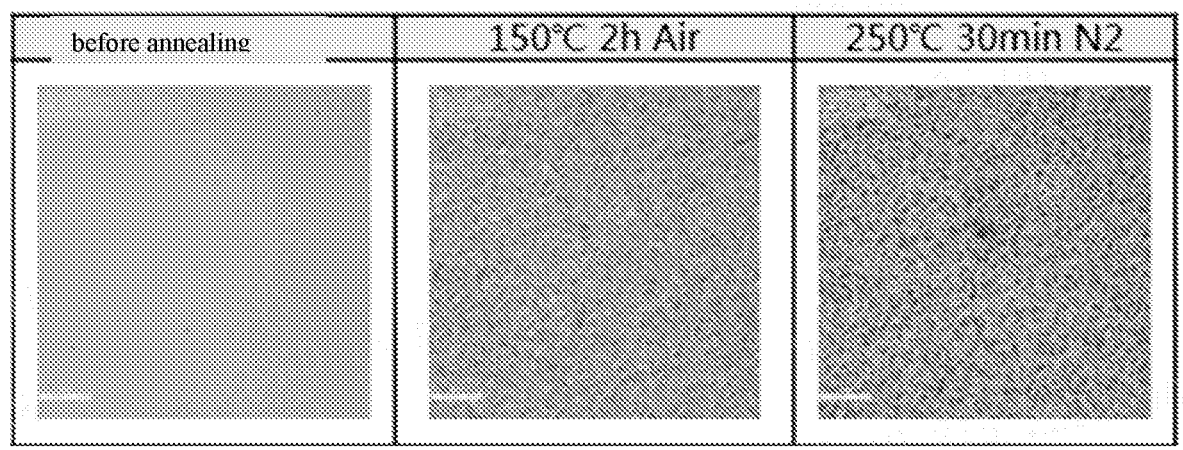
FIG. 21 is a picture of a copper metal layer protected by a copper-nickel alloy layer after different treatments, in which a mass fraction of nickel in the copper-nickel alloy layer is 20%.
Figure 22:
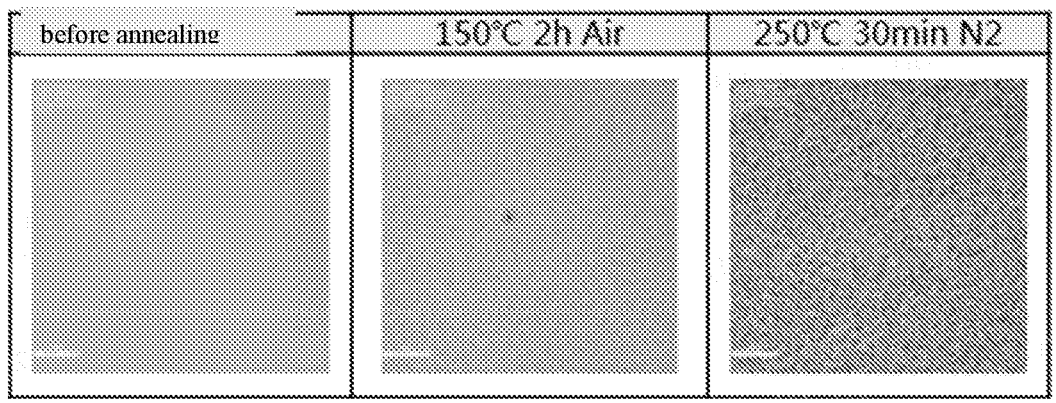
FIG. 22 is a picture of a copper metal layer protected by a copper-nickel alloy layer after different treatments, in which a mass fraction of nickel in the copper-nickel alloy layer is 35%.

The inventor found in the test that the higher the nickel fraction in the copper-nickel alloy, the better the protection effect on the copper metal. For example, FIG. 21 shows pictures of a copper metal layer (6000 angstroms) covered by the copper-nickel metal layer (500 angstroms) with a mass fraction of 20% nickel in three different cases: before annealing; annealed at 150° C. in air atmosphere for two hours, and annealed at 250° C. in nitrogen atmosphere for 30 minutes. Small black spots in the pictures are places where the copper metal layer is oxidized and blackened. FIG. 22 shows pictures of a copper metal layer (6000 angstroms) covered by the copper-nickel metal layer (500 angstroms) with a mass fraction of 35% nickel in three different cases: before annealing; annealed at 150° C. in air atmosphere for two hours, and annealed at 250° C. in nitrogen atmosphere for 30 minutes. Small black spots in the pictures are places where the copper metal layer is oxidized and blackened. Comparing FIG. 21 and FIG. 22, it may be seen that the higher the nickel fraction in the copper-nickel metal layer, the less likely the copper metal layer is to be oxidized.

Figure 23:
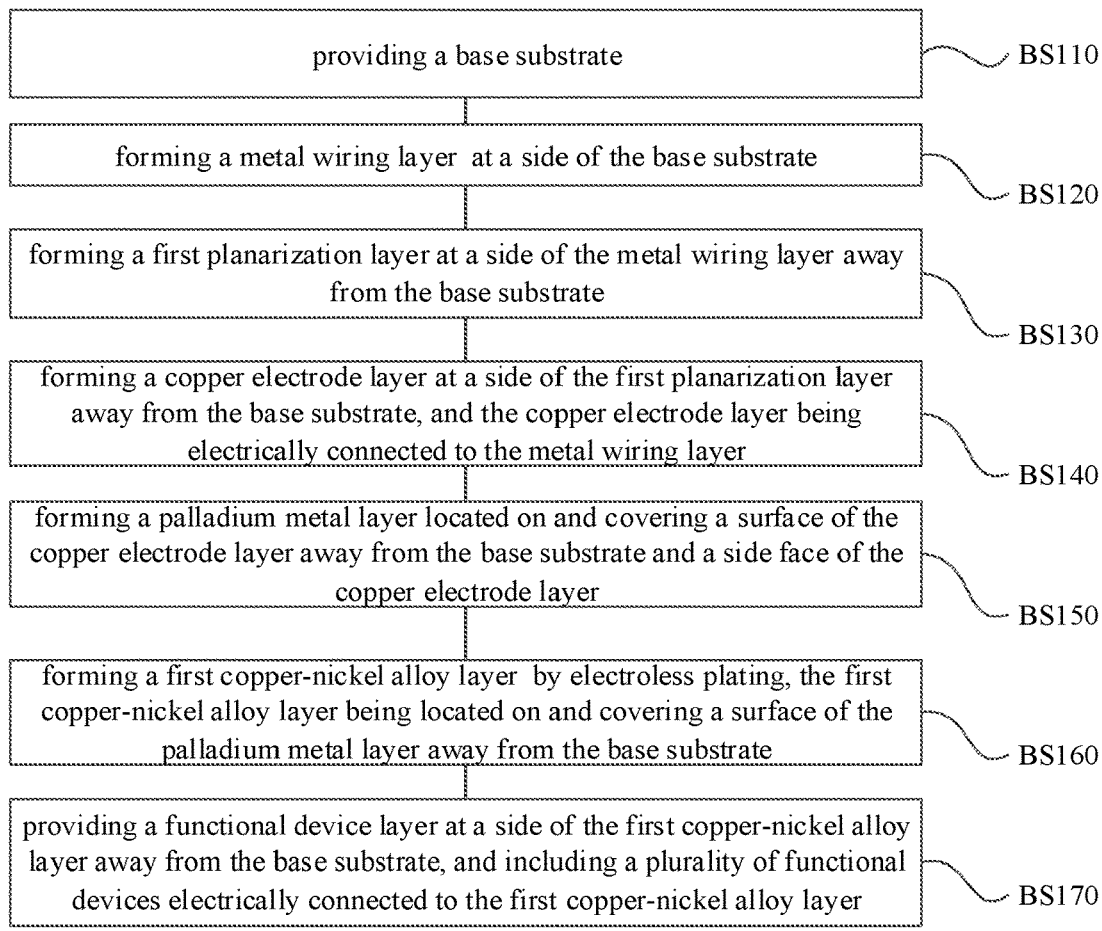
FIG. 23 is a flowchart of a method for manufacturing an array substrate according to an implementation of Embodiment 2.
Figure 24:
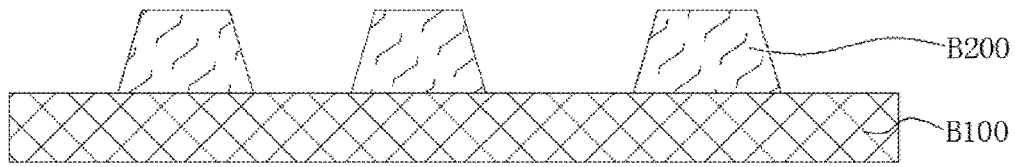
FIG. 24 is a structural view of forming a metal wiring layer on a side of a base substrate according to an implementation of Embodiment 2.
Figure 25:
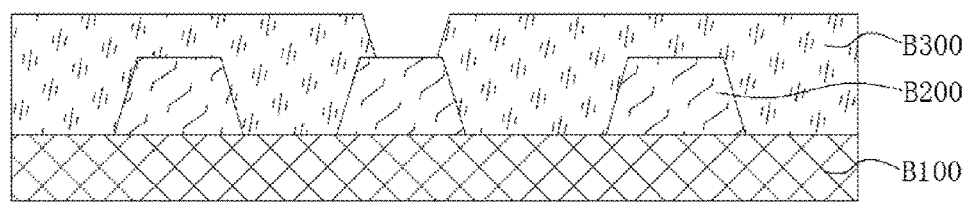
FIG. 25 is a structural view of forming a first planarization layer at a side of a metal wiring layer away from a base substrate according to an implementation of Embodiment 2.
Figure 26:
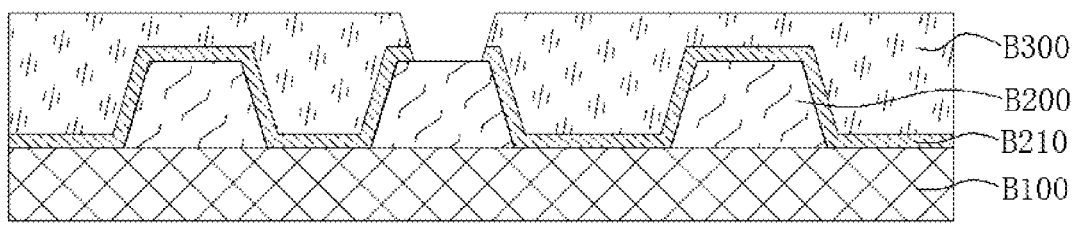
FIG. 26 is a structural view of forming a passivation layer and a first planarization layer at a side of a metal wiring layer away from a base substrate according to an implementation of Embodiment 2.
Figure 27:
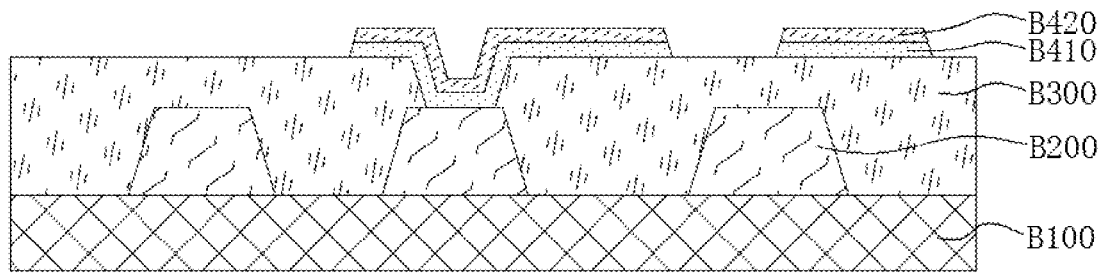
FIG. 27 is a structural view of forming a second buffer metal layer and a copper electrode layer at a side of a first planarization layer away from a base substrate according to an implementation of Embodiment 2.
Figure 28:
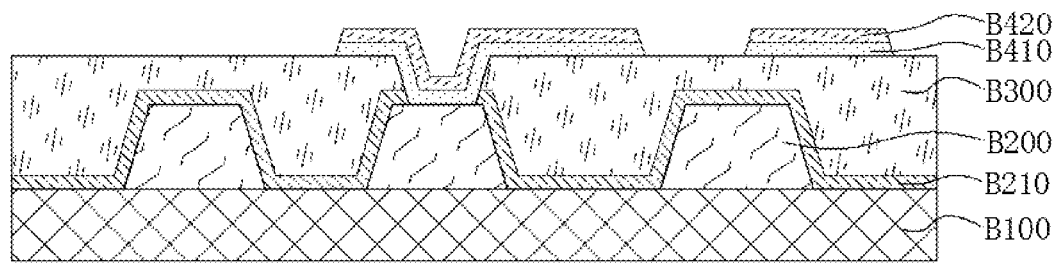
FIG. 28 is a structural view of forming a second buffer metal layer and a copper electrode layer at a side of a first planarization layer away from a base substrate according to an implementation of Embodiment 2.
Figure 29:
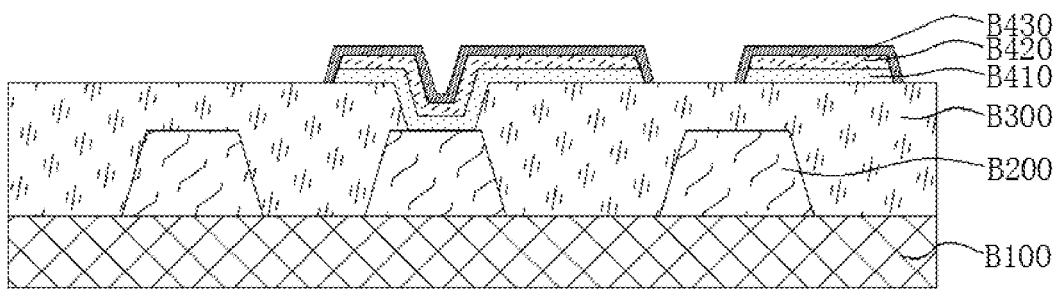
FIG. 29 is a structural view of forming a palladium metal layer at a side of a copper electrode layer away from a base substrate according to an implementation of Embodiment 2.
Figure 30:
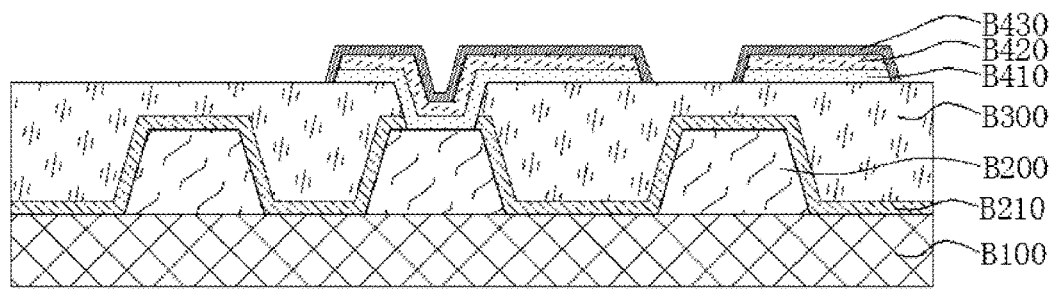
FIG. 30 is a structural view of forming a palladium metal layer at a side of a copper electrode layer away from a base substrate according to an implementation of Embodiment 2.
Figure 31:
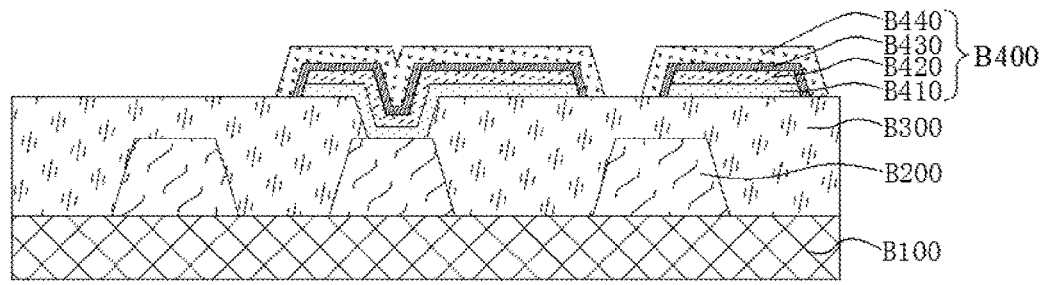
FIG. 31 is a structural view of forming a first copper-nickel alloy layer at a side of a palladium metal layer away from a base substrate according to an implementation of Embodiment 2.
Figure 32:
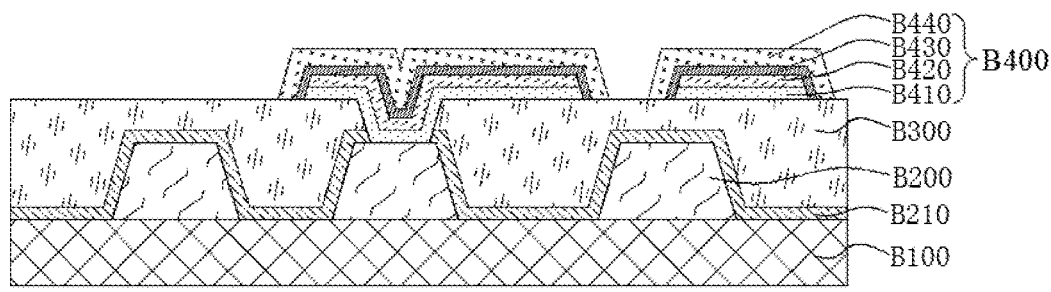
FIG. 32 is a structural view of forming a first copper-nickel alloy layer at a side of a palladium metal layer away from a base substrate according to an implementation of Embodiment 2.
Figure 35:
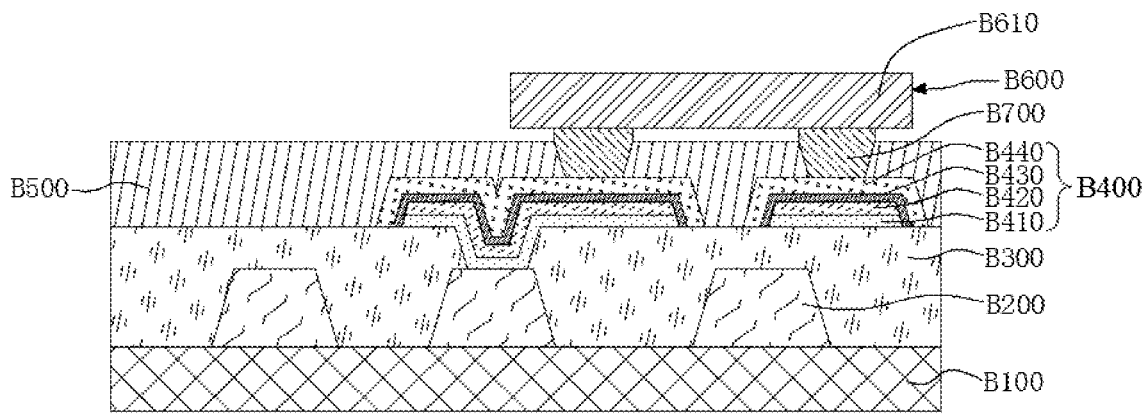
FIG. 35 is a structural view of an array substrate according to an implementation of Embodiment 2.
Figure 36:
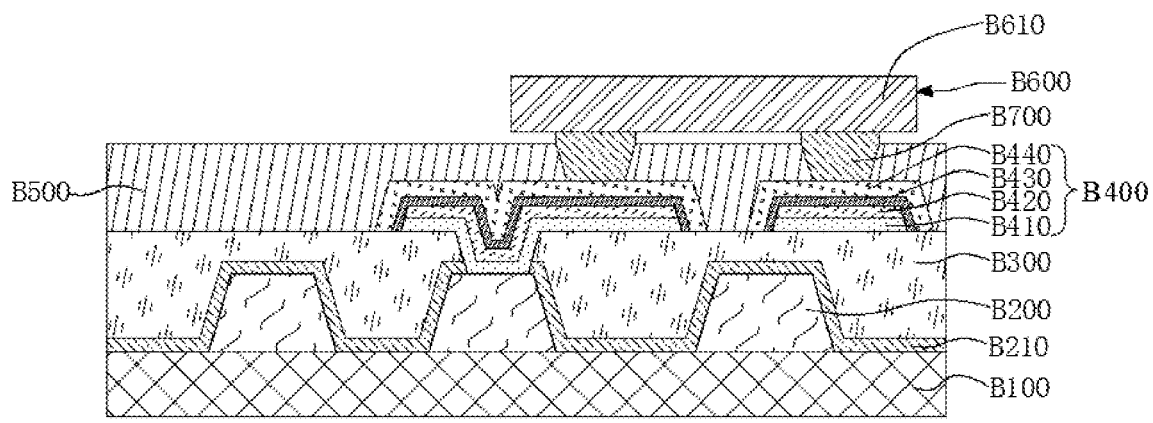
FIG. 36 is a structural view of an array substrate according to an implementation of Embodiment 2.

Based on the above findings, the present embodiment provides an array substrate and a manufacturing method thereof, as shown in FIG. 23. The method for manufacturing the array substrate includes:

step BS110, as shown in FIG. 24, providing a base substrate B100;

step BS120, as shown in FIG. 24, forming a metal wiring layer B200 at a side of the base substrate B100;

step BS130, as shown in FIG. 25 and FIG. 26, forming a first planarization layer B300 at a side of the metal wiring layer B200 away from the base substrate B100;

step BS140, as shown in FIG. 27 and FIG. 28, forming a copper electrode layer B420 (as a metal sub-layer) at a side of the first planarization layer B300 away from the base substrate B100, and the copper electrode layer B420 being electrically connected to the metal wiring layer B200;

step BS150, as shown in FIG. 29 and FIG. 30, forming a palladium metal layer B430 located on and covering a surface of the copper electrode layer B420 away from the base substrate B100 and a side face of the copper electrode layer B420;

step BS160, as shown in FIG. 31 and FIG. 32, forming a first copper-nickel alloy layer B440 (as a conductive sub-layer) by electroless plating, the first copper-nickel alloy layer B440 being located on and covering a surface of the palladium metal layer B430 away from the base substrate B100;

step BS170, as shown in FIG. 35 and FIG. 36, providing a functional device layer B600 at a side of the first copper-nickel alloy layer B440 away from the base substrate B100, and including a plurality of functional devices B610 electrically connected to the first copper-nickel alloy layer B440.

According to a method for manufacturing the array substrate provided by the present embodiment, the first copper-nickel alloy layer B440 may be formed by electroless plating, which may avoid the roof structure of the first copper-nickel alloy layer B440, and may improve the morphology of the first copper-nickel alloy layer B440, thereby improving quality of the array substrate.

As shown in FIG. 35 and FIG. 36, according to the method for manufacturing the array substrate provided by the present embodiment, the manufactured array substrate includes a metal wiring layer B200, a first planarization layer B300, an electrode layer B400 and a functional device layer B600 that are sequentially stacked at a side of the base substrate B100. The electrode layer B400 is electrically connected to the metal wiring layer B200, and includes a copper electrode layer B420, a palladium metal layer B430 and a first copper-nickel alloy layer B440 that are sequentially stacked; the palladium metal layer B430 is located on and covers a surface of the copper electrode layer B420 away from the base substrate B100 and a side face of the copper electrode layer B420; the first copper-nickel alloy layer B440 is located on and covers a surface of the palladium metal layer B430 away from the base substrate B100, the functional device layer B600 includes a plurality of functional devices B610 electrically connected to the electrode layer B400. The array substrate may be manufactured by the above method for manufacturing the array substrate, and thus the first copper-nickel alloy layer B440 cannot form the roof structure, which may avoid defect caused by the roof structure fracture and improve yield and quality of the array substrate.

Principles, details and effects of each step of the method for manufacturing the array substrate provided by the present embodiment will be further explained and illustrated in combination with the accompanying drawings below.

In the present embodiment, any one of film layers may include a side face, a surface close to the base substrate, and a surface away from the base substrate, and the surface close to the base substrate and the surface away from the base substrate are connected through the side face of the film layer. In the present embodiment, a thickness of any film layer is a size of the film layer in a direction perpendicular to the base substrate.

In step BS110, as shown in FIG. 24, a base substrate B100 may be provided. The base substrate B100 in the second embodiment may have the same structure, material and the like as the base substrate A100 in the first embodiment, which is not repeated herein.

Optionally, before forming the metal wiring layer B200, an insulating buffer layer, such as a silicon nitride layer, a silicon oxide layer or a silicon oxynitride layer, is formed at a side of the base substrate B100; and then, a metal wiring layer B200 is formed at a side of the insulating buffer layer away from the base substrate B100.

Preferably, material of the base substrate B100 is glass.

In step BS120, as shown in FIG. 24, a metal wiring layer B200 may be formed at a side of the base substrate B100. The metal wiring layer B200 may include a metal lead which may drive each functional device B610 through the electrode layer B400. The metal wiring layer B200 may be formed by deposition and patterning. The deposition methods include but are not limited to sputtering, electroplating and electroless plating. The patterning methods include but are not limited to photolithography, growing a patterned growth layer on the patterned seed layer, growing a patterned metal pattern within the limitation of the pattern limitation layer, and the like.

Optionally, the metal wiring layer B200 in Embodiment 2 may be formed by any method for forming the metal wiring layer A200 described in Embodiment 1, which is not described in detail in Embodiment 2.

In step BS130, as shown in FIG. 25 and FIG. 26, the first planarization layer B300 may be formed at the side of the metal wiring layer B200 away from the base substrate B100. Material of the first planarization layer B300 may be an organic material, such as a photosensitive resin.

Optionally, a thickness of the first planarization layer B300 is 3~7 microns. Preferably, the thickness of the first planarization layer B300 is 4.5~5.5 microns.

It may be understood that the first planarization layer B300 may be defined with a via hole such that the electrode layer B400 is electrically connected to the metal wiring layer B200.

Optionally, in some embodiments, the method for manufacturing the array substrate may further include: as shown in FIG. 26, before forming the first planarization layer B300, forming a passivation layer B210 on a surface of the metal wiring layer B200 away from the base substrate B100 to protect the metal wiring layer B200. The passivation layer B210 may be made of inorganic insulating materials such as silicon oxide, silicon nitride, silicon oxynitride and the like. Thus, in the manufactured array substrate, the passivation layer B210 is provided between the metal wiring layer B200 and the first planarization layer B300.

For example, material of the passivation layer B210 is silicon nitride, and a thickness of the passivation layer B210 is 900~1100 angstroms.

In step BS140, as shown in FIG. 27 and FIG. 28, the copper electrode layer B420 may be formed at the side of the first planarization layer B300 away from the base substrate B100, and the copper electrode layer B420 is electrically connected to the metal wiring layer B200.

Optionally, a copper electrode material layer (as a metal-sub-material layer) may be formed by sputtering, and then the copper electrode material layer may be patterned to form the copper electrode layer B420 (as a metal sub-layer). A thickness of the copper electrode layer B420 may be 2500~3500 angstroms. For example, the thickness of the copper electrode layer B420 is 3000 angstroms.

Optionally, step BS140 may further include: as shown in FIG. 27 and FIG. 28, when the copper electrode layer B420 is formed, a second buffer metal layer B410 located on a surface of the copper electrode layer B420 close to the base substrate B100 is also formed. Material of the second buffer metal layer B410 may be molybdenum, molybdenum-copper alloy, molybdenum-niobium alloy, molybdenum-copper-niobium alloy or other metals or metal alloys. For example, the material of the second buffer metal layer B410 is the molybdenum-niobium alloy with the thickness of 250~350 angstroms. For example, the thickness of the second buffer metal layer B410 is 300 angstroms. It may be understood that the second buffer metal layer B410 may improve bonding strength between the copper electrode layer and the first planarization layer B300, and achieve the protection of the copper electrode layer. Thus, the second buffer metal layer B410 may also be referred to as a metal adhesive layer, a metal protective layer, or the like.

Optionally, the second buffer metal layer B410 and the copper electrode layer B420 that are stacked may be formed by the following method: forming the second buffer metal material layer and the copper electrode material layer that are stacked at the side of the first planarization layer B300 away from the base substrate B100, and then patterning the second buffer metal material layer and the copper electrode material layer to form the second buffer metal layer B410 and the copper electrode layer B420. It may be understood that the second buffer metal material layer may improve the bonding strength between the copper electrode material layer and the first planarization layer B300, and achieve the protection of the copper electrode material layer. Thus, the second buffer metal material layer may also be referred to as a metal adhesive material layer, a metal protective material layer, or the like.

In step BS150, as shown in FIG. 29 and FIG. 30, the palladium metal layer B430 may be formed, and the palladium metal layer B430 is located on and covers the surface of the copper electrode layer B420 away from the base substrate B100 and the side face of the copper electrode layer B420.

Optionally, the copper electrode layer B420 may be treated with a palladium salt solution to form the palladium metal layer B430 at the surface of the copper electrode layer B420 away from the base substrate B100 and the side face of the copper electrode layer B420.

For example, the base substrate formed with the copper electrode layer B420 may be immersed in the palladium chloride solution, such that the following chemical reactions occur on the surface and the side face of the copper electrode layer B420 away from the base substrate B100:

$$Pd^{2+}+Cu=Pd\downarrow+Cu^{2+}$$

In this reaction, the replaced palladium is deposited on the surface and the side face of the copper electrode layer B420 away from the base substrate B100 to form the palladium metal layer B430, and the palladium metal layer B430 plays a role in activating the copper electrode layer B420 in subsequent electroless plating, while regions of the substrate where the copper electrode layer B420 is not formed have no palladium replaced, and thus, these regions are not provided with the palladium metal layer B430. Thus, the formed palladium metal layer B430 is located on and covers the surface of the copper electrode layer B420 away from the base substrate B100 and the side face of the copper electrode layer B420, and that is, the palladium metal layer B430 completely covers the surface of the copper electrode layer B420 away from the base substrate B100 and the side face of the copper electrode layer B420, and is not located outside the copper electrode layer B420. In other words, an orthographic projection of the palladium metal layer B430 on the base substrate B100 overlaps with an orthographic projection of the copper electrode layer B420 on the base substrate B100. It may be understood that the palladium metal layer B430 mainly plays an activation role, so the palladium metal layer B430 also is referred as a palladium activation layer, a palladium catalytic layer, and the like. A thickness of the palladium metal layer B430 may be relatively small, such as the thickness of several or dozens of atoms. Of course, the palladium metal layer B430 may also have a relatively thick thickness.

It may be understood that when there is a second buffer metal layer B410 containing copper between the copper electrode layer B420 and the first planarization layer B300, the palladium metal layer B430 may further be located on and cover a side face of the second buffer metal layer B410. That is, an orthographic projection of the palladium metal layer B430 on the base substrate B100 overlaps with a whole orthographic projection of the copper electrode layer B420 and the second buffer metal layer B410 on the base substrate B100. Of course, the palladium metal layer B430 may not cover the second buffer metal layer B410.

Optionally, the method of forming the palladium metal layer B430 may be the same as the method of forming the palladium activation layer.

In step BS160, as shown in FIG. 31 and FIG. 32, the first copper-nickel alloy layer B440 may be formed by electroless plating, and the first copper-nickel alloy layer B440 is located on and covers a surface of the palladium metal layer B430 away from the base substrate B100.

Optionally, the palladium metal layer B430 may be treated with an electroless plating solution containing copper salt, nickel salt, reducing agent, complexing agent, and pH regulator, and the first copper-nickel alloy layer B440 may be formed at the surface of the palladium metal layer B430 away from the base substrate B100. Near the palladium metal layer B430, copper ions and nickel ions react with the reducing agent to generate copper and nickel respectively, which are deposited on the surface of the palladium metal layer B430 to form the first copper-nickel alloy layer B440.

Further, the copper salt may be copper sulfate. The nickel salt may be nickel sulfate. The reducing agent may be sodium hypophosphite. The complexing agent may be selected from one of or a plurality of alanine, glycine, malic acid, succinic acid and citric acid. The pH regulator may be selected from sodium hydroxide or potassium hydroxide.

Furthermore, the electroless plating solution may further include a stabilizer, such as boric acid.

In an embodiment of the present embodiment, components of the electroless plating solution include: copper sulfate 0.06~0.10 mol/L, nickel sulfate 0.02~0.04 mol/L, sodium hypophosphite 0.55~0.85 mol/L, sodium citrate 0.08~0.12 mol/L, boric acid 0.4~0.6 mol/L, polyethylene glycol 80~120 mg/l. The electroless plating solution further includes a pH regulator.

For example, components of the electroless plating solution include: copper sulfate 0.08 mol/L, nickel sulfate 0.03 mol/L, sodium hypophosphite 0.7 mol/L, sodium citrate 0.1 mol/L, boric acid 0.5 mol/L, polyethylene glycol 100 mg/l.

When the palladium metal layer B430 is treated with the above electroless plating solution, the following reactions may occur:

(1) Copper deposition reaction:

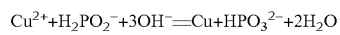

$$Cu^{2+}+H_2PO_2^-+3OH^-=Cu+HPO_3^{2-}+2H_2O$$

(2) Nickel deposition reaction:

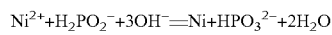

$$Ni^{2+}+H_2PO_2^-+3OH^-=Ni+HPO_3^{2-}+2H_2O$$

The above reactions proceed near the palladium metal layer B430 and promoted by palladium. The above reactions substantially do not occur in a region without the palladium metal layer B430. Thus, copper and nickel are deposited on the palladium metal layer B430 to form the first copper-nickel alloy layer B440.

Optionally, when the palladium metal layer B430 is treated, temperature of the electroless plating solution is 75~85° C., and treatment time is 20~40 minutes. The substrate formed with the palladium metal layer B430 may be immersed in the electroless plating solution for reaction. In this way, a thickness of the first copper-nickel alloy layer B440 is 500~2000 angstroms, so as to ensure that the first copper-nickel alloy layer B440 has excellent oxidation resistance and avoid various problems caused by the etching of the copper-nickel alloy with high thickness.

The thicker the first copper-nickel alloy layer B440 is, the better the protection effect of the copper electrode layer B420 is.

Figure 37:
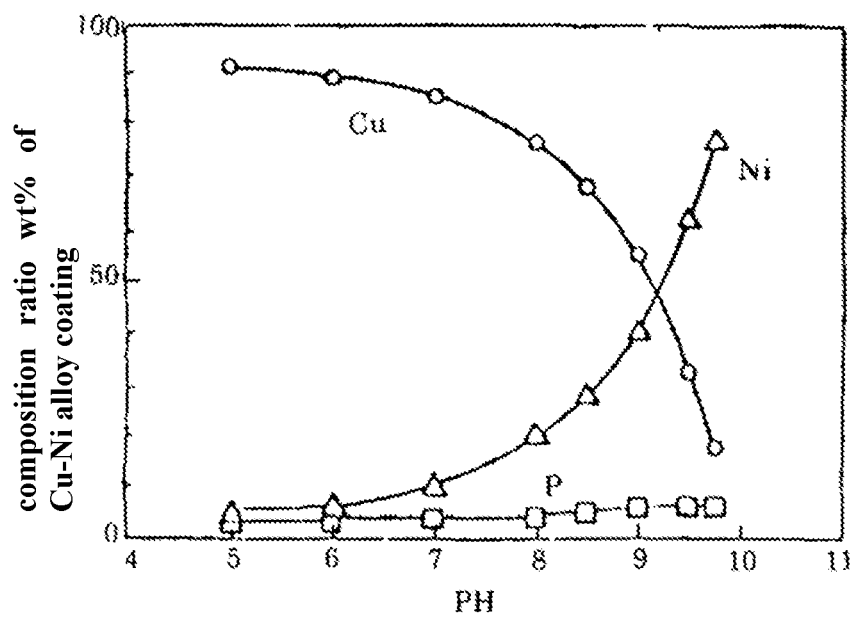
FIG. 37 shows a relationship diagram between a nickel fraction in a copper-nickel alloy and pH of a chemical plating solution.

Referring to FIG. 37, when a pH value of the electroless plating solution is different, a mass fraction of nickel in the first copper-nickel alloy layer B440 is different. The pH value of the electroless plating solution may be adjusted by the pH regulator, so as to further adjust the mass fraction of nickel in the first copper-nickel alloy layer B440. It may be understood that the electroless plating solution includes hypophosphite. During the electroless plating of copper and nickel, hypophosphite may be reduced to a small amount of phosphorus and deposited in the metal, such that the copper-nickel alloy contains a small amount of phosphorus.

Optionally, pH of the electroless plating solution is not less than 8. Thus, the mass fraction of nickel in the first copper-nickel alloy layer B440 is not less than 30%, which may ensure that the first copper-nickel alloy layer B440 has excellent oxidation resistance and avoid various problems caused by the etching of the copper-nickel alloy with high nickel fraction.

Optionally, pH of the electroless plating solution is not greater than 10. Thus, the mass fraction of nickel in the first copper-nickel alloy layer B440 is not more than 80%.

Preferably, pH of the electroless plating solution is 8-10. Thus, the mass fraction of nickel in the first copper-nickel alloy layer B440 is 30%~80%. The higher the nickel fraction in the first copper-nickel alloy layer B440, the better the anti-oxidation effect.

According to the method for forming the first copper-nickel alloy layer B440 provided by the present embodiment, the copper-nickel alloy may be formed at the side face of the copper electrode layer B420 and the surface away from the base substrate B100 by electroless plating, so as to achieve comprehensive protection of the copper electrode layer B420. The method only needs to proceed in a liquid holding tank of an existing electroplating device without additional investment in new devices, which may achieve the maximum utilization of the device and reduce the manufacturing cost. In addition, the first copper-nickel alloy layer B440 formed by electroless plating may improve the thickness and the nickel fraction of the first copper-nickel alloy layer B440 and achieve better protection effect. Moreover, since the first copper-nickel alloy layer B440 does not need to be formed by etching, the first copper-nickel alloy layer B440 cannot form the roof structure, which may improve the quality of the array substrate. The first copper-nickel alloy layer B440 may also improve an adhesive strength of the functional device B610 and avoid the functional device B610 from peeling off from the electrode layer B400.

Optionally, a method for manufacturing the first copper-nickel alloy layer B440 is the same as that of the second copper-nickel alloy layer.

Figure 33:
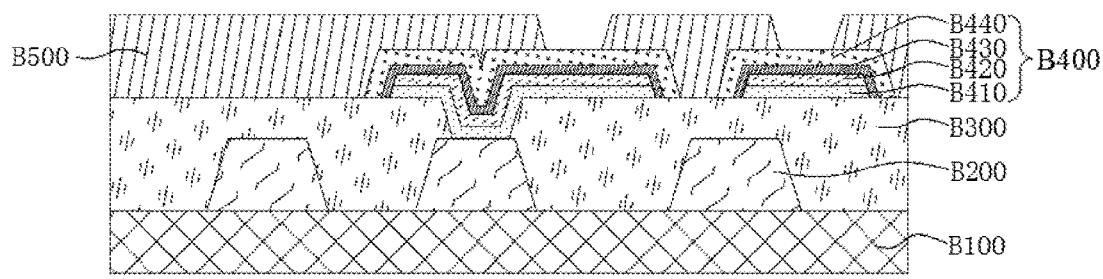
FIG. 33 is a structural view of forming a second planarization layer at a side of a first copper-nickel alloy layer away from a base substrate according to an implementation of Embodiment 2.
Figure 34:
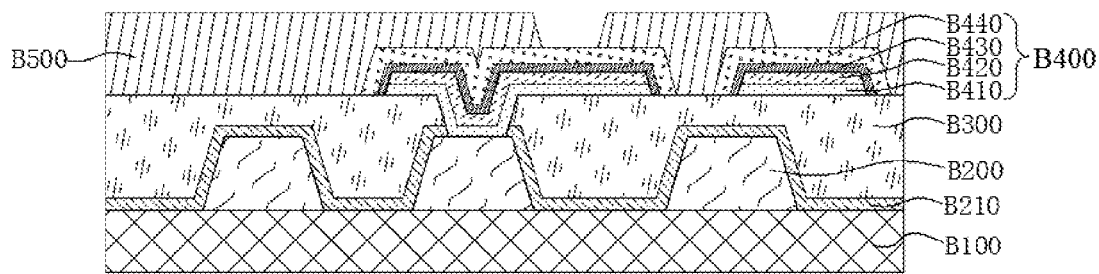
FIG. 34 is a structural view of forming a second planarization layer at a side of a first copper-nickel alloy layer away from a base substrate according to an implementation of Embodiment 2.

As shown in FIG. 33 and FIG. 34, before step BS170, the method for manufacturing the array substrate provided by the present embodiment may further include: forming a second planarization layer B500 at a side of the electrode layer B400 away from the base substrate B100, in which the second planarization layer B500 may be an organic material or an organic material doped with an inorganic material. The second planarization layer B500 may expose a part of the electrode layer B400 such that the exposed part serves as a bonding pad to be connected with the functional device B610. Of course, the electrode layer B400 may also be formed with other structures, such as a bonding pad for connecting with the driving chip or a circuit board, which is not limited in the present embodiment.

In an embodiment of the present embodiment, white oil may be coated by screen printing to form the second planarization layer B500. The white oil includes a light curable resin or a light curable monomer, and titanium dioxide particles dispersed in the resin. Optionally, the light curable monomer may include, but are not limited to, acrylate monomer.

In the present embodiment, since the first copper-nickel alloy layer B440 has a large thickness and high nickel fraction, it may effectively protect the copper electrode layer B420, and there is no need to set an additional passivation layer and an organic encapsulation layer to protect the copper electrode layer B420 at the side of the electrode layer B400 away from the base substrate B100, which may reduce two film layers and one-time patterning process, and reduce the manufacturing cost of the array substrate.

In step BS170, as shown in FIG. 35 and FIG. 36, the functional device layer B600 may be provided at a side of the second planarization layer B500 away from the base substrate B100. The functional device layer B600 may include functional devices B610 that are distributed in array, including, for example, a light-emitting device (also referred to as a light-emitting unit) for light emission, an ultrasonic transmitting device for emitting ultrasonic waves, a heating device for generating heat, or other functional device B610 driven by current.

Optionally, the functional device B610 may be a micro light-emitting diode (Micro-LED) or a mini light-emitting diode (Mini-LED), and the functional device B610 may be electrically connected to the electrode layer A400 through a massive amount of transfer and bonding process. Further, the functional device B610 may be electrically connected to the electrode layer B400 through a solder layer B700 including tin and indium. For example, the functional device B610 may be connected to the electrode layer B400 through printing tin soldering, crystal solidification, reflow soldering and other processes.

It should be noted that although the respective steps of the method in the present disclosure are described in a specific order in the drawings, this does not require or imply that the steps must be performed in the specific order, or all steps shown must be performed to achieve desired results. Additionally or alternatively, certain steps may be omitted, multiple steps may be combined into one step for execution, and/or one step may be split into multiple steps for execution, and the like, which shall be considered as a part of the present embodiment.

Referring to FIG. 35 and FIG. 36, the present embodiment further provides an array substrate, including a base substrate B100, a metal wiring layer B200, a first planarization layer B300, an electrode layer B400, and a functional device layer B600, the metal wiring layer B200 is provided at a side of the base substrate B100, the first planarization layer B300 is provided at a side of the metal wiring layer B200 away from the base substrate B100, the electrode layer B400 is provided at a side of the first planarization layer B300 away from the base substrate B100 and is electrically connected to the metal wiring layer B200, the electrode layer B400 includes a copper electrode layer B420, a palladium metal layer B430 and a first copper-nickel alloy layer B440 which are sequentially stacked, the palladium metal layer B430 is located on and covers a surface of the copper electrode layer B420 away from the base substrate B100 and a side face of the copper electrode layer B420, the first copper-nickel alloy layer B440 is located on and covers a surface of the palladium metal layer B430 away from the base substrate B100, and the functional device layer B600 is provided at a side of the electrode layer B400 away from the base substrate B100 and includes a plurality of functional devices B610 electrically connected to the electrode layer B400.

The array substrate provided by the present embodiment may be manufactured by the method for manufacturing the array substrate described in the above method for manufacturing the array substrate of the present embodiment, with the same or similar beneficial effects, which is not repeated in the present embodiment.

In an embodiment of the present embodiment, the electrode layer B400 further includes a second buffer metal layer B410 provided at a surface of the copper electrode layer B420 close to the base substrate B100.

In an embodiment of the present embodiment, a mass fraction of nickel in the first copper-nickel alloy layer B440 is not less than 30%.

In an embodiment of the present embodiment, a mass fraction of nickel in the first copper-nickel alloy layer B440 is not more than 80%.

In an embodiment of the present embodiment, a thickness of the first copper-nickel alloy layer B440 is 500~2000 angstroms.

In an embodiment of the present embodiment, the metal wiring layer B200 includes a seed metal layer, a copper growth layer, and a second copper-nickel alloy layer sequentially stacked at a side of the base substrate B100.

In an embodiment of the present embodiment, the metal wiring layer B200 includes a seed metal layer and a copper growth layer sequentially stacked at a side of the base substrate B100, and the array substrate further includes a passivation layer b210 provided between the metal wiring layer B200 and the first planarization layer B300.

Other details and effects of the array substrate provided by the present embodiment have been recorded in the above method for manufacturing the array substrate, or may be clearly derived from the above method for manufacturing the array substrate, which is not repeated in the present embodiment.

The embodiments of the present embodiment further provide a display panel, which includes any one of the array substrates described in the above array substrate embodiments, the functional device B610 of the array substrate is a micro light-emitting diode or a mini light-emitting diode. The display panel may be a mobile phone screen, a television screen, a smart watch screen, an electronic picture screen, an electronic billboard or other types of display panels. Since the display panel has any one of the array substrates described in the above embodiments, the display panel has the same beneficial effects, which is not repeated in the present embodiment.

Implementations of the present embodiments further provide a backlight module including any one of the array substrates described in the above embodiments, the functional device B610 of the array substrate is a micro light-emitting diode or a mini light-emitting diode. The backlight module may be a backlight module of a mobile phone screen, a backlight module of a television screen, a backlight module of a computer screen or a backlight module of other types of liquid crystal display panels. Since the backlight module has any one of the array substrates described in the above embodiments, it has the same beneficial effects, which is not repeated herein.

Embodiment 3

Mini-LED (submillimeter light-emitting diode) refers to a light-emitting diode with a size of 80~300 μm. When the mini light-emitting diode is used as a self-luminous display composed of pixels of a display panel, the Mini-LED may achieve a higher pixel density compared to a LED display with a small spacing. When the Mini-LED is used as a light source in a backlight module, an ultra-thin light source module may be made through a more dense arrangement of the light source. Combined with a regional dimming technology, the display screen including the Mini-LED backlight module may have better contrast and high dynamic lighting rendering display effect. A micro LED with a size less than 80 μm may be directly used as pixels of the display panel such as a near-to-eye terminal, a wearable terminal, a handheld terminal, and the like.

The array substrate described in the present embodiment may refer to a base substrate used as a light source or a base substrate used for display, which is not limited herein. Thus, in the present embodiment, the array substrate may also be referred to as a light-emitting substrate.

In the related art, in order to bond the Mini/Micro-LED to the array substrate,
  a solder paste is required to be arranged on a pad, on the array substrate, to be electrically connected to the Mini/Micro-LED, then the Mini/Micro-LED is transferred to a corresponding position on the array substrate, and after that, the Mini/Micro-LED and the array substrate are fixed by reflow soldering within a temperature range of 230° C.-260° C. Then, a circuit board is bonded to the pad, of the array substrate, to be electrically connected to the circuit board by hot pressing in a temperature range of 130° C.-150° C.

The inventor found that, since different process conditions are required to bond the Mini/Micro-LED and the circuit board to the array substrate, the bonding of the two cannot be achieved synchronously. Thus, when one of the two is bonded, metal at the pad on the array substrate corresponding to the other one is prone to oxidation, which, in turn, leads to the subsequent failure to ensure good electrical connection, thereby reducing the product yield.

The embodiment provides an array substrate configured to display or provide backlight, and including a circuit board bonding region and a light-emitting region.

Figure 39:
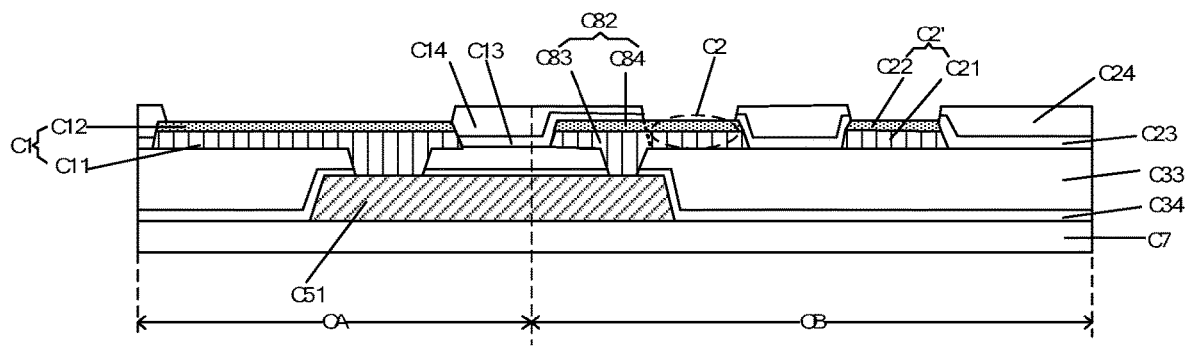
FIG. 39 is a schematic cross-sectional view along an A-A' direction in FIG. 38.
Figure 43:
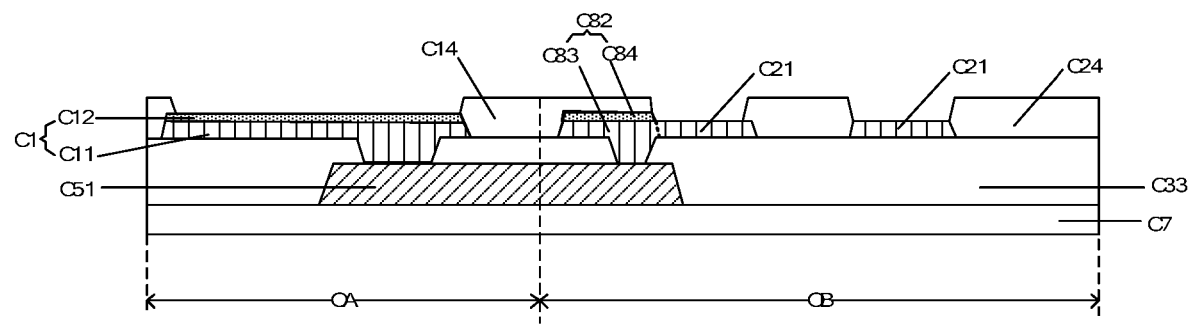

As shown in FIG. 39 and FIG. 43, the circuit board bonding region OA includes a plurality of pin pads C1 to be bonded and connected to the circuit board. Any one of the plurality of pin pads includes a first metal sub-layer C11 and a first conductive sub-layer C12 that are stacked. Material of the first metal sub-layer includes metal or metal alloy, and the first conductive sub-layer has oxidation resistance and covers the first metal sub-layer.

The light-emitting region OB includes a plurality of device pads configured to be bonded and connected to a plurality of light-emitting units. It may be understood that in other embodiments of the present disclosure, some device pads are used for electrical connection with the light-emitting units (e.g., light-emitting diodes), and some device pads are used for electrical connection with a microchip that drives or controls the light-emitting units.

Material of the first metal sub-layer includes metal, such as copper, aluminum, molybdenum, titanium, and the like. Considering a low resistivity and strong conductivity of copper, the copper is preferred to manufacture the first metal sub-layer (for example, as the copper electrode layer in Embodiment 1). In this way, material of the first conductive sub-layer may be metal oxide, such as indium zinc oxide (IZO) or indium tin oxide (ITO), or a metal alloy. If material of the first metal sub-layer includes a metal alloy, such as an alloy containing molybdenum. In this way, the material of the first conductive sub-layer may be a metal alloy. For example, the metal alloy is a copper containing alloy, such as a copper-nickel containing alloy (e.g., the first metal sub-layer to be as the first copper-nickel alloy layer in Embodiment 1). The first conductive sub-layer has oxidation resistance and conductivity, such that oxidation may be avoided in the process of manufacturing the array substrate. Thus, the first conductive sub-layer may protect the first metal sub-layer and avoid the first metal sub-layer from oxidation during the manufacturing of the array substrate.

In the present embodiment, the array substrate may be a display array substrate or a backlight array substrate. In the case of the array substrate being the display array substrate, the light-emitting region OB constitutes the display region to display the screen. In the case of the array substrate being the backlight array substrate, the light-emitting region OB is used to provide the light source.

Light-emitting color of the light-emitting region included in the array substrate is not limited herein, and the light-emitting region may be any one of a red light-emitting region, a green light-emitting region, or a blue light-emitting region. The array substrate may include the light-emitting region that includes all of the red light-emitting region, the green light-emitting region or the blue light-emitting region with the three light-emitting colors, or include the light-emitting region with only one light-emitting color, of course. For example, the array substrate may include only a plurality of red light-emitting regions, only a plurality of green light-emitting regions, or only a plurality of blue light-emitting regions, which may be determined according to actual requirements.

Control mode of the plurality of light-emitting regions is not limited. For example, each of the light-emitting regions may be controlled independently, or the plurality of the light-emitting regions may be controlled simultaneously.

Figure 40:
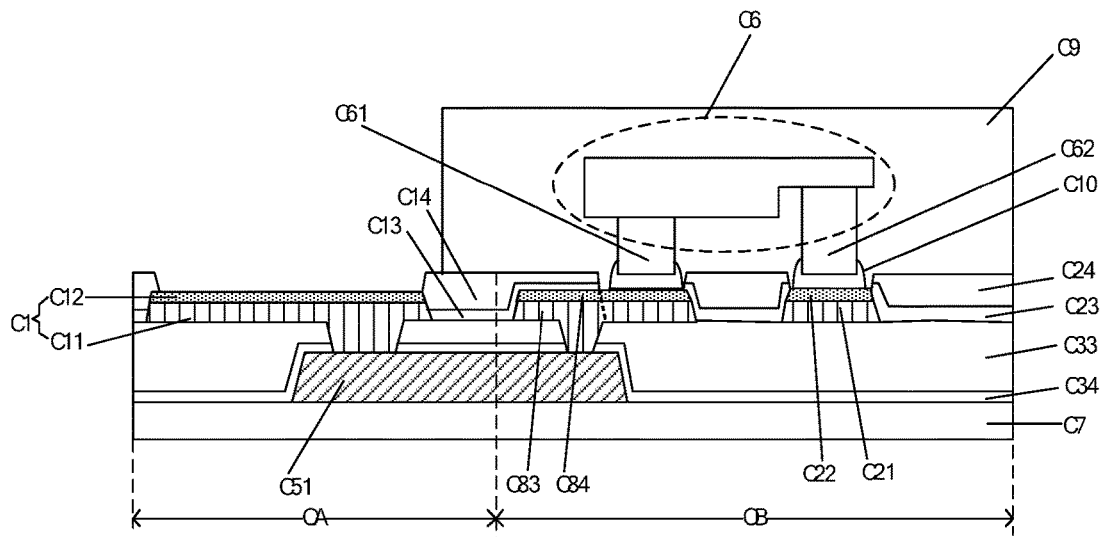
FIG. 40 is a structural view after forming a light-emitting diode and an encapsulation layer based on FIG. 39.
Figure 44:
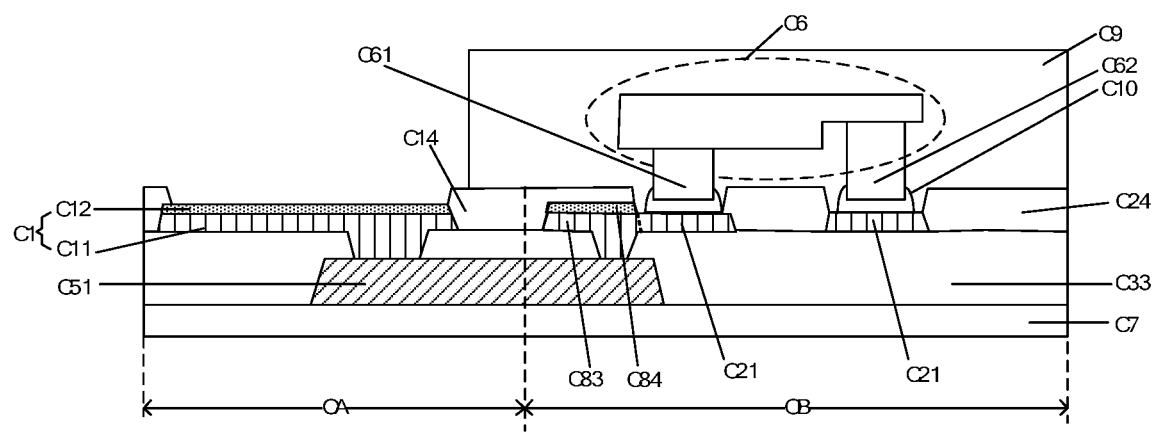

In the embodiment provided by the present disclosure, as shown in FIG. 40 and FIG. 44, the array substrate may further include a base substrate C7 and a plurality of light-emitting units (located at the functional device layer) formed at the base substrate C7, and the light-emitting units may include a light-emitting diode C6 as shown in FIG. 44 or FIG. 40. Material of the base may be a rigid material, such as glass; or a flexible material, such as polyimide. It may be understood that, in some embodiments, the array substrate may further include a microchip arranged on the same layer as the light-emitting unit, and the microchip is used to control the light-emitting unit. In this way, the light-emitting unit and microchip may serve as a functional device of the array substrate, and the functional device layer may include the light-emitting unit and the microchip.

It should be noted that since the light-emitting diode includes an anode and a cathode, one light-emitting diode needs to be bonded through two device pads. The aforementioned plurality of device pads may be grouped into a plurality of groups of device pads. Each group of device pads is used for bonding one light-emitting diode and includes a cathode pad and an anode pad arranged in pair. The device pad bonded to the cathode of the light-emitting diode is referred to as the cathode pad, and the device pad bonded to the anode of the light-emitting diode is referred to as the anode pad. In the appended drawings of the present embodiment, in order to clearly distinguish the cathode pad and the anode pad, different numerals are used for illustration. Specifically, referring to FIG. 38 and FIG. 39, the cathode pad is marked as C2' and the anode pad is marked as C2, but structures of the two film layers are the same. The device pad may be connected to the connection trace arranged on the same layer, such that the array substrate may load current or voltage to the functional device bonded on the device pad through the connection trace. It may be understood that in some embodiments, there may be a part of the connection traces that are not electrically connected to the device pad.

In an embodiment of the present embodiment, the array substrate includes a base substrate, a metal wiring layer, a first planarization layer, an electrode layer, a second planarization layer, and a functional device layer that are stacked. The metal wiring layer is provided with a metal lead, and the electrode layer is provided with the aforementioned device pad and the connection trace. The functional device layer is provided with the aforementioned light-emitting unit, which may further include a microchip in some cases. In a feasible way, the pin pad and the device pad are arranged on the same layer, both located within the electrode layer. In another feasible method, the pin pad and the device pad are provided on the metal wiring layer and the electrode layer, respectively.

The electrode layer and the metal wiring layer are connected by passing through a via hole of the first planarization layer. For example, the pin pad may be electrically connected to the metal lead through the connection trace, or the pin pad may be directly electrically connected to the metal lead. For another example, the connection trace may include a first connection trace and a second connection trace, and the first connection trace may connect two device pads such that the functional devices are electrically connected, and the second connection trace may connect the metal lead and the device pad such that the device pad is electrically connected to the metal lead. In some cases, the connection trace may further include a third connection trace, which connects different metal leads such that the metal leads on the metal wiring layer may be bridged through the electrode layer. The second planarization layer may be provided with a via hole exposing the device pad to facilitate the bonding between the functional device and the device pad. The second planarization layer may be further provided with a via hole exposing the pin pad to facilitate the bonding between the pin pad and a pin of the circuit board.

Figure 38:
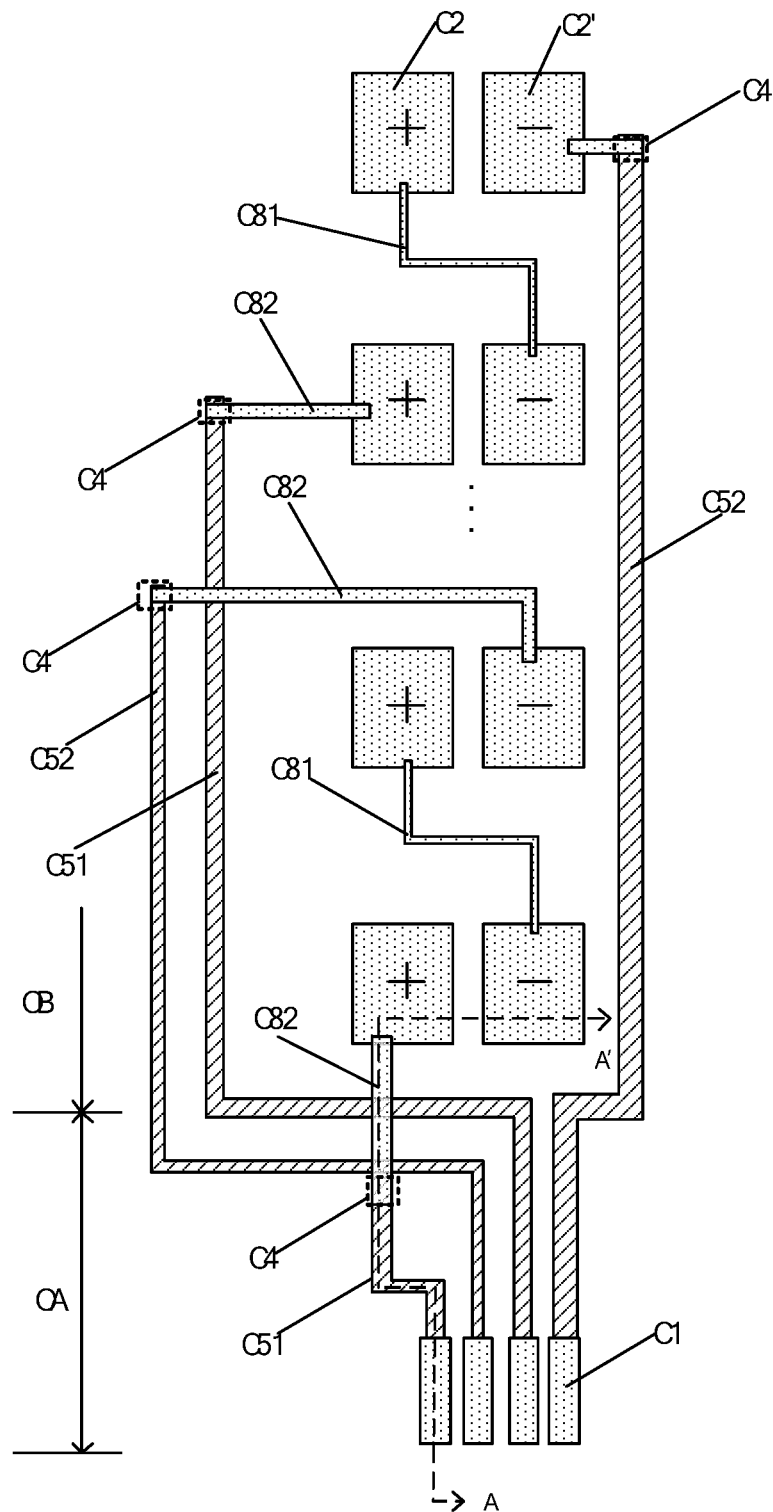
FIG. 38 is a partially structural view of an array substrate provided in Embodiment 3.

Distribution structure and connection mode of the plurality of pin pads and the plurality of device pads in the array substrate are not limited. For example, as shown in FIG. 38, region OA is the circuit board bonding region, and region OB is the light-emitting region. The plurality of device pads may be grouped into a plurality of groups of device pads. Each group of device pads is used for bonding one light-emitting diode and includes a cathode pad C2' and an anode pad C2 arranged in pair. Two adjacent groups of the device pads are connected in series through a trace C81 (belonging to the first connection trace). In the two groups of device pads connected in series, the anode pads of one group are connected to a trace C82 (belonging to the second connection trace) and electrically connected to an anode trace C51 (belonging to the metal lead) through a via hole C4, and the anode trace C51 is electrically connected to a pin pad C1 through a via hole (not shown in FIG. 38). The cathode pads of the other group are connected to another trace C82 and electrically connected to a cathode trace C52 (belonging to metal lead) through another via hole C4, and the cathode trace C52 is electrically connected to another pin pad C1 through a via hole (not shown in FIG. 38). In FIG. 38, cathode pad C2', anode pad C2, pin pad C1, trace C81 and trace C82 are arranged on the same layer, with the same filling pattern and located on the electrode layer. The anode trace C51 and the cathode trace C52 are arranged on the same layer, with the same filling pattern, and are located on the metal wiring layer.

FIG. 39 is a schematic cross-sectional view along an A-A' direction in FIG. 38, FIG. 43 is another schematic cross-sectional view along the A-A' direction in FIG. 38, and FIG. 40 is a structural view after forming a light-emitting diode C6 and an encapsulation layer C9 based on FIG. 39. FIG. 44 is a structural view after forming a light-emitting diode C6 and an encapsulation layer C9 based on FIG. 43.

It may be understood that the driving mode of the array substrate is not limited in the present embodiment. As shown in FIG. 38, the array substrate may drive the light-emitting unit in a passive way, or provide a signal to the light-emitting unit through a driving circuit including a thin-film transistor, or provide a signal to the light-emitting unit through a micro-chip (microchip).

The embodiment provides an array substrate. In the array substrate, since the pin pad in the circuit board bonding region includes the first metal sub-layer and the first conductive sub-layer, and the first conductive sub-layer has oxidation resistance and covers the first metal sub-layer, during the manufacturing of the array substrate, when the light-emitting unit is bonded to the device pad in the light-emitting region, the first conductive sub-layer in the circuit board bonding region is not oxidized, thereby ensuring bonding quality of the subsequent circuit board and improve the product yield.

Optionally, as shown in FIG. 39 and FIG. 43, the array substrate includes a base substrate C7, the first conductive sub-layer C12 is located at a side away from the base substrate C7 relative to the first metal sub-layer C11, and material of the first conductive sub-layer includes metal oxide or a metal alloy.

Optionally, the material of the first metal sub-layer includes copper, and the material of the first conductive sub-layer includes indium zinc oxide or indium tin oxide. Considering better conductivity and lower resistivity of indium zinc oxide, the first conductive sub-layer is usually made of the indium zinc oxide to avoid oxidation of the first metal sub-layer made of copper during the manufacturing of the array substrate.

Further optionally, as shown in FIG. 43, any one of the plurality of device pads includes a second metal sub-layer C21, the second metal sub-layer C21 and the first metal sub-layer C11 are arranged on the same layer to serve as the metal sub-layer of the electrode layer.

The same layer arrangement refers to the manufacturing by one-time composition process. The one-time composition process refers to that a required pattern is formed through one-time film forming and photolithography process, and includes processes of film forming, exposure, development, etching, peeling off and the like. The second metal sub-layer is arranged on the same layer as the first metal sub-layer, which may reduce the times of composition processes, simplify the manufacturing process and greatly reduce the production cost.

Figure 41:
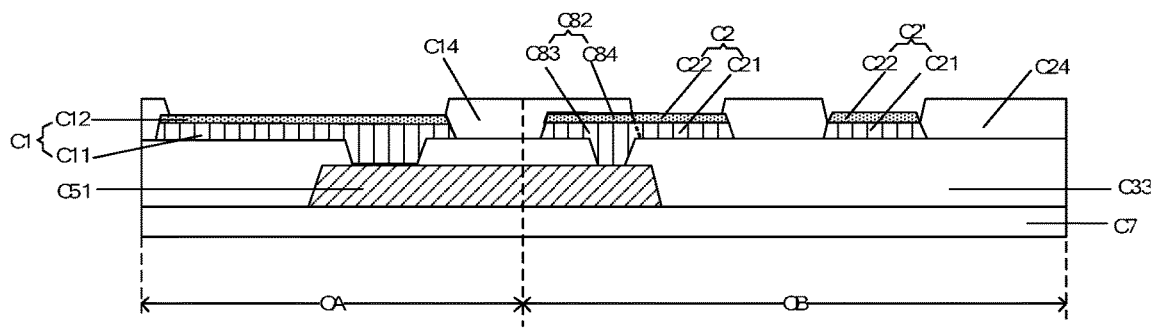
FIGS. 41-44 are schematic views of manufacturing process of an array substrate provided in Embodiment 3.

It should be noted that when manufacturing the display substrate shown in FIG. 43, the display substrate shown in FIG. 41 may be manufactured first. In FIG. 41, the device pad includes the second metal sub-layer C21 and the second conductive sub-layer C22, the second metal sub-layer is arranged on the same layer as the first metal sub-layer, and the second conductive sub-layer is arranged on the same layer as the first conductive sub-layer. In the embodiment provided by the present disclosure, material of the first metal sub-layer includes copper, and material of the first conductive sub-layer includes indium zinc oxide or indium tin oxide. The second metal sub-layer and the first metal sub-layer are arranged on the same layer, and the second conductive sub-layer and the first conductive sub-layer are arranged on the same layer (and are located within the conductive sub-layer together), material of the second metal sub-layer includes copper, and material of the second conductive sub-layer includes indium zinc oxide or indium tin oxide. If reflow soldering process is adopted to bond the light-emitting unit and the array substrate, the solder paste is required to be provided between the device pad of the light-emitting unit and the array substrate. Since the indium zinc oxide or indium tin oxide cannot achieve a good and fixable contact interface with the solder paste and the material of the second conductive sub-layer includes the indium zinc oxide or the indium tin oxide, the solder paste cannot be directly provided on the second conductive sub-layer, and the second conductive sub-layer in the device pad needs to be removed to expose the second metal sub-layer, so as to obtain the display substrate as shown in FIG. 43. The material of the second metal sub-layer includes copper bonding to the solder paste (die bond), such that the light-emitting unit is bonded to the second metal sub-layer by the reflow soldering. The circuit board is generally bonded to the first conductive sub-layer by hot pressing with a heat curing adhesive, without removing the part of the first conductive sub-layer used for bonding to the circuit board.

In addition, the materials of the first metal sub-layer and the second metal sub-layer include copper. In order to increase the adhesive force of copper and reduce the manufacturing difficulty, the pin pad may further include the first buffer sub-layer, and the first metal sub-layer is located above the first buffer sub-layer. The device pad may further include a second buffer sub-layer, and the second metal sub-layer is located above the second buffer sub-layer. The first buffer sub-layer and the second buffer sub-layer are arranged on the same layer, and the material may be an alloy containing molybdenum, such as molybdenum-titanium-nickel alloy. It may be understood that the first buffer sub-layer and the second buffer sub-layer may improve the adhesive force of the first metal sub-layer and the second metal sub-layer, so the first buffer sub-layer and the second buffer sub-layer may also be referred to as metal adhesive force layers. For example, the first buffer sub-layer and the second buffer sub-layer may be located within the second buffer metal layer described in Embodiment 1.

In the array substrate, since the pin pad in the circuit board bonding region includes the first metal sub-layer and the first conductive sub-layer and the first conductive sub-layer has oxidation resistance and covers the first metal sub-layer, during the manufacturing of the array substrate, when the light-emitting unit and the second metal sub-layer are bonded in the light-emitting region, the first metal sub-layer in the circuit board bonding region is not oxidized due to protection of the first conductive sub-layer, so as to ensure the bonding quality of the subsequent circuit board and improve the product yield.

Further optionally. As shown in FIGS. 39 to 46, the circuit board bonding region OA further includes a first connection portion (not shown, which may be a part of a solder layer in some embodiments to electrically connect the circuit board with the pin pad) and a first part C14 of the second planarization layer, a first connection portion is located at a side away from the base with respect to the first conductive sub-layer, and a first part of the second planarization layer covers regions between the plurality of pin pads and exposes surfaces of the pin pads and the device pads.

The light-emitting region OB further includes a second connection portion (such as C10 in FIG. 44, which may be a part of the solder layer in some embodiments to electrically connect the light-emitting unit with the device pad) and a second part C24 of the second planarization layer. The second connection portion is located at a side away from the base with respect to the second metal sub-layer, and the second part of the second planarization layer covers regions between the plurality of device pads.

The first part C14 of the second planarization layer and the second part C24 of the second planarization layer are arranged on the same layer to form a second planarization layer with an integrated structure.

The first part of the second planarization layer and the second part of the second planarization layer may protect a first trace layer and a second trace layer respectively, and also play a planarization role to facilitate subsequent processes, and material may be an organic material, such as resin. Thus, the second planarization layer may also be referred to as a protective layer, an organic protective layer, a resin layer, and the like. In an embodiment of the present disclosure, a part of the electrode layer covered by the first part of the second planarization layer may serve as the first trace layer, and a part of the electrode layer covered by the second part of the second planarization layer may serve as a second trace layer.

Optionally, material of the first connection portion may be a heat curing adhesive, and material of the second connection portion may be solder paste, copper paste, and the like.

Figure 57:
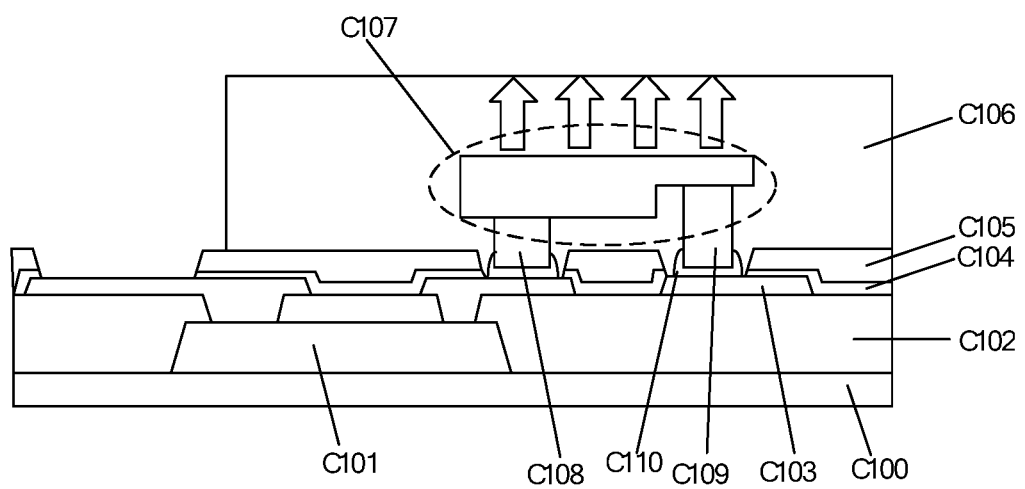

In the related art, as shown in FIG. 57, a silicon oxynitride (SiON) insulating layer 104 (which may also be an inorganic protective layer, passivation layer, and the like) is further provided between a second resin layer C105 (i.e., the second part of the second planarization layer) and the electrode layer C103 (a thick copper layer). However, in the array substrate provided by the present embodiment, since the second conductive sub-layer is provided above the first metal sub-layer, which plays a good role in protecting the second metal sub-layer, the silicon oxynitride insulating layer in the original manufacturing processes is removed from the array substrate, so as to omit the PECVD (Plasma Enhanced Chemical Vapor Deposition) process and silicon oxynitride etching process in the original processes, simplify the original processes and reduce manufacturing cost.

It should be noted that, as shown in FIG. 44, the array substrate may further include an encapsulation layer C9 covering the light-emitting unit C6 to protect and encapsulation. Material of the encapsulation layer may be silica gel.

In order to facilitate the driving, the array substrate may further include a metal lead located above the base and a connection trace arranged on the same layer as the device pad. As shown in FIG. 38, the metal lead includes an anode trace C51 and a cathode trace C52, and the connection trace includes a trace C81 and a trace C82. As shown in FIG. 43, the trace C82 includes a third metal sub-layer C83 and a third conductive sub-layer C84. The third metal sub-layer C83 and the second metal sub-layer C21 are connected and located within the metal sub-layer, which are separated by a dotted line in FIG. 43.

Referring to FIG. 43, the anode trace C51 may include only one layer of structure, or include a first molybdenum-titanium-nickel alloy sub-layer (equivalent to the first adhesive layer in Embodiment 1), a copper sub-layer and a second molybdenum-titanium-nickel alloy sub-layer (equivalent to the second adhesive layer in Embodiment 1) which are sequentially stacked. In order to reduce a voltage drop (IR drop), the copper sub-layer adopts thick copper (compared with a thickness of the copper of the first conductive sub-layer). A thickness of the copper is related to a product size of a backplane of the Mini-LED, and the larger the size, the greater the copper thickness required. The first molybdenum-titanium-nickel alloy sub-layer, the copper sub-layer and the second molybdenum-titanium-nickel alloy sub-layer may be sequentially manufactured by sputtering, and the second molybdenum-titanium-nickel alloy sub-layer may protect the copper sub-layer and avoid the copper sub-layer from surface oxidation.

Further, in order to protect and insulate the metal leads, as shown in FIG. 43, the array substrate may further include a first planarization layer C33 covering the metal lead, the pin pad C1 and the device pad 2 are located on the first planarization layer C33, and material of the first planarization layer may be an organic material, such as resin. As shown in FIG. 43, the first metal sub-layer C11 and the third metal sub-layer C83 are respectively electrically connected to the anode trace C51 by passing through a via hole (not shown in FIG. 43) of the first planarization layer C33.

In the embodiment provided by the present disclosure, the material of the first metal sub-layer includes copper or an alloy containing molybdenum, and the material of the first conductive sub-layer includes an alloy containing copper and nickel.

If the material of the first metal sub-layer includes copper, in order to increase the adhesive force of copper and reduce the manufacturing difficulty, the pin pad may further include the first buffer sub-layer located above the first buffer sub-layer. The pin pad includes a three-layer structure of the first buffer sub-layer (also referred to as a buffer metal layer), the first metal sub-layer (a copper layer, also referred to as a copper electrode layer) and the first conductive sub-layer (an alloy layer containing copper and nickel, also referred to as a copper-nickel alloy layer). Material of the first buffer sub-layer may be an alloy containing molybdenum with a thickness of 300 angstroms, a thickness range of the first metal sub-layer may be 6000~20000 angstroms, and a thickness range of the first conductive sub-layer may be 200~500 angstroms.

If the material of the first metal sub-layer includes an alloy containing molybdenum, as shown in FIG. 39, the pin pad C1 includes a two-layer structure of the first metal sub-layer (an alloy layer containing molybdenum) C11 and the first conductive sub-layer (an alloy layer containing copper and nickel) C12. A thickness of the first metal sub-layer may be 300 angstroms, and a thickness range of the first conductive sub-layer may be 6000~20000 angstroms.

Whether the pin pad adopts the two-layer structure or the three-layer structure needs to be determined according to resistance requirement.

The material of the first conductive sub-layer includes the alloy containing copper and nickel, and a ratio of a target material of the copper-nickel alloy may be selected according to the resistance requirements and etching condition. Theoretically, the higher the nickel fraction, the stronger the oxidation resistance. However, nickel is magnetic, and excessive nickel fraction increases difficulty for making the target material, and increases the difficulty of subsequent patterning, thereby the ratio of nickel cannot be too high. After a lot of research, the applicant found that the ratio range may be selected between Cu:Ni=70:30~95:5. Within the ratio range, it may ensure that a surface of the copper-nickel alloy is not oxidized at a temperature of 300° C. At present, the copper-nickel alloy with Cu:Ni=80:20 may withstand high temperature for half an hour without being oxidized in 230° C. Table 1 shows differences of resistances under different ratios.

TABLE 1

| Material | film thickness/A | sheet resistance (Ω/□) |
| --- | --- | --- |
| Cu | 880 | 0.35 |
| CuNi (70:30) | 800 | 5.3 |
| CuNi (90:10) | 3800 | 0.4 |
| CuNi (95:5) | 3300 | 0.38 |

Optionally, as shown in FIG. 39, any one of the plurality of device pads includes a second metal sub-layer C21 and a second conductive sub-layer C22 that are stacked, and the second conductive sub-layer C22 is located at a side away from the base substrate C7 relative to the second metal sub-layer C21. The second metal sub-layer and the first metal sub-layer are arranged on the same layer, and the second conductive sub-layer and the first conductive sub-layer are arranged on the same layer.

The same layer arrangement refers to the manufacturing by one-time composition process. The one-time composition process refers to that a required pattern is formed through one-time film forming and photolithography process, and includes processes of film forming, exposure, development, etching, peeling and the like. The second metal sub-layer is arranged on the same layer as the first metal sub-layer, and the second conductive sub-layer is arranged on the same layer as the first conductive sub-layer, which may reduce the times of composition processes, simplify the manufacturing process and greatly reduce the production cost.

The second metal sub-layer is arranged on the same layer as the first metal sub-layer. If the material of the first metal sub-layer includes copper, the material of the second metal sub-layer also includes copper, in order to increase the adhesive force of copper and reduce the manufacturing difficulty, the device pad may further include a second buffer sub-layer (also referred to as a buffer metal layer), and the second metal sub-layer is located over the second buffer sub-layer. The second buffer sub-layer is arranged on the same layer as the first buffer sub-layer. The device pad includes a three-layer structure of the second buffer sub-layer, the second metal sub-layer (a copper layer, also referred to as a copper electrode layer) and the second conductive sub-layer (an alloy layer containing copper and nickel, also referred to as a copper-nickel alloy layer). If the material of the first metal sub-layer includes an alloy containing molybdenum, the material of the second metal sub-layer also includes an alloy containing molybdenum, and the device pad includes a two-layer structure of the second metal sub-layer (an alloy layer containing molybdenum) and the second conductive sub-layer (an alloy layer containing copper and nickel). The thickness range of each sub-layer may refer to the thickness range of each sub-layer included in the above pin pad, which is not repeated here.

The second conductive sub-layer and the first conductive sub-layer are arranged on the same layer. If the material of the first conductive sub-layer includes an alloy containing copper and nickel, the material of the second conductive sub-layer also includes an alloy containing copper and nickel. The ratio range of copper and nickel in the alloy containing copper and nickel may refer to the relevant description of the first conductive sub-layer, which is not repeated here.

In the array substrate, the pin pad in the circuit board bonding region includes a first metal sub-layer and a first conductive sub-layer, and the first conductive sub-layer has oxidation resistance and covers the first metal sub-layer, during the manufacturing of the array substrate, when the light-emitting unit and the second conductive sub-layer are bonded in the light-emitting region, if the material of the first metal sub-layer includes copper, the first conductive sub-layer protects the first metal sub-layer, so as to avoid the first metal sub-layer from oxidation, and if the material of the first metal sub-layer includes an alloy containing molybdenum, and the material of the first conductive sub-layer includes an alloy containing copper and nickel, the first conductive sub-layer has oxidation resistance and is not oxidized. In conclusion, in both cases, oxidation of a metal lead layer in the circuit board bonding region may be avoided when the light-emitting unit and the second conductive sub-layer are bonded in the light-emitting region, so as to ensure the bonding quality of subsequent circuit board and improve the product yield.

Further optionally, as shown in FIG. 39, the circuit board bonding region OA further includes a first connection portion (not shown in FIG. 41), a first protective layer C13 (for example, the first part of the inorganic protective layer using silicon nitride as the material) and a first part C14 of the second planarization layer that are stacked. The first connection portion is located at a side of the first conductive sub-layer away from the base substrate, and the first planarization layer is located at a side of the first protective layer away from the base substrate and covers regions between the plurality of pin pads.

As shown in FIG. 39, the light-emitting region OB further includes a second connection portion (marked as C10 in FIG. 40), a second protective layer 23 (for example, the second part of the inorganic protective layer using silicon nitride as the material) and a second part C24 of the second planarization layer that are stacked. The second connection portion is located at a side of the second conductive sub-layer away from the base, and the second protective layer covers regions between the plurality of device pads, and the second planarization layer is located at a side of the second protective layer away from the base.

The first protective layer and the second protective layer are arranged on the same layer to form a protective layer with an integrated structure, such as an inorganic protective layer using silicon nitride as a material. The first part of the second planarization layer and the second part of the second planarization layer are arranged on the same layer to form a second planarization layer with an integrated structure.

In an embodiment of the present embodiment, the first protective layer and the second protective layer are arranged on the same layer, and the materials may be silicon oxynitride, silicon nitride, and the like. The first part of the second planarization layer and the second part of the second planarization layer are arranged on the same layer, and the materials may be an organic material, such as a resin, for planarization to facilitate subsequent processes.

In an embodiment of the present embodiment, material of the first connection portion may be a heat curing adhesive, and material of the second connection portion may be solder paste, copper paste, and the like.

The array substrate may further include a metal lead located above the base and a connection trace arranged on the same layer as the device pad. As shown in FIG. 38, the metal lead includes an anode trace C51 and a cathode trace C52, and the connection trace includes a trace C81 and a trace C82. As shown in FIG. 39, the trace C82 includes a third metal sub-layer C83 and a third conductive sub-layer C84. The third metal sub-layer C83 and the second metal sub-layer C21 are connected and located within the metal sub-layer, which are separated by a dotted line in FIG. 43.

Referring to FIG. 39, in the metal lead, the anode trace C51 may include only one layer of structure, or include a first molybdenum sub-layer and a copper sub-layer which are sequentially stacked. Further, in order to avoid oxidation of the copper sub-layer, as shown in FIG. 39, the array substrate may further include a passivation layer C34 covering the anode trace C51, and material of the passivation layer C34 may be silicon oxynitride, silicon nitride, and the like. Further, in order for planarization to facilitate subsequent processes, as shown in FIG. 39, the array substrate may further include a first planarization layer C33 located over the passivation layer C34, and the pin pad and the device pad are located over the first planarization layer C33, the first metal sub-layer C11 and the third metal sub-layer C83 are respectively electrically connected to the anode trace C51 by passing through via holes of the passivation layer C34 and the first planarization layer C33. Material of the first planarization layer may be an organic material, such as a resin. It should be noted that the anode trace may further include a second molybdenum alloy sub-layer located above the copper sub-layer which is protected by the second molybdenum alloy sub-layer, and thus the passivation layer is not required. FIG. 39 illustrates that the array substrate includes a passivation layer and a first planarization layer as an example. In addition, in order to improve the adhesive force of the metal wiring layer and reduce the stress, the array substrate may further include an insulating buffer layer between the base substrate and the metal lead, and material of the insulating buffer layer may be polyimide and the like. Of course, in other embodiments of the present embodiment, the material of the insulating buffer layer may also be inorganic insulating materials such as silicon oxide.

Figure 50:
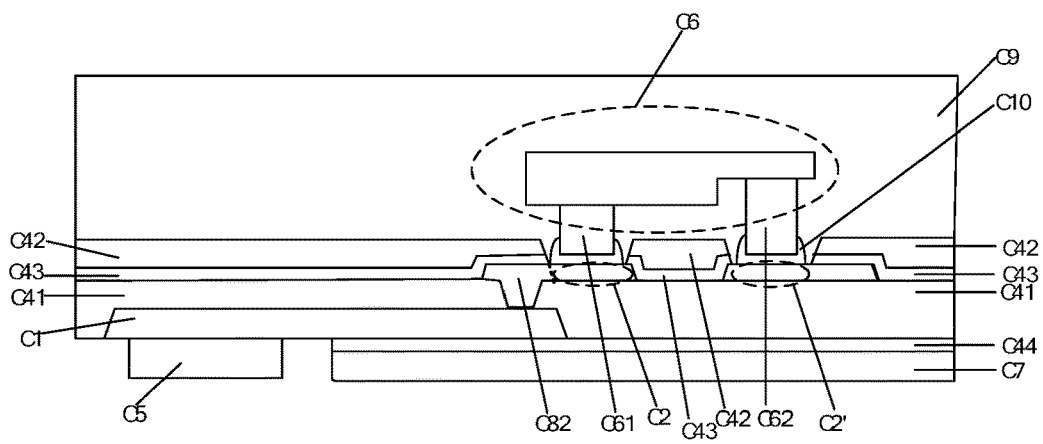

In another embodiment of the present embodiment, as shown in FIG. 50, the array substrate further includes a base substrate C7, a plurality of pin pads C1 exposed to a surface of the base substrate C7 for bonding the circuit board C5, a plurality of device pads (the anode pads C2 and cathode pads CT) exposed away from the surface of the base substrate C7 for bonding the light-emitting unit C6. Further, referring to FIG. 50, the pin pad C1 may be located within the metal wiring layer instead of the electrode layer.

Figure 49:
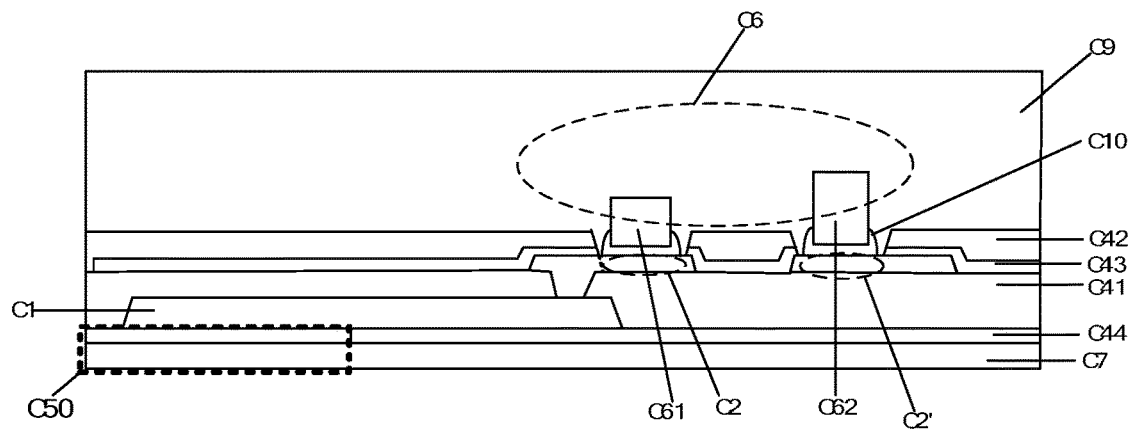

As shown in FIG. 50, the array substrate may further include a peeling layer C44 located between the base substrate C7 and the pin pad C1. In the base substrate C7 and the peeling layer C44, at least a region (marked as C50 in FIG. 49) corresponding to a part of the pin pad C1 used to bond the circuit board C5 is removed. Material of the peeling layer may be a mechanically peelable material. Material of the base substrate may be a rigid base, such as glass, or a flexible base, such as polyimide.

It should be noted that FIGS. 47 to 50 only schematically illustrate structure of the pin pad and the device pad, and do not reflect a multi-layer structure included in the pin pad.

In the array substrate, the pin pad includes the first metal sub-layer and the first conductive sub-layer. When bonding the light-emitting unit and the second metal sub-layer, the pin pad of the circuit board bonding region is not oxidized, so as to ensure the bonding quality of the subsequent circuit board and the first conductive sub-layer, and further improve the product yield. In addition, in the array substrate, the circuit board is bonded to a side of the first metal sub-layer close to the peeling layer, thereby reducing a non-luminous area of a light-emitting side, and further achieving a narrower frame.

Further, as shown in FIG. 50, the array substrate further includes a first planarization layer C41, an inorganic protective layer C43 and a second planarization layer C42 (also referred to as an organic layer, a resin layer, and the like), and the inorganic protective layer C43 and the second planarization layer C42 are stacked. The first planarization layer C41 covers the pin pad C1, and the second planarization layer is located at a side of the inorganic protective layer away from the base substrate and covers regions between the plurality of device pads. As shown in FIG. 50, the array substrate may further include a trace C82 arranged on the same layer as the device pad, and the trace C82 is electrically connected to the pin pad C1 by passing through a via hole (not shown in FIG. 50) of the first planarization layer C41. The trace C82 and an anode pad C2 are connected, and separated by a dotted line in FIG. 50. In the array substrate, the anode pad C2 and the cathode pad CT are electrically connected to an anode and a cathode of the light-emitting diode C6 respectively through the second connection portion C10, and the circuit board C5 is electrically connected to the pin pad C1 through the first connection portion (not shown in FIG. 50). In the array substrate, the pin pad is located below the first planarization layer C41, and the device pad is located above the first planarization layer C41.

In the pin pad, the material of the first metal sub-layer may be copper or an alloy containing molybdenum, and the material of the first conductive sub-layer may be metal oxide (e.g., indium zinc oxide, indium tin oxide) or a metal alloy (e.g., an alloy containing copper and nickel). If the material of the first metal sub-layer includes copper, the pin pad may further include alloy sub-layer containing molybdenum provided below the first metal sub-layer to facilitate the production of the first metal sub-layer. It should be noted that when the array substrate further includes the first planarization layer, the inorganic protective layer and the second planarization layer, since the circuit board is bonded to the side of the first metal sub-layer close to the peeling layer, it is not necessary to define a via hole at the region of the first planarization layer, the inorganic protective layer and the second planarization layer corresponding to the first metal sub-layer to expose the pin pad. When bonding the light-emitting unit and the second metal sub-layer, the first planarization layer, the inorganic protective layer and the second planarization layer may protect the pin pad from oxidation, and the pin pad may only include the first metal sub-layer (such as a copper sub-layer) or the first conductive sub-layer (such as a copper-nickel sub-layer). Material of the first planarization layer may be polyimide, and material of the second planarization layer may be resin.

The device pad may include only one metal sub-layer, which may be a copper sub-layer or an alloy sub-layer containing copper (e.g., an alloy sub-layer containing copper and nickel), Of course, the device pad may further include multiple sub-layers. In consideration of making full use of original processes and reducing the production cost, the former is selected.

It should be noted that, as shown in FIG. 50, the array substrate may further include an encapsulation layer C9 covering the light-emitting unit for protection and encapsulation. Material of the encapsulation layer may be silica gel.

Optionally, as shown in FIG. 38, a plurality of device pads are grouped into a plurality of groups of device pads, and each group of device pads includes a cathode pad CT and an anode pad C2 arranged in pair.

The array substrate further includes a base substrate, a metal lead, a connection trace arranged on the same layer with a plurality of device pads, and a first planarization layer, wherein the metal lead is provided close to the base substrate with respect to the connection trace, and the first planarization layer is provided close to the base substrate with respect to the connection trace, and covers the metal lead.

The metal lead is electrically connected to at least one of the plurality of pin pads for transmitting an electrical signal provided by the circuit board.

The connection trace is used to achieve series connection or parallel connection of the plurality of groups of device pads, and is also used to be electrically connected with the metal lead by passing through a via hole of the first planarization layer.

Specific connection mode of the above plurality of groups of device pads is not limited. As shown FIG. 38, region OA is the circuit board bonding region, and region OB is the light-emitting region. The plurality of device pads may be grouped into a plurality of groups of device pads. Each group of device pads is used for bonding one light-emitting diode and includes a cathode pad CT and an anode pad C2 arranged in pair. The metal lead may include an anode trace C51 and a cathode trace C52, and the connection trace includes a trace C81 and a trace C82. Two adjacent groups of the device pads are connected in series through a trace C81. In the two groups of device pads connected in series, the anode pads of one group are connected to a trace C82, and the trace 82 is electrically connected to the anode trace C51 by passing through a via hole C4 of the first planarization layer, and the anode trace C51 is electrically connected to one pin pad C1 by passing through a via hole (not shown in FIG. 38) of the first planarization layer. The cathode pads of the other group are connected to another trace C82, the trace C82 is electrically connected to the cathode trace C52 by passing through another via hole C4 of the first planarization layer, and the cathode trace C52 is electrically connected to another pin pad C1 by passing through a via hole (not shown in FIG. 38) of the first planarization layer. In FIG. 38, cathode pad CT, anode pad C2, pin pad C1, trace C81 and trace C82 are arranged on the same layer, with the same filling pattern and located on the electrode layer. In FIG. 38, the anode trace C51 and the cathode trace C52 are arranged on the same layer with the same filling pattern, and the anode trace C51 and the cathode trace C52 are arranged on the same layer with the same filling pattern.

Of course, the array substrate may also include a passivation layer, which is located between the first planarization layer and the metal lead and covers the metal lead. The connection trace needs to be electrically connected to the metal lead by passing through via holes of the passivation layer and the first planarization layer.

The embodiment further provides a backlight module, including the array substrate disclosed in the above embodiments.

According to the related art, the backlight module may further include a diffuser, a driving circuit and other structures, which may be determined according to actual requirements, and is not repeated here.

The backlight module may be used in any display device or component that needs to provide backlight. The backlight module may be either a rigid backlight module or a flexible backlight module (that is, it may be bendable and foldable), which is not limited here.

Compared with a traditional backlight module, when the Mini-LED is used as a light source in the backlight module, an ultra-thin light source module may be made through a more dense arrangement of the light source. Combined with a regional dimming technology, the display screen including the Mini-LED backlight module may have better contrast and high dynamic lighting rendering display effect. A liquid crystal display with the Mini-LED backlight is far superior to the current liquid crystal display in terms of brightness, contrast, color restoration and power consumption, and may even compete with an active matrix organic light-emitting diode display in terms of contrast and power consumption. Moreover, the liquid crystal display with the Mini-LED backlight may control the production cost by using the existing liquid crystal display production line.

The structure of the array substrate involved in the present embodiment may refer to the relevant description of the array substrate in the above embodiments, which is not repeated here.

The embodiment further provides a display device, including the array substrate, the circuit board and the plurality of light-emitting units disclosed in the above embodiments. The circuit board is electrically connected to a plurality of pin pads of the array substrate, and the plurality of light-emitting units are electrically connected to a plurality of device pads of the array substrate.

The display device has advantages of high contrast, good brightness and high color fidelity. The display device may be a rigid display device or a flexible display device (i.e., bendable and foldable). The display device may be any product or component with display function, such as TV, digital camera, mobile phone, tablet computer, and the like. It is understood that in some embodiments, the light-emitting unit may be used as a part of the array substrate.

The structure of the array substrate involved in the present embodiment may refer to the relevant description of the array substrate in the above embodiments, which is not repeated here.

The present embodiment further provides a method for manufacturing a display device, including:

S1: forming the array substrate as disclosed in the above embodiments;

S2: bonding a plurality of device pads and a plurality of light-emitting units and the array substrate.

Specifically, if the light-emitting unit includes a light-emitting diode, the plurality of device pads are grouped into a plurality groups of device pads, and each group of device pads includes a cathode pad and an anode pad arranged in pair, and an anode and a cathode of the light-emitting diodes are electrically connected to the anode pad and cathode pad, respectively. In this step, the bonding is performed by reflow soldering. Of course, in some embodiments, a functional device, such as light-emitting unit and the like, may also be used as a part of the array substrate, i.e., step S1 and step S2 are performed to form the array substrate required by the present disclosure.

S3: bonding the pin pads for bonding circuit board and array substrate.

In this step, the bonding may be performed by hot pressing.

The present embodiment provides the method for manufacturing the display device. In the array substrate formed in step S1, the pin pad of the circuit board bonding region includes a first metal sub-layer and a first conductive sub-layer, and the first conductive sub-layer has oxidation resistance and covers the first metal sub-layer. When executing step S2, the first conductive sub-layer in the circuit board bonding region is not oxidized, so as to ensure bonding quality of the circuit board in the subsequent step S3 and improve the product yield.

Figure 46:
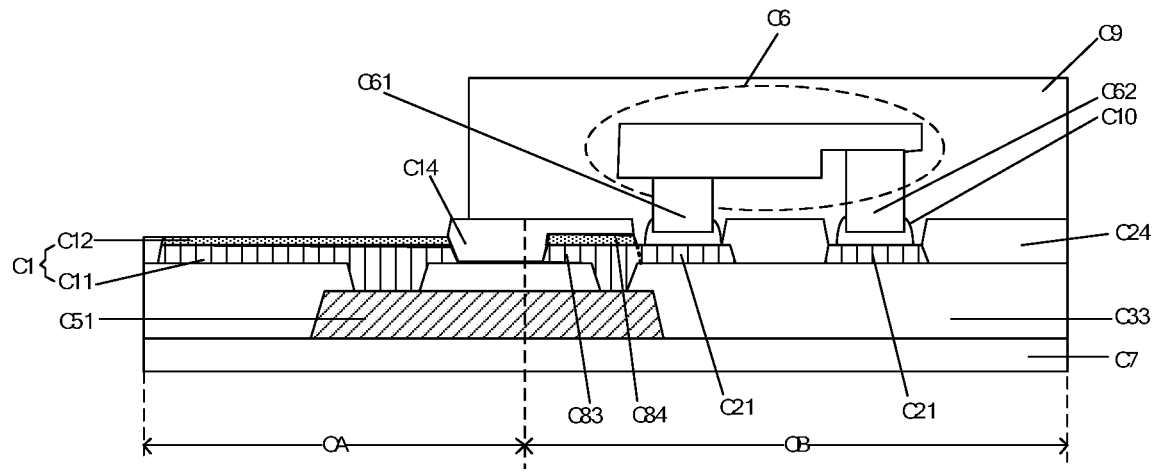

The present embodiment further provides a method for manufacturing a display device, and structure of the array substrate included in the display device may be shown in FIG. 43 or FIG. 46. The method includes:

S11: sequentially forming and patterning a metal film and a conductive film to obtain the first metal sub-layer C11, the second metal sub-layer C21, the first conductive sub-layer C12 located above the first metal sub-layer C11 and the second conductive sub-layer C22 located above the second metal sub-layer C21 as shown in FIG. 41.

Here, the metal sub-layer film (such as the copper electrode material layer in Embodiment 1) and the conductive sub-layer film may be deposited in one step by sputtering, and a copper-etching solution may be used to etch and pattern in one step to form the first metal sub-layer (equivalent to a part of the copper electrode layer in Embodiment 1), the first conductive sub-layer, the second metal sub-layer (equivalent to a part of the copper electrode layer in Embodiment 1) and the second conductive sub-layer. In S11, one mask is required to form a desired pattern.

It should be noted that the pin pad and the device pad formed through S11 include two-layer structures respectively. Materials of the first metal sub-layer and the second metal sub-layer include copper. In order to increase the adhesive force of copper and reduce the manufacturing difficulty, the pin pad may further include the first buffer sub-layer (equivalent to a part of the second buffer metal layer in Embodiment 1), and the first metal sub-layer is located above the first buffer sub-layer. The device pad may further include a second buffer sub-layer (equivalent to a part of the second buffer metal layer in Embodiment 1), and the second metal sub-layer is located above the second buffer sub-layer. The first buffer sub-layer and the second buffer sub-layer are arranged on the same layer, and the materials may be an alloy containing molybdenum, such as molybdenum-titanium-nickel alloy. If the pin pad and the device pad further include the first buffer sub-layer and the second buffer sub-layer respectively, a buffer sub-layer film, the metal sub-layer film and the conductive sub-layer film may be deposited in one step by the sputtering, and the copper-etching solution may be used to etch and pattern in one step to form the first buffer sub-layer, the second buffer sub-layer, the first metal sub-layer, the second metal sub-layer, the first conductive sub-layer and the second conductive sub-layer.

S12: removing a part of the second conductive sub-layer used for bonding the light-emitting unit (that is, removing the second conductive sub-layer where the device pad is located) to obtain the array substrate shown in FIG. 43.

Figure 42:
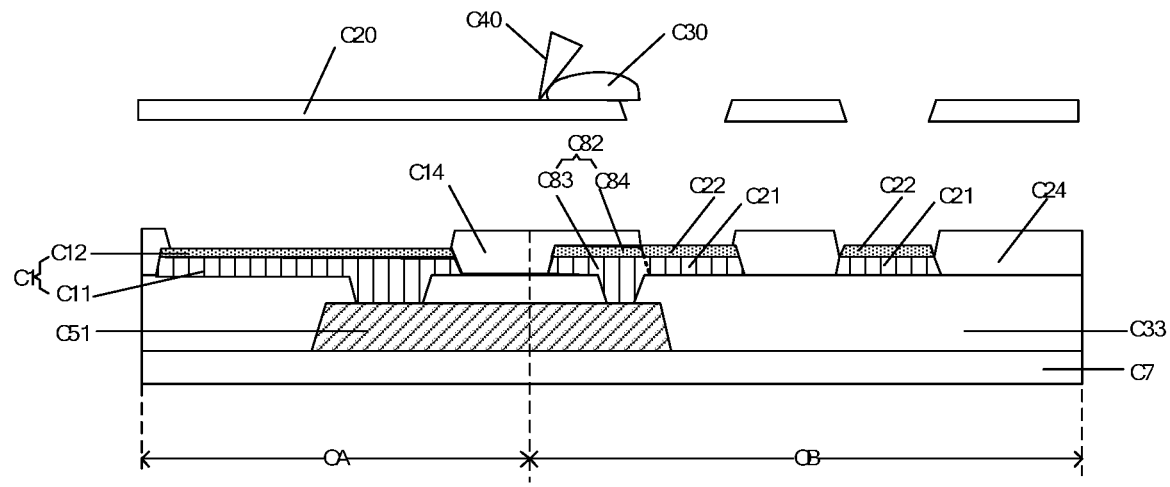

The material of the second conductive sub-layer includes indium zinc oxide or indium tin oxide. Considering that indium zinc oxide has better conductivity and lower resistivity, indium zinc oxide is often adopted. Indium zinc oxide may be etched by any kind of acid. As shown in FIG. 42, the part of the second conductive sub-layer used for bonding the light-emitting unit is etched by screen etching, which is conducive to the subsequent bonding of the light-emitting unit to the second metal sub-layer by the solder paste through the reflow soldering and die bond. In FIG. 42, tool C40 is used to push indium zinc oxide etching paste C30 from a mask C20 to region to be etched.

S13: bonding the light-emitting unit and the second metal sub-layer.

Specifically, processes of solder paste brushing, light-emitting diode placing, reflow soldering, silica gel encapsulation, and the like, are carried out sequentially to bond of the light-emitting unit and the second metal sub-layer, so as to form the array substrate as shown in FIG. 44. Since the first conductive sub-layer protects the first metal sub-layer to avoid the first metal sub-layer in S13 from oxidation, so as to ensure the bonding quality of subsequent circuit board and improve the product yield.

S14: bonding the circuit board and the first conductive sub-layer.

Specifically, the circuit board and the first conductive sub-layer may be bonded together through the first connection portion.

The method for manufacturing the array substrate is simple, easy to implement and highly operable.

Optionally, before S12: removing a part of the second conductive sub-layer used for bonding the light-emitting unit, and after S11: sequentially forming and patterning the metal film and the conductive film, the method further includes:

S15: forming and patterning an organic film to obtain a first part of the second planarization layer and a second part C24 of the second planarization layer as shown in FIG. 43. The second part of the second planarization layer is defined with a second via hole in a region corresponding to the second metal sub-layer to expose the device pad.

Materials of the first part of the second planarization layer and the second part of the second planarization layer may be an organic material, such as resin. In S15, one mask is required to form the desired pattern.

S13 bonding the light-emitting unit and the second metal sub-layer include:

S131: forming a second connection portion in the second via hole, and the second connection portion being electrically connected to the second metal sub-layer.

Here, material of the second connection portion may be solder paste, copper paste, and the like, and in fact, solder paste is mostly used.

S132: bonding the light-emitting unit above the second connection portion.

Specifically, the reflow soldering and die bond may be used for bonding, a peak temperature of the reflow soldering is about 240° C. and a holding time is 90 s.

Of course, after S132, in order to better protect the light-emitting unit, the light-emitting unit is encapsulated with encapsulation material such as silica gel and the like, to form an encapsulation layer C9 as shown in FIG. 44. Generally, a curing temperature of silica gel is 150° C. and kept for 4 H.

Figure 45:
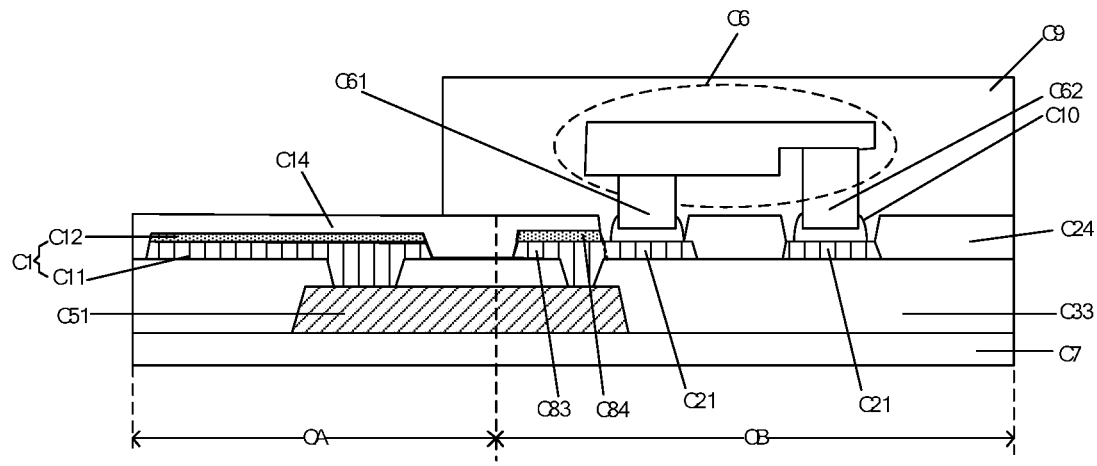
FIGS. 45-46 are schematic views of the manufacturing process of another array substrate provided in Embodiment 3.

Optionally, after S13: bonding the light-emitting unit and the second metal sub-layer, and before S14: bonding the circuit board and the first conductive sub-layer, the method further includes:

In combination with FIG. 45 and FIG. 46, S16: partially etching a region of the first conductive sub-layer C12 corresponding to a first part C14 of the second planarization layer to form a first via hole, so as to expose the pin pad. It should be noted that the light-emitting region has been encapsulated before performing S16. Since the encapsulation layer is relatively thick, the first via hole is formed by etching in S16, which has little impact on the light-emitting region. Thus, no additional mask is required.

S14: bonding the circuit board and the first conductive sub-layer include:

S141: forming a first connection portion in the first via hole, and the first connection portion being electrically connected to the first conductive sub-layer;

S142: bonding the circuit board above the first connection portion.

Here, the material of the first connection portion may be a heat curing adhesive, and the circuit board may be bonded by hot pressing, and the temperature is generally 130° C.~150° C.

It should be noted that the second via hole and the first via hole are respectively formed through S15 and S16, such that when S13 bonding the light-emitting unit and the second metal sub-layer is performed, the first part of the second planarization layer is arranged above the pin pad, and the first part of the second planarization layer may protect the pin pad from oxidation. Thus, when this method is adopted, the pin pad may also only include the first metal sub-layer without setting the first conductive sub-layer. Accordingly, the device pad may also only include the second metal sub-layer without setting the second conductive sub-layer.

In addition, since the pin pad includes the first metal sub-layer and the first conductive sub-layer, and the first conductive sub-layer plays a good role in protecting the first metal sub-layer, S16 may also be incorporated into S15. That is, in S15, the first via hole and the second via hole are both formed to expose the pin pad and the device pad. Structure of the formed array substrate may be shown in FIG. 43. In this way, when S13 bonding the light-emitting unit and the second metal sub-layer is performed, even if the pin pad is exposed, since the first conductive sub-layer has good oxidation resistance, the first conductive sub-layer and the first metal sub-layer may be avoided from oxidation.

In the manufacturing method, one mask is used in each of S11 and S15 respectively. In addition, in order to form the array substrate as shown in FIG. 46, before S11, the manufacturing method further includes: forming a metal lead including an anode trace C51 and a cathode trace (not shown in FIG. 46). Thus, there are a total of four masks (4mask) required to form the array substrate shown in FIG. 46.

Figure 51:
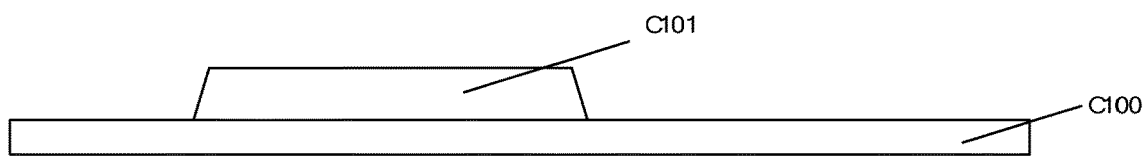
FIGS. 51-57 are schematic views of the manufacturing process of still yet another array substrate provided in Embodiment 3
Figure 52:
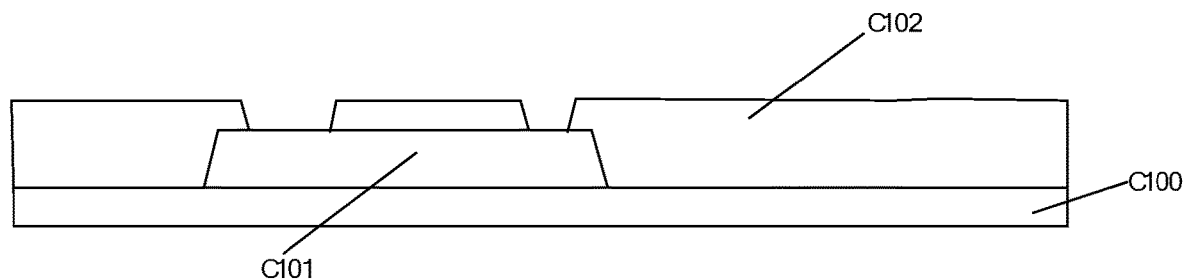
Figure 53:
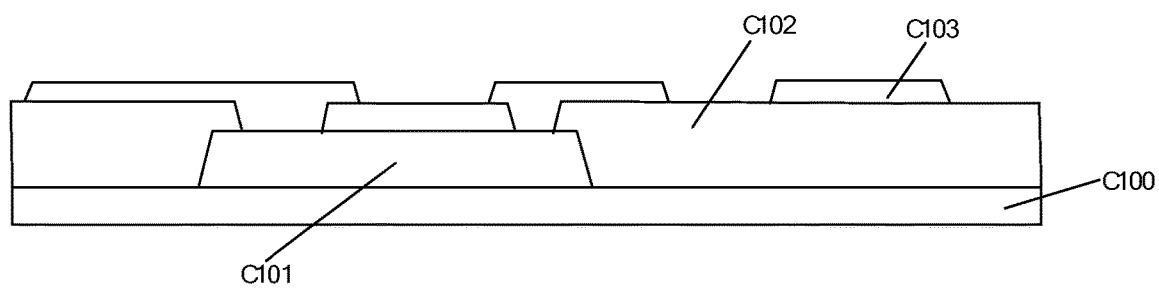
Figure 54:
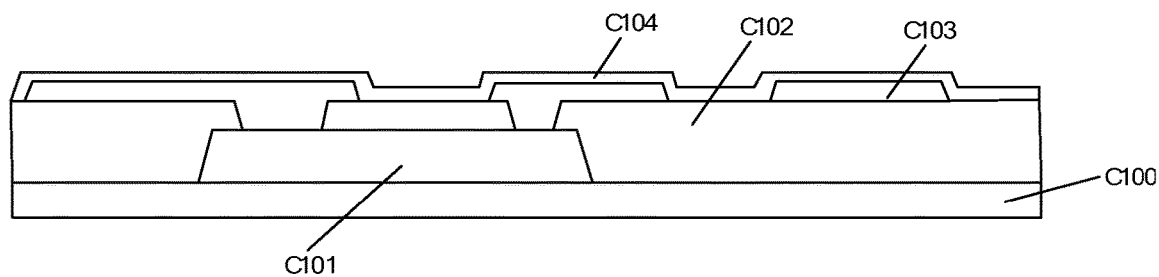
Figure 55:
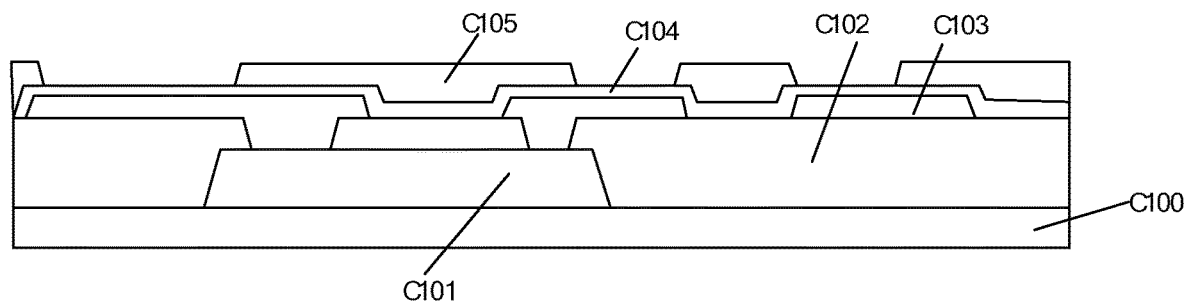
Figure 56:
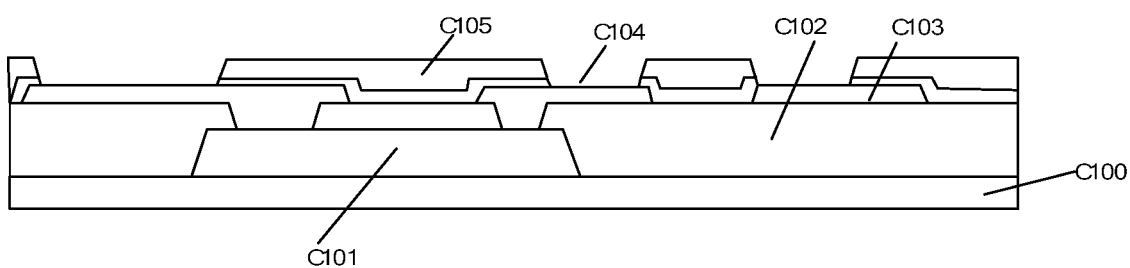

In the related art, the array substrate is formed as shown in FIG. 57. Generally, the manufacturing method of using 4 masks includes: S100: as shown in FIG. 51, forming a metal wiring layer C101 on a glass substrate C100; S101: forming a first planarization layer C102 as shown in FIG. 52; S102: forming an electrode layer C103 as shown in FIG. 52; S103: forming an inorganic protective layer C104 (also referred to as a silicon oxynitride insulating layer) as shown in FIG. 53; S104: forming a second planarization layer C105 as shown in FIG. 54, and defining a hole in a light-emitting diode bonding pad (LED bonding pad) and a flexible printed circuit bonding pad (FPC bonding pad) as shown in FIG. 55; S105: dry etching a hole region to expose a thin copper layer, so as to form the Mini-LED array substrate (unbonded functional device) as shown in FIG. 56. Then, performing subsequent processes. The subsequent processes include: brushing solder paste, transferring light-emitting diodes, reflow soldering and die bond, screen printing silica gel and curing the silica gel. The completed array substrate is shown in FIG. 57. A peak temperature of reflow soldering is about 240° C. and a holding time is 90 s. A curing temperature of silica gel is 150° C. and kept for 4 H. These temperature processes may cause a copper surface in the bonding region of the flexible circuit board to turn dark red and oxidize, resulting in poor bonding of subsequent flexible circuit board and reducing the product yield. In FIG. 57, the anode C108 and the cathode C109 of the micro light-emitting diode C107 are electrically connected to the electrode layer C103 through the solder paste C110, respectively. The array substrate further includes a silica gel encapsulation layer C106.

Compared with the related art, the method for manufacturing the array substrate provided in the present embodiment does not increase number of masks, and may avoid the first metal sub-layer made of copper from the oxidation during the manufacturing of the array substrate, so as to ensure the bonding quality of the circuit board and improve the product yield. In addition, in the array substrate provided by the present embodiment, since the second conductive sub-layer is provided above the first metal sub-layer, which plays a good role in protecting the second metal sub-layer, a silicon oxynitride protective layer in the original manufacturing processes is removed in the method for manufacturing the array substrate, so as to omit the PECVD (Plasma Enhanced Chemical Vapor Deposition) process and silicon oxynitride etching process in the original processes, simplify the original processes and reduce manufacturing cost.

The embodiment further provides a method for manufacturing a display device. Structure of the array substrate included in the display device may be shown in FIG. 39. The method includes:

S21: sequentially forming and patterning a metal film and a conductive film to obtain the first metal sub-layer, the second metal sub-layer, the first conductive sub-layer located above the first metal sub-layer and the second conductive sub-layer located above the second metal sub-layer.

Here, the metal sub-layer film and the conductive sub-layer film may be deposited in one step by sputtering, and an etching solution may be used to etch and pattern in one step to form the first metal sub-layer, the first conductive sub-layer, the second metal sub-layer and the second conductive sub-layer. In S21, one mask is required to form a desired pattern.

It should be noted that each of a first trace layer and a second trace layer formed by S21 includes two-layer structures respectively. If materials of the first metal sub-layer and the second metal sub-layer include copper, in order to increase the adhesive force of copper and reduce the manufacturing difficulty, the pin pad may further include the first buffer sub-layer, and the first metal sub-layer is located above the first buffer sub-layer. The device pad may further include a second buffer sub-layer, and the second metal sub-layer is located above the second buffer sub-layer. If the pin pad and the device pad further include the first buffer sub-layer and the second buffer sub-layer respectively, a buffer sub-layer film, the metal sub-layer film and the conductive sub-layer film may be deposited in one step by the sputtering, and the etching solution may be used to etch and pattern in one step to form the first buffer sub-layer, the second buffer sub-layer, the first metal sub-layer, the second metal sub-layer, the first conductive sub-layer and the second conductive sub-layer.

If the materials of the first metal sub-layer and the second metal sub-layer include an alloy containing molybdenum, the pin pad includes a two-layer structure of the first metal sub-layer (the alloy layer containing molybdenum) and the first conductive sub-layer (the alloy layer containing copper and nickel), and the device pad includes a two-layer structure of the second metal sub-layer (the alloy layer containing molybdenum) and the second conductive sub-layer (the alloy layer containing copper and nickel).

S22: bonding the light-emitting unit and the second conductive sub-layer.

Specifically, processes of solder paste brushing, light-emitting diode placing, reflow soldering, silica gel encapsulation, and the like, are carried out sequentially to bond the light-emitting unit and the second metal sub-layer. In the process of S22, if the material of the first metal sub-layer includes copper, the first conductive sub-layer protects the first metal sub-layer, so as to avoid the first metal sub-layer from oxidation, and if the material of the first metal sub-layer includes an alloy containing molybdenum, and the material of the first conductive sub-layer includes an alloy containing copper and nickel, the first conductive sub-layer has oxidation resistance and is not oxidized. In conclusion, in both cases, oxidation of a metal lead layer in the circuit board bonding region may be avoided when the light-emitting unit and the second conductive sub-layer are bonded in the light-emitting region, so as to ensure the bonding quality of subsequent circuit board and improve the product yield.

S23: bonding the circuit board and the first conductive sub-layer.

Specifically, the circuit board and the first conductive sub-layer may be bonded together through the first connection portion.

The method for manufacturing the array substrate is simple, easy to implement and highly operable.

Optionally, before S22: bonding the light-emitting unit and the second conductive sub-layer, and after S21: sequentially forming and patterning the metal film and the conductive film, the method further includes:

S24: sequentially forming and patterning a first film and a second film to obtain a first part of an inorganic protective layer, a second part of the inorganic protective layer, a first part of a second planarization layer, a second part of the second planarization layer and a second via hole. The second via hole passes through the second part of the second planarization layer and the first part of the inorganic protective layer to expose the device pad.

Material of the first film may be silicon oxynitride, silicon nitride, and the like, which is used to form the first part of the inorganic protective layer and the second part of the inorganic protective layer. Material of the second film may be a resin, which is used to form the first part of the second planarization layer and the second part of the second planarization layer. In this S24, one mask is required to form a desired pattern.

S22: bonding the light-emitting unit and the second metal sub-layer includes:

S221: forming a second connection portion in the second via hole, and the second connection portion being electrically connected to the second conductive sub-layer. Here, material of the second connection portion may be solder paste, copper paste, and the like, and in fact, solder paste is mostly used.

S222: bonding the light-emitting unit above the second connection portion.

Specifically, the reflow soldering and die bond may be used for bonding, a peak temperature of the reflow soldering is 230~260° C. and a holding time is 90 s.

Of course, after S222, in order to better protect the light-emitting unit, the light-emitting unit is encapsulated with encapsulation material such as silica gel and the like. Generally, a curing temperature of silica gel is 150° C. and kept for 4 H.

Optionally, after S22: bonding the light-emitting unit and the second conductive sub-layer, and before S23: bonding the circuit board and the first conductive sub-layer, the method further includes:

S25: partially etching a region of the first conductive sub-layer corresponding to the first part of the inorganic protective layer and the first part of the second planarization layer to form a first via hole, so as to expose the pin pad. It should be noted that the light-emitting region has been encapsulated before performing S25. Since the encapsulation layer is relatively thick, the first via hole is formed by etching in S25, which has little impact on the light-emitting region. Thus, no additional mask is required.

S23: bonding the circuit board and the first conductive sub-layer include:

S231: forming a first connection portion in the first via hole, and the first connection portion being electrically connected to the first conductive sub-layer;

S232: bonding the circuit board above the first connection portion.

Here, the material of the first connection portion may be a heat curing adhesive, and the circuit board may be bonded by hot pressing, and the temperature is generally 130° C.~150° C.

It should be noted that the second via hole and the first via hole are respectively formed through S24 and S25, such that when S22 bonding the light-emitting unit and the second conductive sub-layer is performed, the first part of the inorganic protective layer and the first part of the second planarization layer is arranged above the pin pad, and the first part of the inorganic protective layer and the first part of the second planarization layer may protect the pin pad from oxidation. Thus, when this method is adopted, the pin pad may also only include a sub-layer containing copper or an alloy sub-layer containing copper without setting two layers of conductive structures. Accordingly, the device pad may also only include a sub-layer containing copper or an alloy sub-layer containing copper.

In addition, since the pin pad includes the first metal sub-layer and the first conductive sub-layer, and the first conductive sub-layer plays a good role in protecting the first metal sub-layer, S25 may also be incorporated into S24. That is, in S24, the first via hole and the second via hole are both formed to expose the pin pad and the device pad. In this way, when S22 bonding the light-emitting unit and the second conductive sub-layer is performed, even if a part of the pin pad is exposed due to the first via hole, since the first conductive sub-layer has good oxidation resistance, the first conductive sub-layer and the first metal sub-layer may be avoided from oxidation.

In the manufacturing method, one mask is used in each of S21 and S24 respectively. In addition, in order to form the array substrate as shown in FIG. 39, before S21, the manufacturing method further includes: forming a metal lead, a passivation layer C34 and a first planarization layer C33 respectively. The metal lead includes an anode trace C51 and a cathode trace (not shown in FIG. 39). One mask is required to form the metal lead, and one mask is required to form the passivation layer and the first planarization layer. Thus, there are a total of four masks (4 mask) required to form the array substrate shown in FIG. 39.

Compared with the related art, the method for manufacturing the array substrate provided in the present embodiment does not increase number of masks, and may avoid the first metal sub-layer made of copper from the oxidation during the manufacturing of the array substrate, so as to ensure the bonding quality of the circuit board and improve the product yield.

The present embodiment further provides a method for manufacturing a display device. Structure of the array substrate included in the display device may be shown in FIG. 50. The method includes:

S31: forming a peeling layer at a base substrate, and material of the peeling layer being located within a circuit board bonding region and a light-emitting region.

The material of the peeling layer may be a mechanically peelable material. Material of the base substrate may be a rigid material, such as glass, or a flexible material, such as polyimide (PI).

Figure 47:
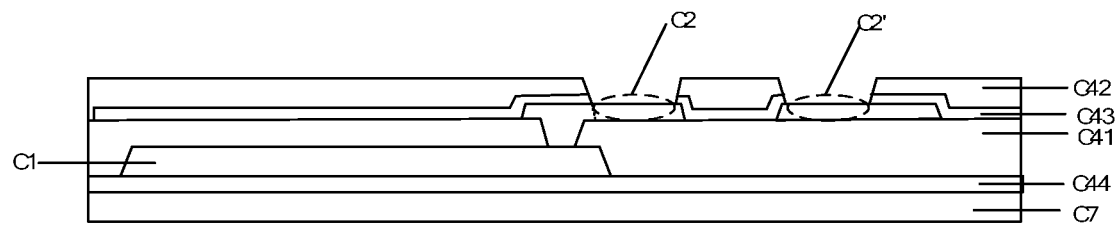
FIGS. 47-50 are schematic views of the manufacturing process of yet another array substrate provided in Embodiment 3

S32: forming a pin pad C1 and a device pad (a cathode pad C2' and an anode pad C2) on the peeling layer; the pin pad including a first metal sub-layer and a first conductive sub-layer that are stacked. The formed array substrate is shown in FIG. 47.

Figure 48:
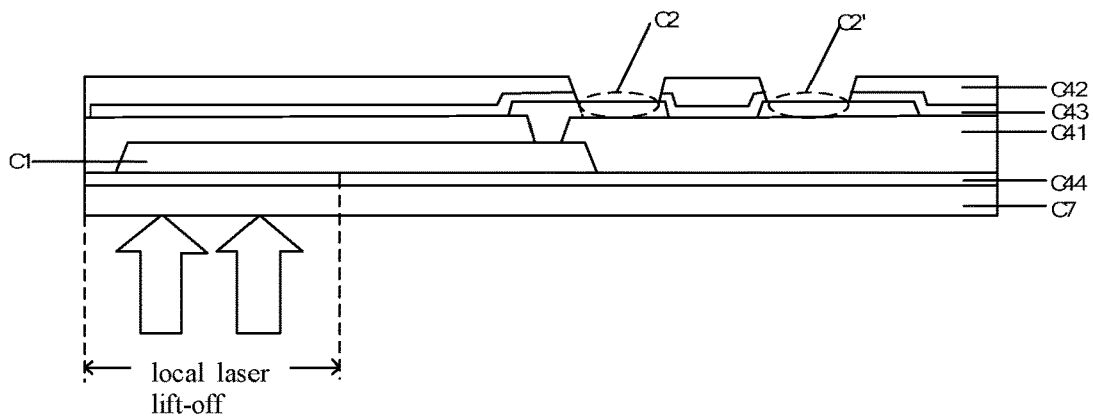

Before the bonding process, as shown in FIG. 48, a process of local laser lift-off (LLO) and a cutting the array substrate are finished the circuit bonding board to obtain a single array substrate to be bonded, and then the subsequent bonding process is carried out for the single array substrate to be bonded.

S33: bonding the light-emitting unit and the device pad.

Specifically, processes of solder paste brushing, light-emitting diode placing, reflow soldering, silica gel encapsulation, and the like, are carried out sequentially to bond the light-emitting unit and the device pad.

S34: removing at least a region (marked as 50) in the base and the peeling layer corresponding to a part of the first metal sub-layer that is used to bond the circuit board, and exposing the first metal sub-layer.

Specifically, the local cutting may be used to remove the region in the base and the peeling layer corresponding to a part of the first metal sub-layer that is used to bond the circuit board.

S35: bonding the circuit board and the first metal sub-layer.

Specifically, the circuit board and the first metal sub-layer may be bonded together through the first connection portion.

In this method, the formed pin pad includes the first metal sub-layer and the first conductive sub-layer. When the light-emitting unit and the second metal sub-layer are bonded, the pin pad in the circuit board bonding region is not oxidized, so as to ensure the bonding quality of the subsequent circuit board and the first conductive sub-layer, and further improve the product yield. In addition, in this method, the circuit board is bonded to a side of the first metal sub-layer close to the peeling layer, thereby reducing the non-light-emitting region at a light-emitting side, and thus achieving a narrower frame.

Further optional, as shown in FIG. 50, the array substrate further includes a first planarization layer C41, an inorganic protective layer C43, a second planarization layer C42, a via hole (not marked in FIG. 50) and a second connection portion C10, and the first organic layer covers the pin pad. The device pad is located above the first planarization layer, the protective layer covers the device pad and the first planarization layer, and the second planarization layer is located above the inorganic protective layer. The via hole passes through the second planarization layer and the inorganic protective layer to expose the device pad, and the light-emitting unit is electrically connected to the device pad through the second connection portion.

Thus, step of forming a pin pad above the peeling layer requires one mask. In addition, each mask is required to form a device pad, a first planarization layer, an inorganic protective layer, a second planarization layer and a via hole, respectively. The array substrate shown in FIG. 50 requires a total of four masks. Compared with the related art, the number of masks is not increased. Moreover, the oxidation of the pin pad during the manufacturing of the array substrate may be avoided, so as to ensure the bonding quality of the circuit board and improve the product yield. In addition, in this method, the circuit board is bonded to a side of the first metal sub-layer close to the peeling layer, thereby reducing the non-light-emitting region at the light-emitting side, and thus achieving a narrower frame.

Those skilled in the art will readily contemplate other embodiments of the present disclosure after considering the specification and practicing the disclosure. The present disclosure is intended to cover any variations, uses, or adaptive changes of the present disclosure. These variations, uses, or adaptive changes follow the general principles of the present disclosure and include the common general knowledge or conventional technical means in this art which is not described herein. The specification and examples should be considered as exemplary only, and the true scope and spirit of the disclosure should be defined by the appended claims.

What is claimed is:

1. An array substrate, comprising:
   a base substrate;
   a metal wiring layer provided at a side of the base substrate;
   a first planarization layer provided at a side of the metal wiring layer away from the base substrate;
   an electrode layer provided at a side of the first planarization layer away from the base substrate; the electrode layer comprising a metal sub-layer and a conductive sub-layer sequentially stacked at the side of the base substrate; material of the metal sub-layer comprising metal or metal alloy; the conductive sub-layer having oxidation resistance and covering the metal sub-layer;
   a second planarization layer provided at a side of the electrode layer away from the base substrate;
   a functional device layer provided at a side of the second planarization layer away from the base substrate, and comprising a plurality of functional devices electrically connected to the electrode layer;
   wherein the array substrate further comprises an inorganic protective layer sandwiched between the electrode layer and the second planarization layer.

2. The array substrate according to claim 1, wherein the material of the metal sub-layer comprises copper, and material of the conductive sub-layer comprises copper-nickel alloy.

3. The array substrate according to claim 1, wherein the material of the metal sub-layer is copper, and material of the conductive sub-layer is copper-nickel alloy.

4. The array substrate according to claim 3, wherein the electrode layer further comprises a first buffer metal layer sandwiched between the metal sub-layer and the conductive sub-layer; material of the first buffer metal layer is any one of or a mixture of more than one of molybdenum, molybdenum-niobium alloy, molybdenum-tungsten alloy, molybdenum-nickel-titanium alloy and molybdenum-magnesium-aluminum alloy.

5. The array substrate according to claim 4, wherein the first buffer metal layer and the conductive sub-layer cover a side face of the metal sub-layer and a surface of the metal sub-layer away from the base substrate.

6. The array substrate according to claim 4, wherein an orthographic projection of the conductive sub-layer on the metal sub-layer is located within the metal sub-layer.

7. The array substrate according to claim 4, wherein the first buffer metal layer has a thickness of 100~500 angstroms.

8. The array substrate according to claim 4, wherein the conductive sub-layer has a thickness of 200~1000 angstroms.

9. The array substrate according to claim 3, wherein the electrode layer further comprises a palladium metal layer sandwiched between the metal sub-layer and the conductive sub-layer, the palladium metal layer is located on and covers a surface of the metal sub-layer away from the base substrate as well as a side face of the metal sub-layer; the conductive sub-layer is located on and covers a surface of the palladium metal layer away from the base substrate.

10. The array substrate according to claim 9, wherein a mass fraction of nickel in the conductive sub-layer is not less than 30%.

11. The array substrate according to claim 9, wherein a mass fraction of nickel in the conductive sub-layer is not more than 80%.

12. The array substrate according to claim 9, wherein the conductive sub-layer has a thickness of 500~2000 angstroms.

13. The array substrate according to claim 1, wherein material of the conductive sub-layer comprises metal oxide.

14. The array substrate according to claim 13, wherein the material of the conductive sub-layer comprises indium zinc oxide or indium tin oxide.

15. The array substrate according to claim 1, wherein the array substrate comprises a circuit board bonding region and a light-emitting region, wherein the circuit board bonding region comprises a plurality of pin pads configured to be bonded and connected to a circuit board;

the light-emitting region comprises a plurality of device pads configured to be bonded and connected to the functional devices;

the pin pads and the device pads are provided on the electrode layer.

16. The array substrate according to claim 15, wherein the circuit board bonding region further comprises a first connection portion, located at a side of the conductive sub-layer away from the base substrate and configured to bond and connect a conductive sub-layer of the pin pad with the circuit board.

17. The array substrate according to claim 16, wherein material of the conductive sub-layer comprises metal oxide; the device pads are provided on the metal sub-layer and exposed by the conductive sub-layer;

the light-emitting region further comprises a second connection portion, the second connection portion is located at a side of a metal sub-layer of the device pad away from the base substrate and configured to bond and connect the metal sub-layer of the device pad with the functional device.

18. The array substrate according to claim 16, wherein material of the conductive sub-layer comprises copper-nickel alloy;

the light-emitting region further comprises a second connection portion, the second connection portion is located at a side of a conductive sub-layer of the device pad away from the base substrate and configured to bond and connect the conductive sub-layer of the device pad with the functional device.

19. The array substrate according to claim 1, wherein the array substrate comprises a plurality of pin pads;

the base substrate exposes a surface of the pin pad close to the base substrate; and the surface of the pin pad exposed by the base substrate is configured to be bonded and connected to a circuit board.

20. The array substrate according to claim 19, wherein the pin pad is provided at the metal wiring layer.

21. The array substrate according to claim 1, wherein the electrode layer is provided with a plurality of device pads; the plurality of device pads are grouped into a plurality of groups of device pads, and each group of device pads comprises a cathode pad and an anode pad arranged in pair;

the metal wiring layer is provided with a metal lead, and the electrode layer is further provided with a connection trace;

the metal lead is electrically connected to at least one of a plurality of pin pads for transmitting an electrical signal provided by a circuit board;

the connection trace is configured to achieve series connection or parallel connection of the plurality of groups of the device pads, and is further configured to be electrically connected to the metal lead by passing through a via hole of the first planarization layer.

22. The array substrate according to claim 1, wherein the electrode layer further comprises a second buffer metal layer located on a surface of the metal sub-layer close to the base substrate.

23. The array substrate according to claim 1, wherein the metal wiring layer comprises a seed metal layer, a copper growth layer and a second copper-nickel alloy layer sequentially stacked at the side of the base substrate.

24. The array substrate according to claim 1, wherein the metal wiring layer comprises a seed metal layer and a copper growth layer sequentially stacked at the side of the base substrate;

the array substrate further comprises a passivation layer provided between the metal wiring layer and the first planarization layer.

25. A display panel comprising the array substrate according to claim 1, wherein the functional device of the array substrate is a micro light-emitting diode or a mini light-emitting diode.

26. A backlight module comprising the array substrate according to claim 1, wherein the functional device of the array substrate is a micro light-emitting diode or a mini light-emitting diode.

* * * * *